US011471974B2

(12) United States Patent
Nakada et al.

(10) Patent No.: US 11,471,974 B2
(45) Date of Patent: Oct. 18, 2022

(54) LASER LIFT-OFF APPARATUS, LASER LIFT-OFF METHOD, AND METHOD FOR MANUFACTURING ORGANIC EL DISPLAY

(71) Applicant: JSW AKTINA SYSTEM CO., LTD., Yokohama (JP)

(72) Inventors: Yuichi Nakada, Yokohama (JP); Takahiro Fuji, Yokohama (JP); Tomoya Oda, Yokohama (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 940 days.

(21) Appl. No.: 16/320,094

(22) PCT Filed: Jun. 7, 2017

(86) PCT No.: PCT/JP2017/021215
§ 371 (c)(1),
(2) Date: Jan. 23, 2019

(87) PCT Pub. No.: WO2018/025495
PCT Pub. Date: Feb. 8, 2018

(65) Prior Publication Data
US 2019/0262940 A1    Aug. 29, 2019

(30) Foreign Application Priority Data

Aug. 4, 2016 (JP) .............................. JP2016-153341
Dec. 20, 2016 (JP) .............................. JP2016-246571

(51) Int. Cl.
*B23K 26/14* (2014.01)
*B23K 26/142* (2014.01)
(Continued)

(52) U.S. Cl.
CPC .......... *B23K 26/142* (2015.10); *B23K 26/082* (2015.10); *H01L 51/5012* (2013.01); *H05B 33/02* (2013.01); *H05B 33/10* (2013.01)

(58) Field of Classification Search
CPC ........................... B23K 26/142; B23K 26/147
See application file for complete search history.

(56) References Cited

U.S. PATENT DOCUMENTS 4,368,080 A * 1/1983 Langen ................. B08B 7/0042
134/1
5,359,176 A * 10/1994 Balliet, Jr. ........... B23K 26/1476
219/121.67
(Continued)

FOREIGN PATENT DOCUMENTS

CN     101172321 A     5/2008
CN     101996865 A     3/2011
(Continued)

OTHER PUBLICATIONS

Office Action dated Oct. 6, 2020, in Japanese Patent Application No. 2016-246571.
(Continued)

*Primary Examiner* — Dana Ross
*Assistant Examiner* — Lawrence H Samuels
(74) *Attorney, Agent, or Firm* — SGPatents PLLC

(57) ABSTRACT

According to one embodiment, a laser lift-off apparatus (1) which irradiates with laser light (16) from a side of a substrate (11) an interface between the substrate (11) and a separating layer (12) of a workpiece (10) including the substrate (11) and the separating layer (12) formed over the substrate (11), and separates the separating layer (12) from the substrate (11) includes: an injection unit (22) which blows a gas (35) onto the workpiece (10) and blows away dusts existing on a surface of the workpiece (10), and a dust collecting unit (23) which includes an opening (52) at a
(Continued)

position meeting an irradiation position of the laser light (16), and sucks and collects the blown dusts through the opening (52).

14 Claims, 35 Drawing Sheets

(51) Int. Cl.
*B23K 26/082* (2014.01)
*H01L 51/50* (2006.01)
*H05B 33/02* (2006.01)
*H05B 33/10* (2006.01)

(56) References Cited

U.S. PATENT DOCUMENTS

| | | | | |
|---|---|---|---|---|
| 5,643,472 | A * | 7/1997 | Engelsberg | B23K 26/1436 216/65 |
| 5,662,762 | A * | 9/1997 | Ranalli | B08B 7/0042 156/707 |
| 5,981,901 | A * | 11/1999 | La Rocca | B23K 26/123 219/121.63 |
| 6,056,827 | A * | 5/2000 | Fukui | B08B 7/0042 134/1 |
| 6,144,010 | A * | 11/2000 | Tsunemi | B08B 7/0042 219/121.68 |
| 6,384,370 | B1 * | 5/2002 | Tsunemi | B08B 7/0042 219/121.69 |
| 6,531,682 | B1 * | 3/2003 | Guttler | B23K 26/147 219/121.84 |
| 7,605,345 | B2 * | 10/2009 | Fukuda | B23K 26/1494 219/121.84 |
| 7,714,251 | B2 * | 5/2010 | Miyairi | B23K 26/073 219/121.83 |
| 8,575,515 | B2 * | 11/2013 | Kawaguchi | H01L 21/268 219/121.84 |
| 9,403,238 | B2 * | 8/2016 | Culp | A61C 13/0006 |
| 10,265,772 | B2 * | 4/2019 | Mironets | B22F 10/20 |
| 10,562,131 | B2 * | 2/2020 | Izumi | B23K 26/14 |
| 10,702,949 | B2 * | 7/2020 | Zhu | B23K 26/14 |
| 2004/0226927 | A1 * | 11/2004 | Morikazu | B23K 26/142 219/121.84 |
| 2005/0206894 | A1 * | 9/2005 | Fukuda | B23K 26/702 356/318 |
| 2005/0224470 | A1 * | 10/2005 | Burt | B23K 26/1437 219/121.63 |
| 2007/0117288 | A1 * | 5/2007 | Miyairi | B23K 26/032 438/151 |
| 2008/0041832 | A1 * | 2/2008 | Sykes | B23K 26/146 219/121.84 |
| 2008/0210675 | A1 * | 9/2008 | Sasaki | B23K 26/16 219/121.84 |
| 2011/0041874 | A1 | 2/2011 | Shindou et al. | |
| 2013/0073071 | A1 * | 3/2013 | Culp | A61C 13/0006 700/108 |
| 2014/0094079 | A1 | 4/2014 | Ito et al. | |
| 2014/0251962 | A1 * | 9/2014 | Alfille | B23K 26/1437 219/121.72 |
| 2016/0001364 | A1 * | 1/2016 | Mironets | B23K 26/342 219/76.12 |
| 2018/0200832 | A1 * | 7/2018 | Izumi | B23K 26/1436 |
| 2018/0345416 | A1 * | 12/2018 | Zhu | B23K 26/142 |

FOREIGN PATENT DOCUMENTS

| | | |
|---|---|---|
| CN | 104972231 A | 10/2015 |
| JP | H11-6086 A | 1/1999 |
| JP | 2001-353589 A | 12/2001 |
| JP | 2003-077658 A | 3/2003 |
| JP | 2010-184245 A | 8/2010 |
| JP | 2011-049398 A | 3/2011 |
| JP | 2012-191112 A | 10/2012 |
| JP | 5220133 B2 | 6/2013 |
| JP | 2014-071231 A | 4/2014 |
| JP | 3204585 U | 6/2016 |

OTHER PUBLICATIONS

Office Action dated Jun. 24, 2020 in Chinese Patent Application No. 201780048832.2.
International Search Report from International Patent Application No. PCT/JP2017/021215, dated Aug. 29, 2017.

* cited by examiner

CONVEYING DIRECTION

| | FRONT SURFACE WALL | | REAR SURFACE WALL | | ARRIVAL OF AIR TOWARD FRONT SURFACE WALL | ARRIVAL TIME TO STAGE |
|---|---|---|---|---|---|---|
| | FEEDING FAN | FILTER | EXHAUST PORT | FILTER | | |
| A | YES | — | YES | — | × | 10sec |
| B | YES | — | YES | YES | ○ | 50sec |
| C | YES | YES | YES | YES | ○ | 36sec |

|  |  | LOADING AND UNLOADING OF WORKPIECE | LASER LIGHT IRRADIATION | OTHERS |
|---|---|---|---|---|
| DUST COLLECTING UNIT FEEDING/ EXHAUST FAN | FEED | OFF | ON | ON (LOW) |
|  | EXHAUST | OFF | ON | ON (LOW) |
| CHAMBER FEEDING FAN EXHAUST DUCT | FEED | OFF | ON | ON (LOW) |
|  | EXHAUST | ON (LOW) | ON | ON (LOW) |

LASER LIFT-OFF APPARATUS, LASER LIFT-OFF METHOD, AND METHOD FOR MANUFACTURING ORGANIC EL DISPLAY

TECHNICAL FIELD

The present invention relates to a laser lift-off apparatus, a laser lift-off method and an organic EL display manufacturing method. More particularly, the present invention relates to, for example, a laser lift-off apparatus, a laser lift-off method and an organic EL display manufacturing method for separating a layer to be separated from a substrate by using laser light.

BACKGROUND ART

There is a known laser lift-off apparatus which irradiates a separating layer formed over a substrate with laser light from a side of the substrate, and then separates the separating layer from the substrate. Patent Literature 1 discloses a laser machining apparatus which is used for a laser separating process of separating a thin film from a substrate.

CITATION LIST

Patent Literature

Patent Literature 1: Japanese Patent No. 5220133

SUMMARY OF INVENTION

Technical Problem

As is described in the related art, the laser lift-off apparatus irradiates a separating layer formed over a substrate with laser light from a side of the substrate, and then separates the separating layer from the substrate. In a case where there is dust (particles) is deposited on the substrate, the laser light does not reach a part of the separating layer where the dust is deposited, and therefore the substrate is not separated from the separating layer at this part. Hence, there is a problem that the substrate and the separating layer cannot be uniformly separated.

Solution to Problem

A laser lift-off apparatus according to one embodiment includes: an injection unit configured to blow a gas onto a workpiece; and a dust collecting unit configured to suck and collect dust through an opening.

A laser lift-off apparatus according to one embodiment includes a dust collecting unit including an optical path space through which laser light passes, and an exhaust space disposed outside the optical path space. The optical path space includes a sidewall disposed around the opening, and a feeding hole configured to supply a gas to the optical path space is formed in the sidewall. The gas supplied from the feeding hole to the optical path space flows toward the workpiece along the sidewall, then passes between a lower end of the sidewall and the workpiece, and flows to the exhaust space.

A laser lift-off method according to one embodiment includes, blowing a gas, when a workpiece is conveyed while being irradiated with laser beam, onto the workpiece; and sucking the blown gas and thereby collecting dust.

An organic EL display manufacturing method according to one embodiment includes a step of separating a substrate from a separating layer, and the separating step includes, blowing a gas when a workpiece is conveyed while being irradiated with the laser light, onto the workpiece, and sucking the blown gas and thereby collecting dust.

Advantageous Effects of Invention

According to the one embodiment, it is possible to provide a laser lift-off apparatus, a laser lift-off method and an organic EL display manufacturing method capable of uniformly separating a separating layer from a substrate.

BRIEF DESCRIPTION OF DRAWINGS

FIG. 32 is a view illustrating control of the controller of the laser lift-off apparatus according to the fifth embodiment.

DESCRIPTION OF EMBODIMENTS

<Organic EL Display>

Figure 1A:
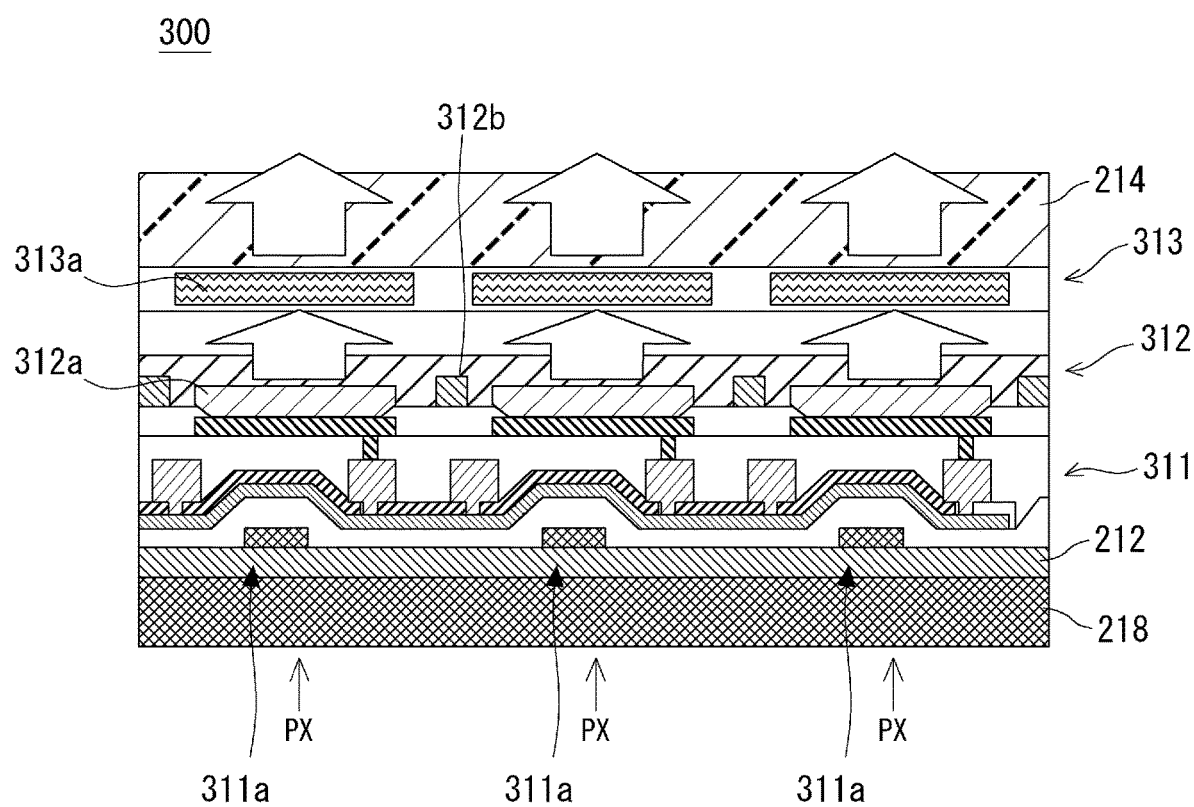
FIG. 1A is a cross-sectional view illustrating an example of an organic EL display.

First, a structure of an organic EL (Electroluminescenece) display will be described with reference to FIG. 1A. FIG. 1A is a cross-sectional view illustrating an example of an organic EL display. An organic EL display 300 illustrated in FIG. 1A is an active-matrix display apparatus which includes a TFT disposed in each pixel PX.

The organic EL display 300 includes a substrate 218, a layer to be separated (hereinafter also referred to as a separating layer) 212, a TFT (Thin Film Transistor) layer 311, an organic layer 312, a color filter layer 313 and a protection layer 214. FIG. 1A illustrates a top-emission organic EL display in which the side on which the protection layer 214 is located becomes a viewing side. Note that the following description is given by using one configuration example of the organic EL display, and the present embodiment is not limited to the configuration described below. For example, in the present embodiment, a bottom-emission organic EL display may be used.

The substrate 218 is a plastic film, and is a film which can be bent by applying a stress thereto. The separating layer 212 and the TFT layer 311 are provided over the substrate 218. The TFT layer 311 includes TFTs 311a disposed in respective pixels PX. Furthermore, the TFT layer 311 includes a wire (not illustrated) connected to the TFT 311a. The TFT 311a and the wire constitute a pixel circuit.

The organic layer 312 is provided over the TFT layer 311. The organic layer 312 includes organic EL light emitting elements 312a disposed for respective pixels PX. The organic EL light emitting element 312a has, for example, a laminated structure in which an anode, a hole injection layer, a hole transport layer, a light emitting layer, an electron transport layer, an electron injection layer and a cathode are laminated. In the case of the top-emission type, the anode is a metal electrode, and the cathode is a transparent conductive film such as an ITO (Indium Tin Oxide). Furthermore, the organic layer 312 is provided with a partitioning wall 312b which separates organic light emitting elements 312a of adjacent pixels PX.

The color filter layer 313 is provided over the organic layer 312. The color filter layer 313 is provided with color filters 313a for displaying color images. That is, each pixel PX is provided with one of the color filters 313a each of which is a resin layer colored R (red), G (green) or B (blue). When white light emitted from the organic layer 312 passes the color filter 313a, it is converted into light having one of RGB colors. In addition, in the case of a three-color system in which the organic layer 312 is provided with organic EL light emitting elements each of which emits light having a respective one of the RGB colors, the color filter layer 313 may be omitted.

The protection layer 214 is provided over the color filter layer 313. The protection layer 214 is made of a resin material, and is provided to prevent deterioration of the organic EL light emitting elements of the organic layer 312.

A current flowing in the organic EL light emitting elements 312a of the organic layer 312 changes according to a display signal supplied to the pixel circuit. Consequently, by supplying a display signal corresponding to a display image to each pixel PX, it is possible to control a light emission amount of each pixel PX. Consequently, it is possible to display a desired image.

<Manufacturing Process of Organic EL Display>

Figure 1B:
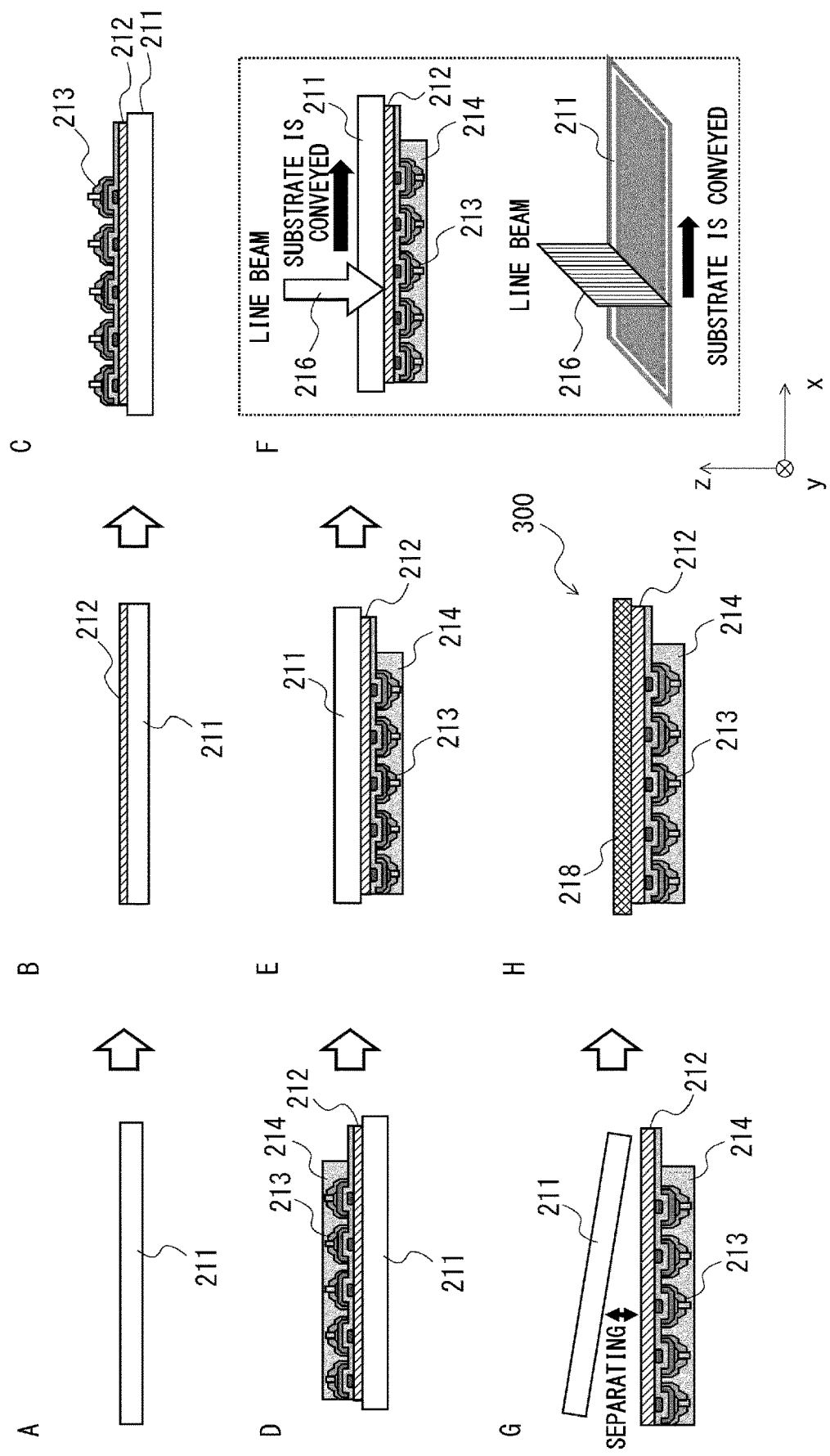
FIG. 1B is a view for explaining an example of the manufacturing process of the organic EL display.

Next, the manufacturing process of the organic EL display described above with reference to FIG. 1B will be described. When the organic EL display is manufactured, a substrate 211 is prepared first (process A). For example, a glass substrate which allows transmission of laser light is used for the substrate 211. Next, the separating layer 212 is formed over the substrate 211 (process B). For example, a polyimide can be used for the separating layer 212. Subsequently, a circuit element 213 is formed over the separating layer 212 (process C). In this regard, the circuit element 213 includes the TFT layer 311, the organic layer 312 and the color filter 313 illustrated in FIG. 1A. The circuit element 213 can be formed by using a photolithography technique or a film formation technique. Subsequently, the protection layer 214 which protects the circuit element 213 is formed over the circuit element 213 (process D).

Next, the substrate 211 is reversed such that the substrate 211 faces upward (process E), and the separating layer 212 is irradiated with layer light 216 from a side of the substrate 211 (process F). A line beam can be used for the laser light 216. In a case of FIG. 1B, the substrate 211 is conveyed in an x direction, so that the laser light 216 is irradiated from a right side to a left side of the substrate 211. Subsequently, the substrate 211 and the separating layer 212 are separated (process G). Lastly, the film 218 is laminated over the separating layer 212. For example, the film 218 is a plastic film, and is a film which can be bent by applying a stress. By using this manufacturing process, it is possible to manufacture the bendable organic EL display 300.

Laser Lift-Off Apparatus (Comparative Example)

Figure 2:
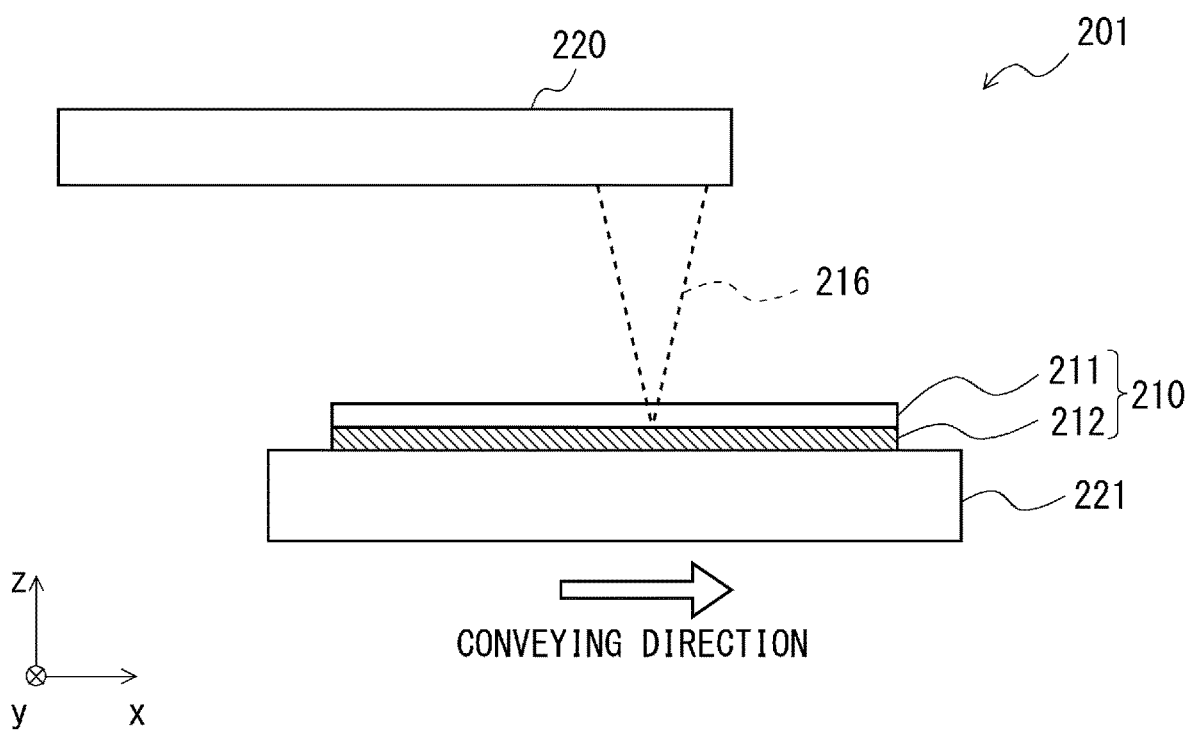
FIG. 2 is a cross-sectional view for explaining the laser lift-off apparatus.

Next, the laser lift-off apparatus (comparative example) used in the process F will be more specifically described. FIG. 2 is a cross-sectional view for explaining the laser lift-off apparatus (laser lift off apparatus). As illustrated in FIG. 2, the laser lift-off apparatus 201 includes an optical system 220 and a stage 221. The optical system 220 receives a supply of laser light from a laser light source (not illustrated). A laser generating apparatus which generates, for example, excimer laser or ultraviolet (UV) laser can be used for the laser light source. The optical system 220 is formed by using a plurality of lenses. The optical system 220 generates the laser light 216 whose shape of laser light supplied from the laser light source is a line shape and, more specifically, whose focus extends in a y axis direction.

The stage 221 is configured to be able to convey a workpiece 210 disposed over the stage 221 in a conveying direction (x axis direction). In this regard, the workpiece 210 includes at least the substrate 211 and the separating layer 212. In addition, the circuit element formed over the separating layer 212 is not illustrated. The workpiece 210 is disposed over the stage 221 such that the substrate 211 faces upward such that an interface between the substrate 211 and the separating layer 212 is irradiated with the laser light 216 from a side of the substrate 211. Furthermore, the stage 221 is configured to be movable in upper and lower directions (a direction along a z axis) to adjust a focus of the laser light 216 to the interface between the substrate 211 and the separating layer 212.

Figure 3:
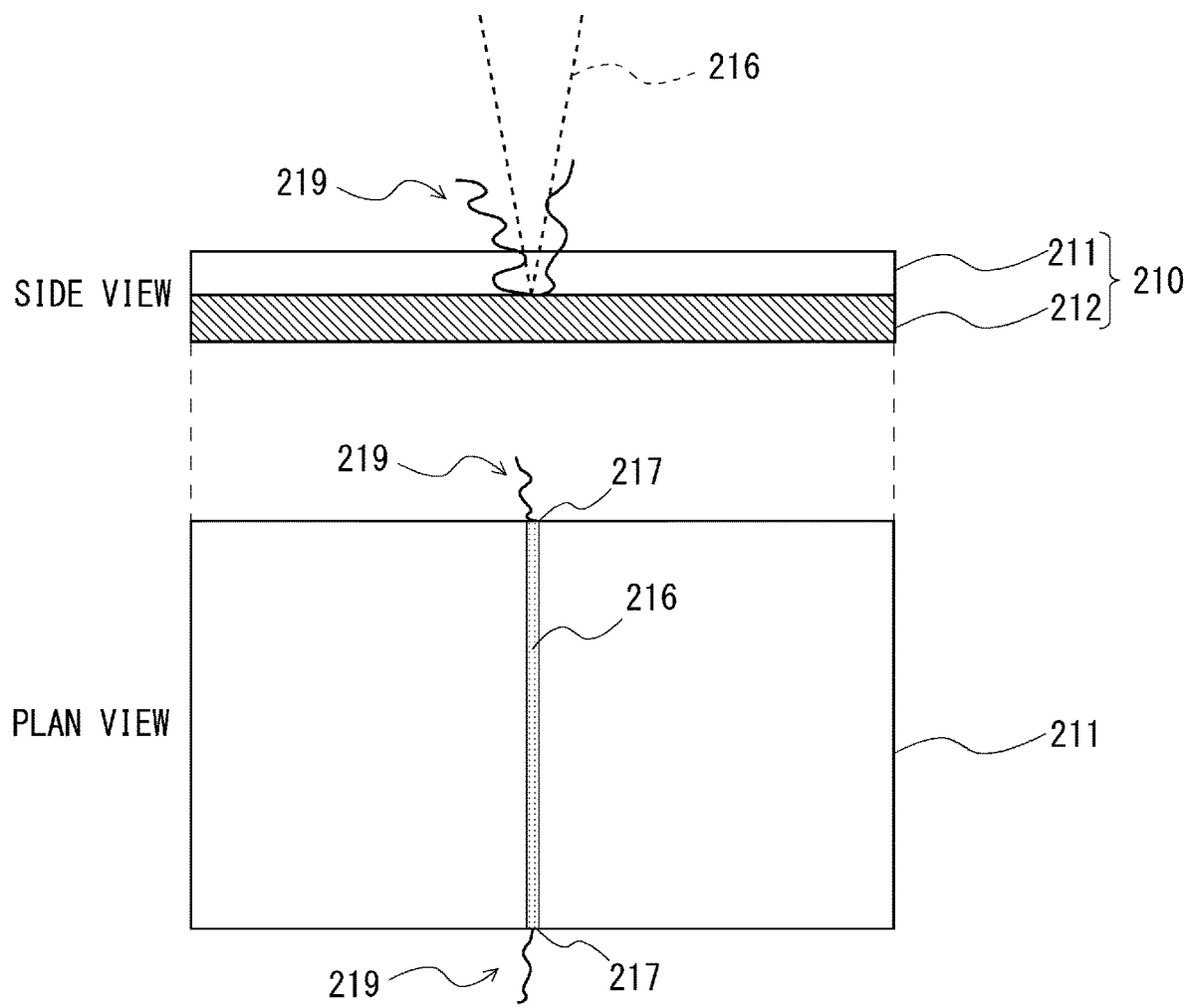
FIG. 3 is a plan view and a side view for explaining the laser separating process.
Figure 4:
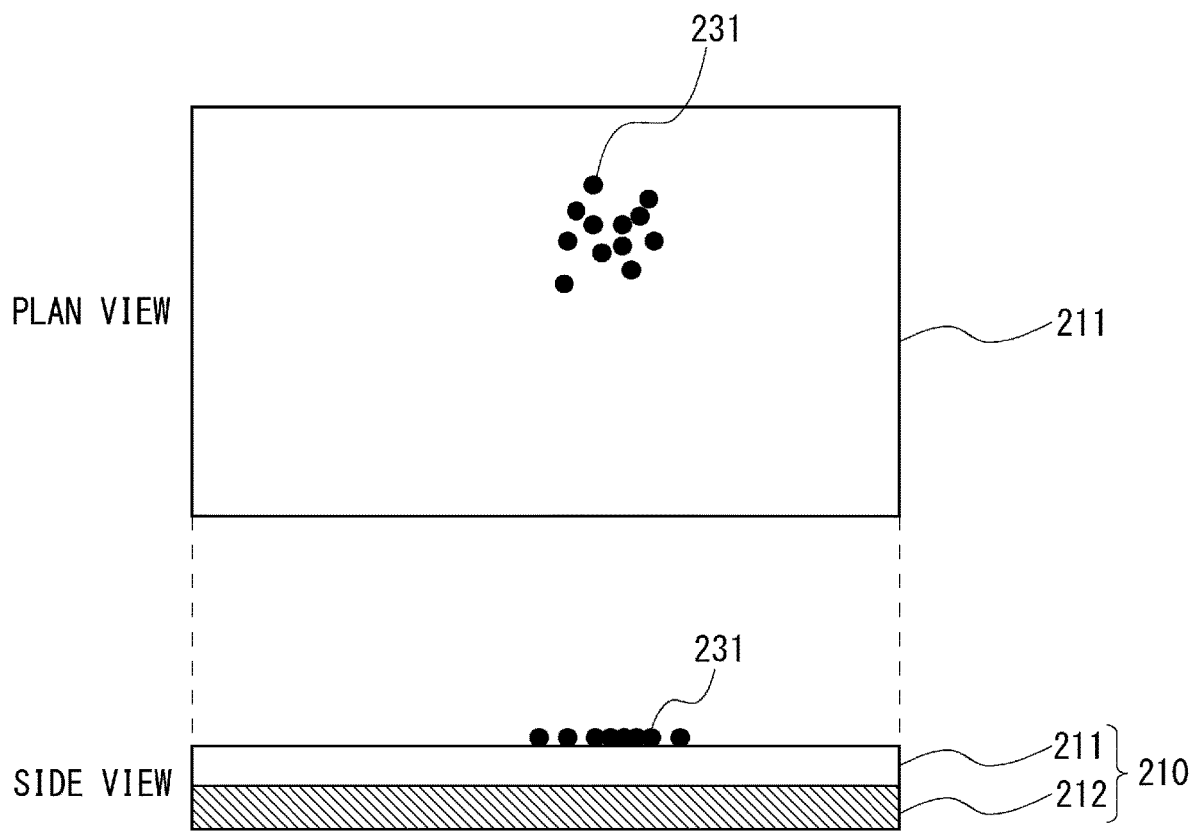
FIG. 4 is a plan view and a side view for explaining the laser separating process.
Figure 5:
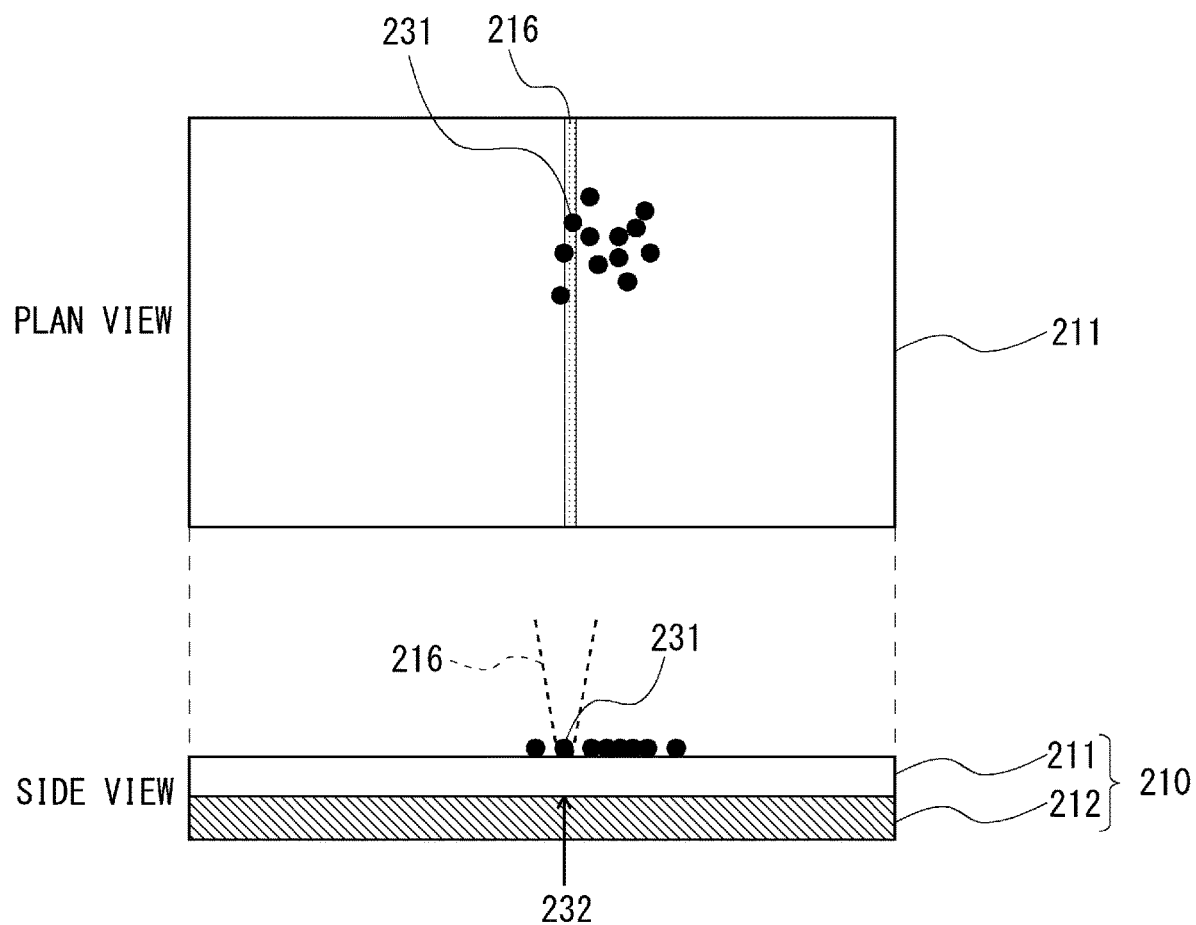
FIG. 5 is a plan view and a side view for explaining the laser separating process.

As illustrated in FIG. 2, by moving the stage 221 in the conveying direction (x axis direction) and conveying the workpiece 210 in the conveying direction while irradiating the workpiece 10 with the laser light 216, it is possible to scan the laser light 216 over the workpiece 210. In this case, the irradiation of the laser light 216 decouples atoms and molecules near the interface between the substrate 211 and the separating layer 212, and therefore, as illustrated in FIG. 3, a sooty smoke 219 is produced from the interface between the substrate 211 and the separating layer 212. This sooty smoke 219 is exhausted to an atmosphere from an end surface 217 of the workpiece 210. This sooty smoke 219 is a decomposition product of the separating layer 212. This sooty smoke 219 deposits on the surface of the substrate 211 and becomes dusts (particles) 231 as illustrated in FIG. 4.

Figure 6:
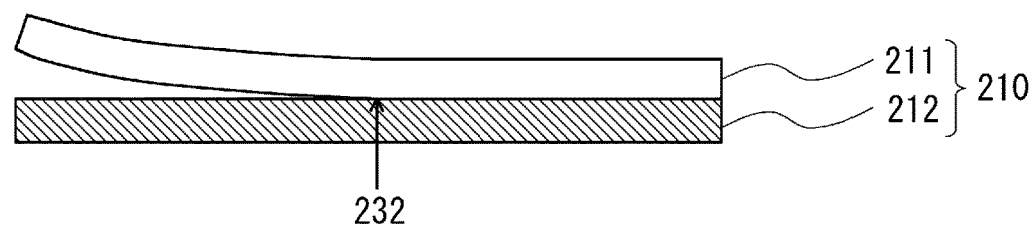
FIG. 6 is a cross-sectional view for explaining the laser separating process.

Furthermore, when the laser light 216 is scanned in a state where the dusts 231 deposit on the surface of the substrate 211, the laser light 216 is blocked by the dusts 231, and a dark spot (dark unevenness) 232 which is a portion at which the laser light 216 does not reach the separating layer 212 is formed. At the dark spot 232 at which this laser light 216 does not reach, the substrate 211 and the separating layer 212 are adhered. Hence, when the substrate 211 and the separating layer 212 are separated as illustrated in FIG. 6, there is a portion at which the substrate 211 and the separating layer 212 are not separated at the portion corresponding to the dark spot 232. When the substrate 211 and the separating layer 212 are forcibly separated in this state, the surface of the separating layer 212 becomes a recessed/protruding shape, and smoothness of the surface of the separating layer 212 becomes uneven. In other words, the thickness of the separating layer 212 becomes uneven. Therefore, there is a problem that the substrate 211 and the separating layer 212 cannot be uniformly separated. Particularly when the laser lift-off apparatus is used in the manufacturing process of the organic EL display, if the substrate 211 and the separating layer 212 cannot be uniformly separated, a display screen of the organic EL display has unevenness.

To solve this problem, the laser lift-off apparatuses according to the first to fourth embodiments described below have a mechanism which removes dusts on substrates. These laser lift-off apparatuses will be more specifically described below.

First Embodiment

Figure 7:
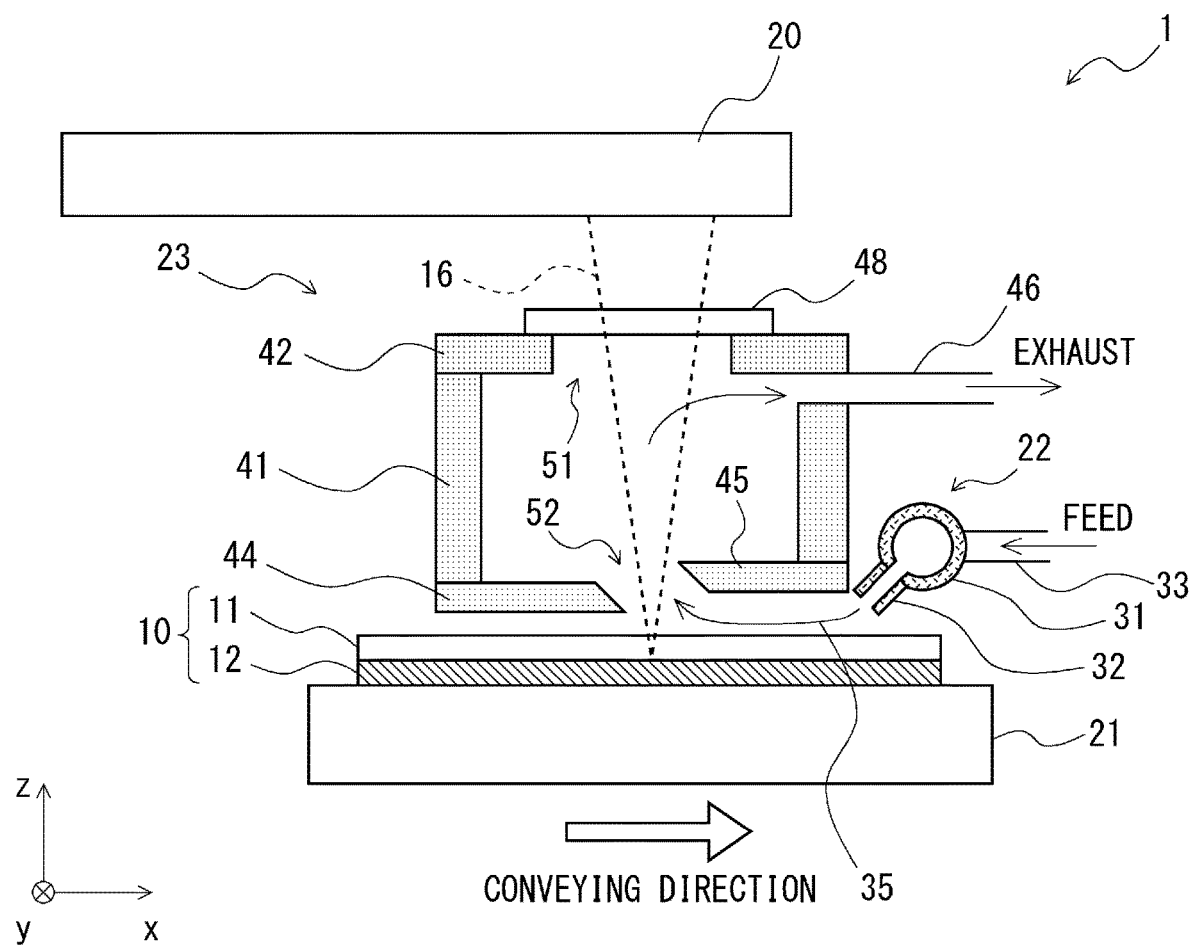
FIG. 7 is a cross-sectional view for explaining the laser lift-off apparatus according to the first embodiment.
Figure 8:
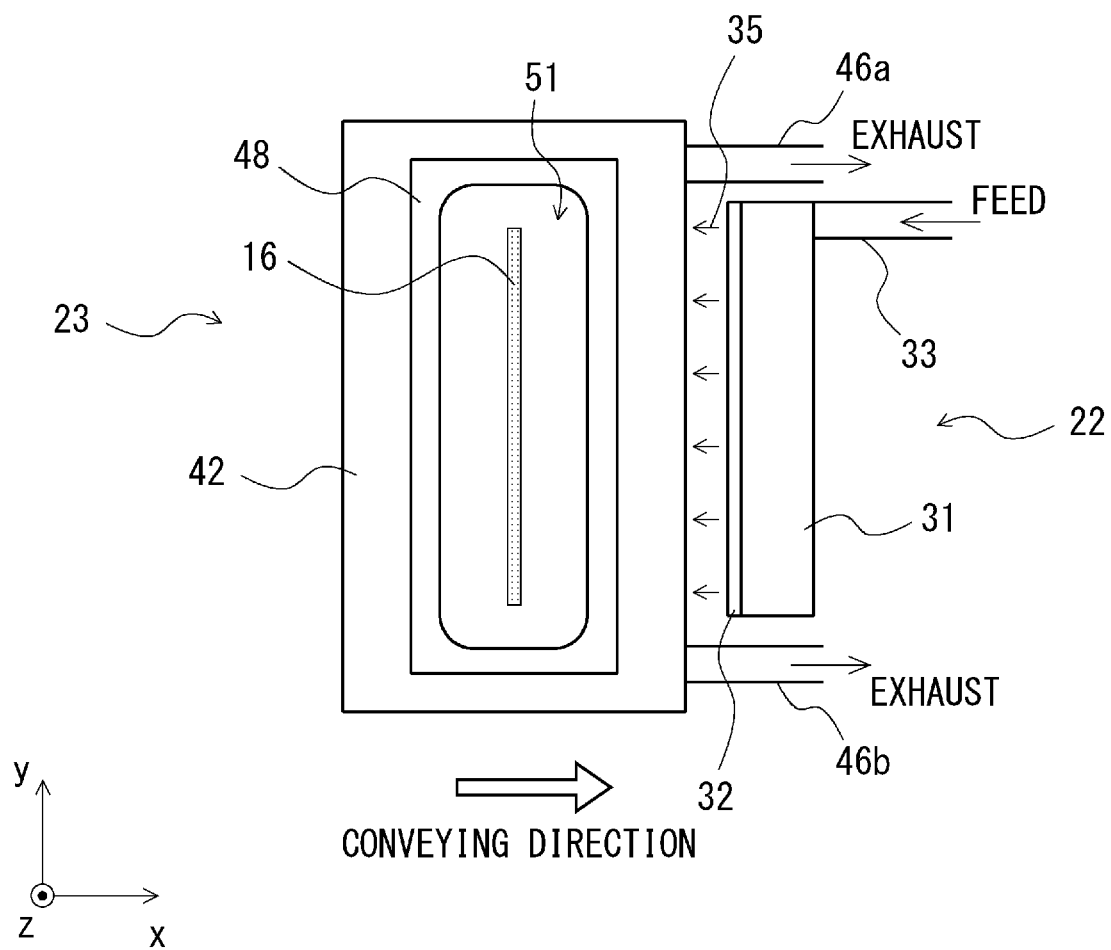
FIG. 8 is a plan view for explaining the laser lift-off apparatus according to the first embodiment.
Figure 9:
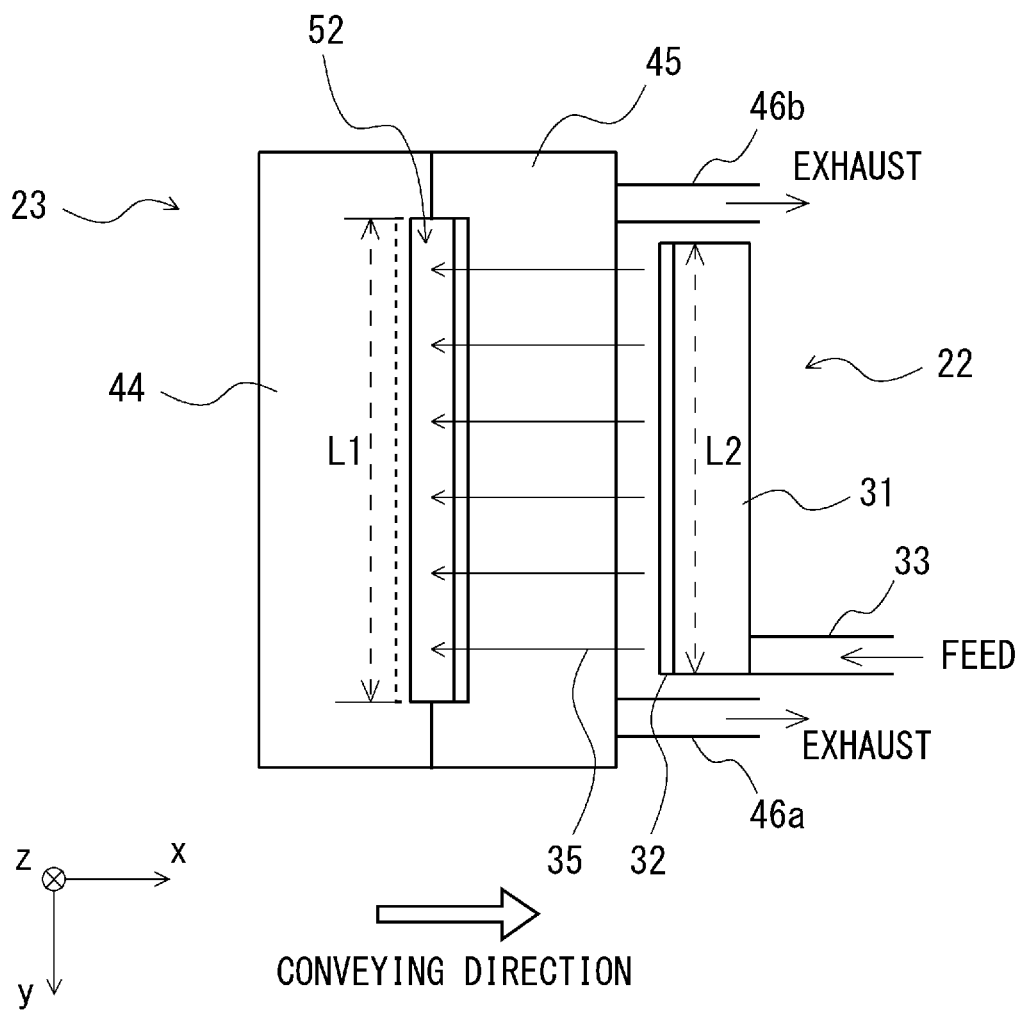
FIG. 9 is a lower view for explaining the laser lift-off apparatus according to the first embodiment.

The first embodiment will be described below with reference to the drawings. FIGS. 7 to 9 are a cross-sectional view, a plan view and a lower view, respectively, for explaining the laser lift-off apparatus according to the first embodiment. As illustrated in FIG. 7, a laser lift-off apparatus 1 includes an optical system 20, a stage 21, an injection unit 22 and a dust collecting unit 23. The laser lift-off apparatus 1 according to the present embodiment is an apparatus which conveys a workpiece 10 including at least a substrate 11 and a separating layer 12 formed over the substrate 11, irradiates an interface between the substrate 11 and the separating layer 12 of the workpiece 10 with laser light 16 from a side of the substrate 11, and separates the separating layer 12 from the substrate 11. When conveying the workpiece 10 while irradiating the workpiece 10 with the laser light, the laser lift-off apparatus 1 blows a gas onto the workpiece 10, sucks the blown gas and collects dusts.

The optical system 20 receives a supply of laser light from a laser light source (not illustrated). A laser generating apparatus which generates, for example, excimer laser or ultraviolet (UV) laser can be used for a laser light source. The optical system 20 is formed by using a plurality of lenses. The optical system 20 generates the laser light 16 (see FIG. 8) whose shape of laser light supplied from the laser light source is a linear shape and, more specifically, whose focus extends in a y axis direction.

The stage 21 is configured to be able to convey the workpiece 10 disposed over the stage 21 in a conveying direction (x axis direction). In this regard, the workpiece 10 includes at least the substrate 11 and the separating layer 12. In addition, a circuit element formed over the separating layer 12 is not illustrated (the same applies below). The workpiece 10 is disposed over the stage 21 such that the substrate 11 faces upward such that an interface between the substrate 11 and the separating layer 12 is irradiated with the laser light 16 from a side of the substrate 11. Furthermore, the stage 21 is configured to be movable in upper and lower directions (a direction along a z axis) to adjust a focus of the laser light 16 to the interface between the substrate 11 and the separating layer 12.

The injection unit 22 blows a gas onto the workpiece 10, and blows away the dusts (particles) existing on the surface of the workpiece 10. As illustrated in FIG. 7, the injection unit 22 is disposed on a conveying direction downstream side (x axis plus side) of the workpiece 10 with respect to the dust collecting unit 23. The injection unit 22 includes a main body portion 31, a nozzle 32 and a feeding pipe 33. As illustrated in FIGS. 8 and 9, the main body portion 31 and the nozzle 32 are disposed to extend in a y axis direction (in other words, a direction parallel to the surface of the workpiece 10 and vertical to the conveying direction of the workpiece 10).

The main body portion 31 of the injection unit 22 receives a supply of a gas (compressed gas) from the feeding pipe 33. Furthermore, the gas supplied to the main body portion 31 is blown from a distal end of the nozzle 32 toward the surface of the workpiece 10 (indicated by an arrow 35). As illustrated in FIG. 7, a flow path of the nozzle 32 is narrow, and therefore the nozzle 32 functions as a throttle. Hence, a pressure inside the main body portion 31 becomes high, and the gas bursts out from the distal end of the nozzle 32. In this case, the injection unit 22 blows the gas in a direction (x axis minus side) opposite to the conveying direction of the workpiece 10, and forms a laminar flow in the direction opposite to the conveying direction of the workpiece 10 over the surface of the workpiece 10. The injection unit 22 can be formed by using a metal material such as stainless steel or a resin material. Furthermore, a compressed inert gas (such as nitrogen) or compressed air can be used for the gas supplied from the feeding pipe 33.

As illustrated in FIG. 7, the dust collecting unit 23 is disposed on a conveying direction upstream side (x axis minus side) of the workpiece 10 with respect to the injection unit 22, and sucks and collects through an opening 52 the dusts blown away by the gas 35 blown from the injection unit 22. The dust collecting unit 23 is formed by using a sidewall 41, an upper plate 42 (see FIG. 8) provided at an upper portion of the sidewall 41, and plate members 44 and 45 (see FIG. 9) provided at a lower portion of the sidewall 41. As illustrated in FIG. 8, an upper opening 51 which extends in the y axis direction is formed over the upper plate 42, and this upper opening 51 is closed by a lid 48.

As illustrated in FIG. 7, the opening 52 is formed between the plate member 44 and the plate member 45. More specifically, as illustrated in FIG. 9, the opening 52 is formed by using the plate member 44 which is disposed on the conveying direction upstream side with respect to the opening 52 and extends in the y axis direction, and the plate member 45 which is disposed on the conveying direction downstream side with respect to the opening 52 and extends in the y axis direction.

As illustrated in FIG. 7, an exhaust pipe 46 (46a and 46b) is attached to the sidewall 41, and a space surrounded by the sidewall 41, the upper plate 42, the plate members 44 and 45 and the lid 48 is exhausted by using the exhaust pipe 46 (46a and 46b) and is thereby depressurized. Consequently, it is possible to suck the dusts through the opening 52.

In this case, as illustrated in FIG. 9, a length L1 in the y axis direction of the opening 52 may be longer than a length L2 in the y axis direction of the nozzle 32 of the injection unit 22. According to this configuration, it is possible to reliably suck through the opening 52 the dusts blown by the gas 35 blown from the nozzle 32.

The opening 52 is disposed at a position meeting an irradiation position of the laser light 16 (see FIGS. 7 and 9). Furthermore, the upper opening 51 is provided at a position meeting an optical path through which the laser light passes. Furthermore, the lid 48 which is formed by a material which allows transmission of the laser light is used to put on the upper opening 51. For example, the lid 48 can be formed by using glass or sapphire. As illustrated in FIGS. 8 and 9, the upper opening 51 and the opening 52 are formed to extend in the y axis direction. Hence, as illustrated in FIG. 7, the laser light 16 of a line shape passes the upper opening 51 of the dust collecting unit 23, then passes the opening 52 and arrives at the interface between the substrate 11 and the separating layer 12. The sidewall 41, the upper plate 42, and the plate members 44 and 45 of the dust collecting unit 23 can be formed by using a metal material such as stainless steel or a resin material.

Figure 10:
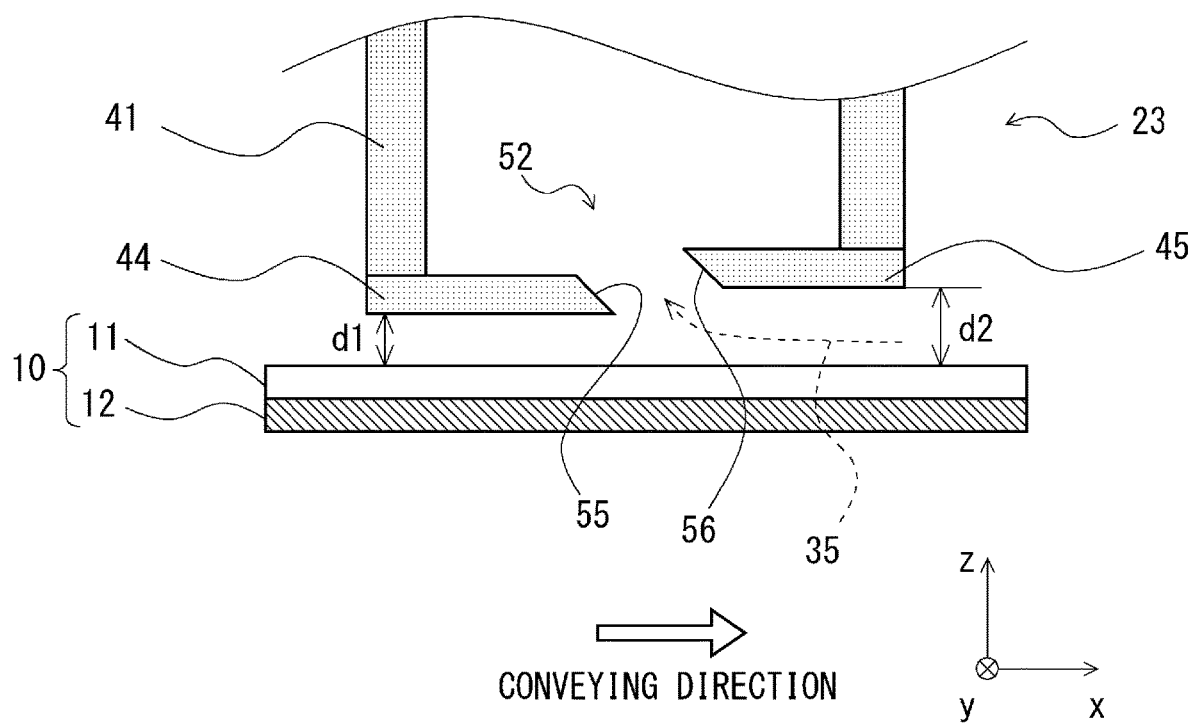
FIG. 10 is an enlarged cross-sectional view of a vicinity of the workpiece of the dust collecting unit.

FIG. 10 is an enlarged cross-sectional view of a vicinity of the workpiece 10 of the dust collecting unit 23. As illustrated in FIG. 10, the plate members 44 and 45 are disposed such that a gap d2 between the plate member 45 and the workpiece 10 is wider than a gap d1 between the plate member 44 and the workpiece 10. The plate members 44 and 45 are disposed in this way, so that it is possible to reduce an air resistance in the gap d2 between the plate member 45 and the workpiece 10. Consequently, the gas 35 readily flows in the gap d2 between the plate member 45 and the workpiece 10, and the gas 35 readily flows to the opening 52 of the dust collecting unit 23.

Furthermore, as illustrated in FIG. 10, a cross-sectional shape of the opening 52 of the plate member 44 may have a shape having such an inclined surface 55 that an angle formed between the inclined surface 55 and a lower surface of the plate member 44 is an acute angle. Furthermore, a cross-sectional shape of the opening 52 of the plate member 44 may be a shape having such an inclined surface 56 that an angle formed between the inclined surface 56 and an upper surface of the plate member 45 is an acute angle. By forming the plate members 44 and 45 in these shapes, it is possible to reduce the air resistance in the opening 52 of the dust collecting unit 23, so that the gas 35 readily flows through the opening 52.

As described above, the laser lift-off apparatus 1 according to the present embodiment includes the injection unit 22 which blows the gas 35 onto the workpiece 10, and blows away the dusts existing on the surface of the workpiece 10, and the dust collecting unit 23 which includes the opening 52 at a position meeting the irradiation position of the laser light 16 and sucks and collects the blown dusts through the opening 52. Consequently, when the laser lift-off apparatus 1 is used to convey the workpiece 10 and irradiate the workpiece 10 with the laser light 16, it is possible to blow away and remove the dusts existing on the surface of the workpiece 10.

Consequently, it is possible to prevent formation of a dark spot which is a portion at which the laser light 16 is blocked by the dusts and the laser light 16 does not reach the separating layer 12. Consequently, it is possible to prevent formation of the portion at which the substrate 11 and the separating layer 12 are not separated, so that it is possible to uniformly separate the substrate 11 and the separating layer 12. That is, it is possible to prevent the surface of the separating layer 12 from becoming a recessed/protruding shape when the substrate 11 and the separating layer 12 are separated, and make the surface of the separating layer 12 a smooth state. In other words, it is possible to prevent the thickness of the separating layer 12 from becoming uneven.

Furthermore, by using the laser lift-off apparatus 1 according to the present embodiment in organic EL display manufacturing process, it is possible to uniformly separate the substrate 11 and the separating layer 12, and prevent unevenness in the display screen of the organic EL display.

Furthermore, the laser lift-off apparatus 1 according to the present embodiment is provided with the opening 52 at the position meeting the irradiation position of the laser light 16, and sucks the dusts through this opening 52, so that it is possible to remove the dusts near the irradiation position of the laser light 16. Particularly, according to this configuration, it is possible to cause the gas to flow onto an optical axis of the laser light 16, so that it is possible to suck and remove through the opening 52 the sooty smoke (see FIG. 3) produced by irradiating the separating layer 12 with the laser light 16. Consequently, it is possible to prevent the dusts from adhering onto the workpiece 10.

Furthermore, the laser lift-off apparatus 1 according to the present embodiment includes the injection unit 22 disposed on the conveying direction downstream side of the workpiece 10 with respect to the dust collecting unit 23 (opening 52), and the injection unit 22 blows the gas 35 in the direction opposite to the conveying direction of the workpiece 10 to form the laminar flow 35 in the direction opposite to the conveying direction of the workpiece 10 over the surface of the workpiece 10. Consequently, it is possible to remove the dusts existing on the surface of the workpiece 10 before the workpiece 10 is irradiated with the laser light 16.

According to the above described present embodiment, it is possible to provide the laser lift-off apparatus, the laser lift-off method and the organic EL display manufacturing method which can uniformly separate the separating layer from the substrate.

Second Embodiment

Figure 11:
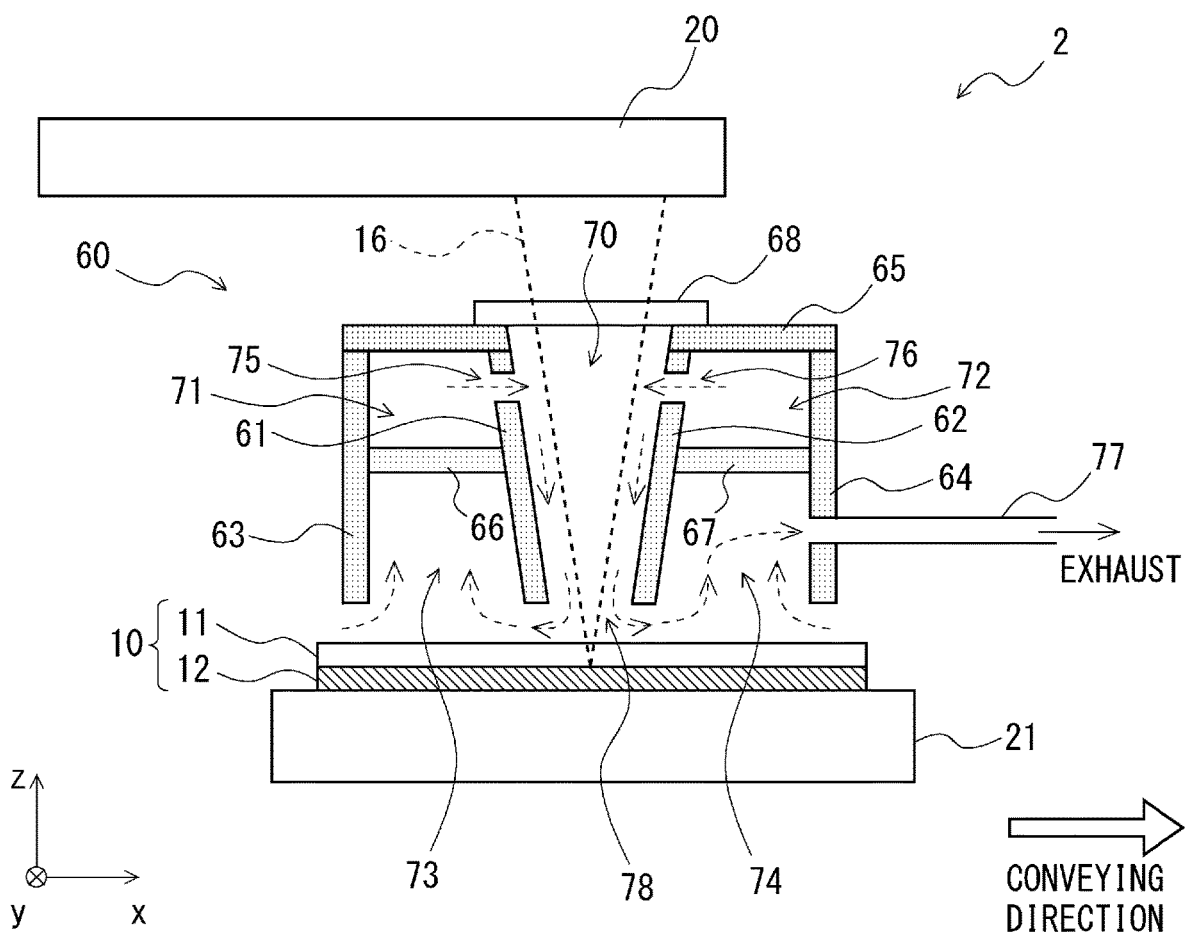
FIG. 11 is a cross-sectional view for explaining a laser lift-off apparatus according to the second embodiment.

Next, the second embodiment will be described. FIG. 11 is a cross-sectional view for explaining a laser lift-off apparatus according to the second embodiment. As illustrated in FIG. 11, a laser lift-off apparatus 2 includes an optical system 20, a stage 21 and a dust collecting unit 60. The laser lift-off apparatus 2 according to the present embodiment is an apparatus which conveys a workpiece 10 including at least a substrate 11 and a separating layer 12 formed over the substrate 11, irradiates an interface between the substrate 11 and the separating layer 12 of the workpiece 10 with laser light 16 from a side of the substrate 11, and separates the separating layer 12 from the substrate 11.

The optical system 20 receives a supply of laser light from a laser light source (not illustrated). A laser generating apparatus which generates, for example, excimer laser or ultraviolet (UV) laser can be used for a laser light source. The optical system 20 is formed by using a plurality of lenses. The optical system 20 generates the laser light 16 whose shape of laser light supplied from the laser light source is a linear shape and, more specifically, whose focus extends in a y axis direction.

The stage 21 is configured to be able to convey the workpiece 10 disposed over the stage 21 in a conveying direction (x axis direction). In this regard, the workpiece 10 includes at least the substrate 11 and the separating layer 12. In addition, a circuit element formed over the separating layer 12 is not illustrated. The workpiece 10 is disposed over the stage 21 such that the substrate 11 faces upward such that an interface between the substrate 11 and the separating layer 12 is irradiated with the laser light 16 from a side of the substrate 11. Furthermore, the stage 21 is configured to be movable in upper and lower directions (a direction along a z axis) to adjust a focus of the laser light 16 to the interface between the substrate 11 and the separating layer 12.

Figure 12:
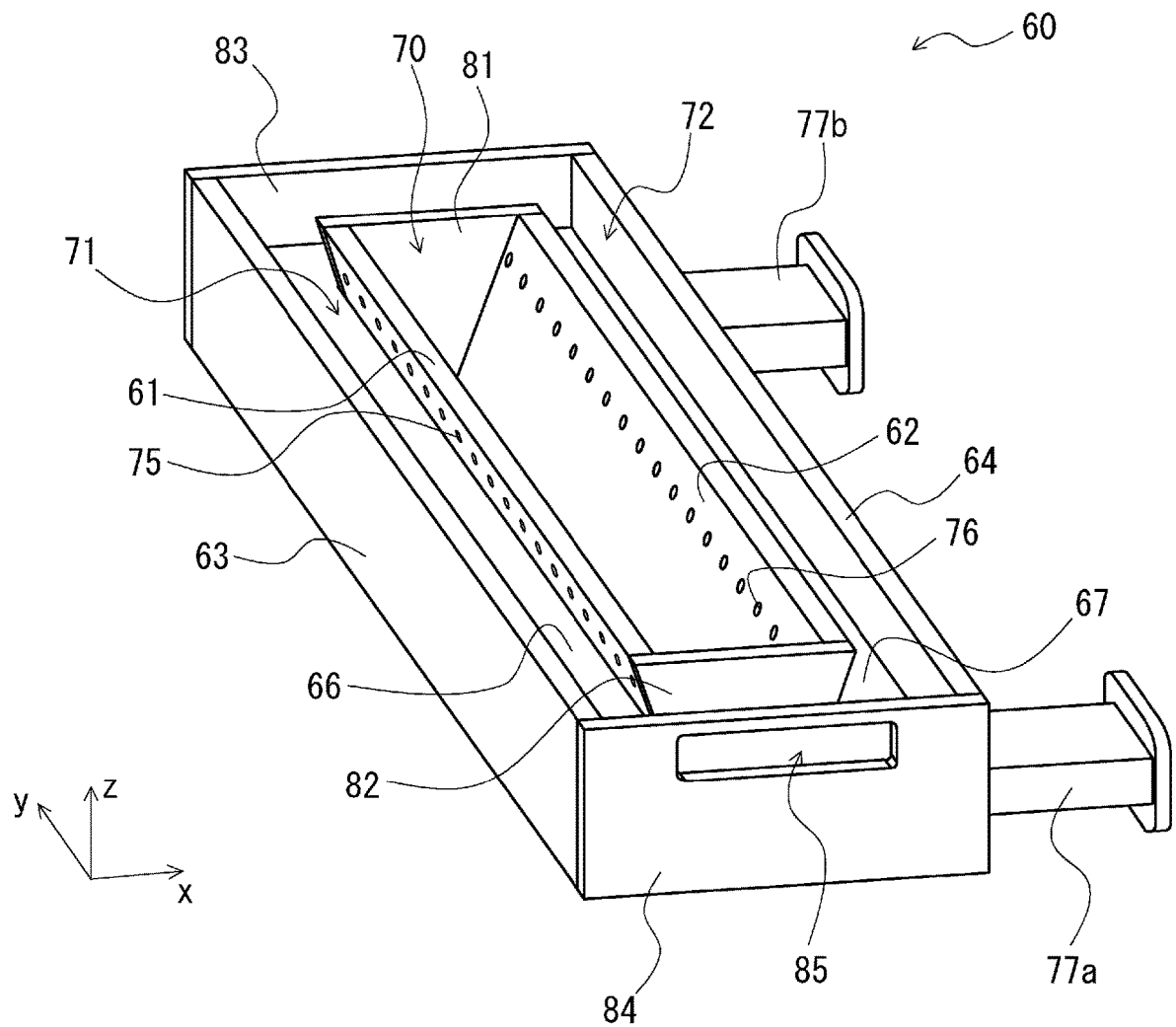
FIG. 12 is perspective views for explaining details of the dust collecting unit of the laser lift-off apparatus according to the second embodiment.
Figure 13:
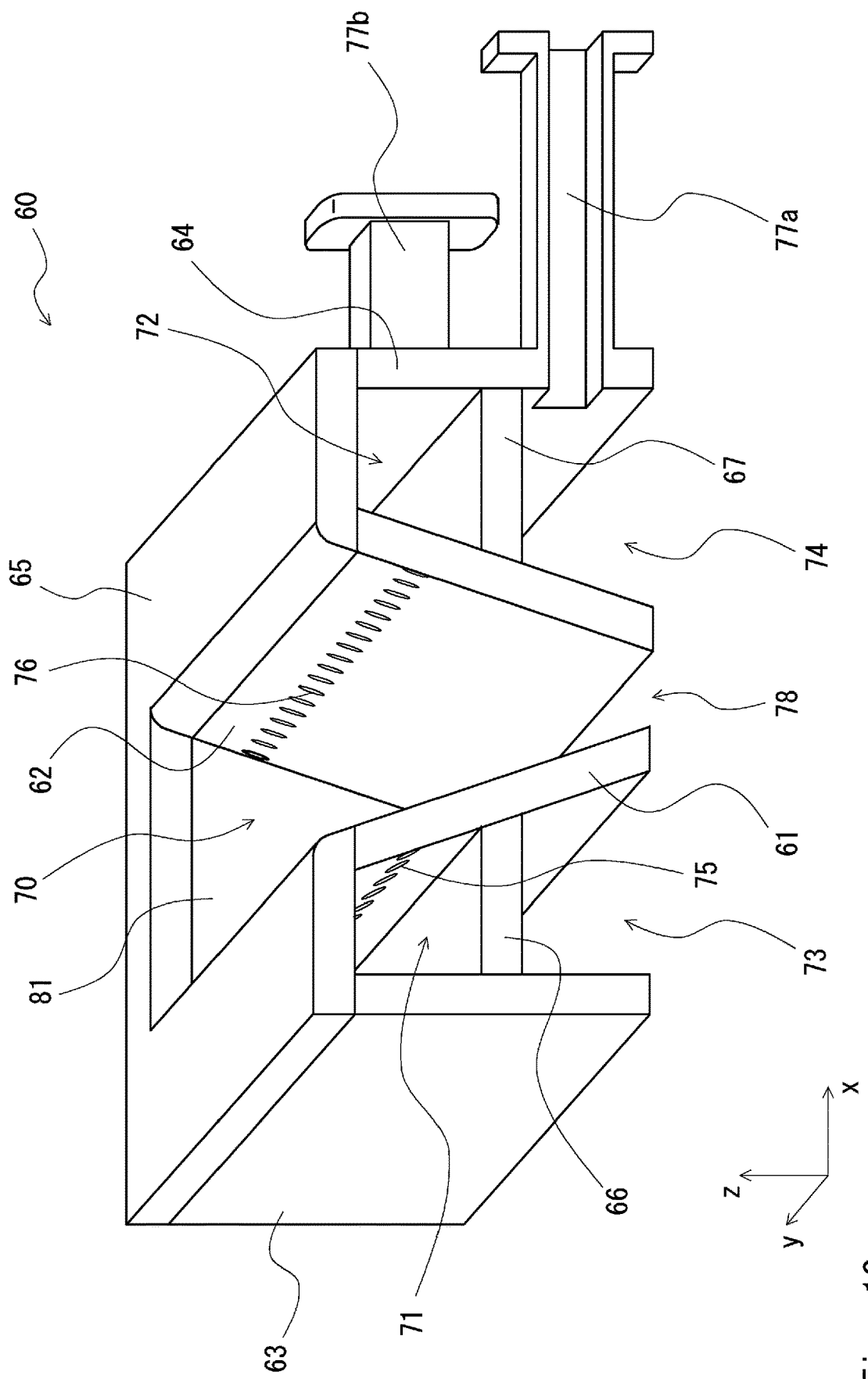
FIG. 13 is perspective views for explaining details of the dust collecting unit of the laser lift-off apparatus according to the second embodiment.

Next, a configuration of the dust collecting unit 60 will be described in detail. FIGS. 12 and 13 are perspective views for explaining details of the dust collecting unit 60 of the laser lift-off apparatus 2 according to the present embodiment. In addition, FIG. 13 illustrates a cross-sectional shape, too, formed by cutting part of the dust collecting unit 60 along an xz plane.

As illustrated in FIGS. 11 to 13, the dust collecting unit 60 includes an optical path space 70, feeding spaces 71 and 72 and exhaust spaces 73 and 74.

The optical path space 70 is a space through which laser light 16 passes, and includes an opening 78 at a position meeting an irradiation position of the laser light 16. The optical path space 70 is formed by using sidewalls 61, 62, 81 and 82 (see FIG. 12) disposed around the optical path space 70, and a lid 68 (see FIG. 11) disposed to cover upper parts of the sidewalls 61 and 62. In this case, the sidewall 61 is a plate member disposed on a conveying direction upstream side (x axis minus side) of the workpiece 10 with respect to the optical path space 70. The sidewall 62 is a plate member disposed on a conveying direction downstream side (x axis plus side) of the workpiece 10 with respect to the optical path space 70.

As illustrated in FIG. 12, the sidewall 61 and the sidewall 62 are disposed to extend in the y axis direction. Furthermore, the sidewalls 81 and 82 are disposed at both ends in the y axis direction of the sidewall 61 and the sidewall 62, respectively. As illustrated in FIG. 13, the opening 78 is disposed to extend in the y axis direction. The sidewall 61 and the sidewall 62 are disposed to face each other, and the sidewall 81 and the sidewall 82 are disposed to face each other. The optical path space 70 is a space surrounded by the sidewalls 61, 62, 81 and 82.

In addition, as illustrated in FIG. 11, in the present embodiment, the sidewalls 61 and 62 are disposed obliquely with respect to a vertical direction (z axis direction) such that the sidewalls 61 and 62 do not block optical paths. As long as the sidewalls 61 and 62 do not block the optical paths, the sidewalls 61 and 62 may be disposed in parallel to the vertical direction.

As illustrated in FIG. 11, the lid 68 is disposed over an upper plate 65. That is, the lid 68 is used to put on the optical path space 70. The lid 68 is formed by a material which allows transmission of laser light, and can be formed by using, for example, glass or sapphire. In addition, FIG. 12 does not illustrate the upper plate 65 and the lid 68. Furthermore, FIG. 13 does not illustrate the lid 68. As illustrated in FIG. 12, the optical path space 70 is formed to extend in the y axis direction, and can allow the laser light 16 of a line shape extending in the y axis direction to pass. Hence, as illustrated in FIG. 11, the laser light 16 of the line shape passes the optical path space 70 of the dust collecting unit 23, then passes the opening 78 and reaches the interface between the substrate 11 and the separating layer 12.

As illustrated in FIG. 11, feeding holes 75 and 76 for supplying a gas to the optical path space 70 are formed in the sidewalls 61 and 62, respectively. That is, the optical path space 70 and the feeding space 71 continue via the feeding hole 75, and the gas is supplied to the optical path space 70 from the feeding space 71 via the feeding hole 75. Furthermore, the optical path space 70 and the feeding space 72 continue via the feeding hole 76, and the gas is supplied to the optical path space 70 from the feeding space 72 via the feeding hole 76. As illustrated in FIGS. 12 and 13, for example, the feeding holes 75 and 76 are formed to align along the y axis direction.

The feeding spaces 71 and 72 are disposed outside the optical path space 70. More specifically, the feeding space 71 is disposed on the conveying direction upstream side (x axis minus side) of the workpiece 10 with respect to the optical path space 70, and at an upper portion of the exhaust space 73. Furthermore, the feeding space 72 is disposed on the conveying direction downstream side (x axis plus side) of the workpiece 10 with respect to the optical path space 70, and at the upper portion of the exhaust space 74. As illustrated in FIG. 12, the feeding spaces 71 and 72 spatially continue on both end sides in the y axis direction of the dust collecting unit 60. That is, the feeding spaces 71 and 72 are disposed to surround an outer side of the optical path space 70.

As illustrated in FIG. 12, the feeding spaces 71 and 72 are spaces surrounded by plate members 63 and 64, plate members 83 and 84, the sidewalls 61 and 62, the sidewalls 81 and 82, partitioning plates 66 and 67 and the upper plate 65 (see FIG. 13). As illustrated in FIG. 12, a feeding port 85 which supplies the gas to the feeding spaces 71 and 72 is formed at an end portion on a y axis direction minus side of the dust collecting unit 60, i.e., at the plate member 84. The feeding port 85 receives a supply of a gas of a positive pressure such as a compressed inert gas (such as nitrogen) or compressed air.

As illustrated in FIGS. 11 and 13, the exhaust spaces 73 and 74 are disposed outside the optical path space 70. More specifically, the exhaust space 73 is disposed on the conveying direction upstream side (x axis minus side) of the workpiece 10 with respect to the optical path space 70 and at a lower portion of the feeding space 71. Furthermore, the exhaust space 74 is disposed on the conveying direction downstream side (x axis plus side) of the workpiece 10 with respect to the optical path space 70 and at a lower portion of the feeding space 72. Similar to the cases of the feeding spaces 71 and 72, the exhaust spaces 73 and 74 spatially continue on both end sides in the y axis direction of the dust collecting unit 60.

As illustrated in FIGS. 11 to 13, the exhaust spaces 73 to 74 are spaces surrounded by the plate members 63 and 64, the plate members 83 and 84, the sidewalls 61 and 62, the sidewalls 81 and 82 and the partitioning plates 66 and 67. The exhaust spaces 73 and 74 are opened on a side of the workpiece 10. An exhaust port 77 (77a and 77b) is attached to the plate member 64 of the dust collecting unit 60, and, by exhausting the exhaust spaces 73 and 74 by using a fan or a pump attached to a distal end of the exhaust port 77 (77a and 77b), pressures in the exhaust spaces 73 and 74 become negative pressures.

The sidewalls 61, 62, 81 and 82, the plate members 63, 64, 83 and 84, the upper plate 65, the partitioning plates 66 and 67 and the exhaust ports 77a and 77b of the dust collecting unit 60 can be formed by using a metal material such as stainless steel.

Next, an operation of the dust collecting unit 60 will be described. When the dust collecting unit 60 is operated, the gas of the positive pressure is supplied from the feeding port 85 to the feeding spaces 71 and 72 illustrated in FIG. 12. Furthermore, the exhaust spaces 73 and 74 are exhausted via the exhaust ports 77a and 77b illustrated in FIG. 13, so that the pressures in the exhaust spaces 73 and 74 become negative pressures.

As illustrated in FIG. 11, when the pressures in the feeding spaces 71 and 72 become the positive pressures, the gases flow from the feeding spaces 71 and 72 to the optical path space 70 via the feeding holes 75 and 76. In this case, the diameters of the feeding holes 75 and 76 are sufficiently small, so that the pressures in the feeding spaces 71 and 72 become uniform pressures in the entire feeding spaces 71 and 72. Hence, flow amounts of gases flowing out from the feeding holes 75 and 76 become the substantially same. In addition, gas flows are indicated by broken line arrows in FIG. 11. The same applies to FIGS. 14, 16 and 17, too.

The gases supplied from the feeding holes 75 and 76 to the optical path space 70 flow toward the workpiece 10 along the sidewalls 61 and 62, then pass between lower ends of the sidewalls 61 and 62 and the workpiece 10, and flow to the exhaust spaces 73 and 74. That is, the gases supplied from the feeding holes 75 and 76 form downflows, collide against the workpiece 10, and are branched into the conveying direction upstream side and downstream side of the workpiece 10. The gas branched into the conveying direction upstream side of the workpiece 10 flows to the exhaust space 73. Furthermore, the gas branched into the conveying direction downstream side of the workpiece 10 flows to the exhaust space 74. Furthermore, the gases having flowed to the exhaust spaces 73 and 74 are then exhausted from the exhaust port 77 (77a and 77b).

Thus, by making the above-described gas flow inside the dust collecting unit 60, the laser lift-off apparatus 2 according to the present embodiment can exhaust dusts (see FIGS. 3 and 4) produced by irradiation of laser light from the exhaust port 77 (77a and 77b) along the gas flows. In this case, the gases supplied from the feeding holes 75 and 76 form the downflows and collide against the workpiece 10, and consequently can blow away the dusts existing on the surface of the workpiece 10. Furthermore, the blown dusts can be exhausted from the exhaust port 77 (77a and 77b) along the gas flows.

Furthermore, in this case, by making the gas amount to be exhausted from the exhaust port 77 (77a and 77b) larger than the gas amount supplied from the feeding port 85 to the feeding spaces 71 and 72, it is possible to further reduce the pressures in the exhaust spaces 73 and 74. Thus, by further reducing the pressures in the exhaust spaces 73 and 74, the gas can pass between the lower ends of the plate members 63, 64, 83 and 84 (see FIG. 12) and the workpiece 10 from the outside of the dust collecting unit 60, and flow in the exhaust spaces 73 and 74. Consequently, even when the dusts float inside the dust collecting unit 60, it is possible to prevent the dusts from going out of the dust collecting unit 60.

As described above, the laser lift-off apparatus 2 according to the present embodiment includes the dust collecting unit 60 which includes the optical path space 70 which includes the opening 78 at the position meeting the irradiation position of the laser light 16 and allows the laser light 16 to pass, and the exhaust spaces 73 and 74 which are disposed outside the optical path space 70. The feeding holes 75 and 76 which supply the gas to the optical path space 70 are formed in the sidewalls 61 and 62 of the optical path space 70. Furthermore, the gases supplied from the feeding holes 75 and 76 to the optical path space 70 flow toward the workpiece 10 along the sidewalls 61 and 62, then pass between the lower ends of the sidewalls 61 and 62 and the workpiece 10, and flow to the exhaust spaces 73 and 74. Thus, the laser lift-off apparatus 2 according to the present embodiment uses the dust collecting unit 60 to make the above-described gas flows and, consequently, can exhaust the dusts (see FIGS. 3 and 4) produced by irradiation of the laser light 16 along the gas flows.

Consequently, it is possible to prevent formation of a dark spot which is a portion at which the laser light 16 is blocked by the dusts and the laser light 16 does not reach the separating layer 12. Consequently, it is possible to prevent formation of the portion at which the substrate 11 and the separating layer 12 are not separated, so that it is possible to uniformly separate the substrate 11 and the separating layer 12. That is, it is possible to prevent the surface of the separating layer 12 from becoming a recessed/protruding shape when the substrate 11 and the separating layer 12 are separated, and make the surface of the separating layer 12 a smooth state. In other words, it is possible to prevent the thickness of the separating layer 12 from becoming uneven.

Furthermore, the gases supplied from the feeding holes 75 and 76 form the downflows on an optical axis of the laser light 16, and flow along the sidewalls 61 and 62, so that it is possible to prevent sooty smokes and dusts (see FIGS. 3 and 4) produced by irradiation of the laser light from adhering to the sidewalls 61 and 62 and the lower surface of the lid.

Furthermore, by using the laser lift-off apparatus 2 according to the present embodiment in an organic EL display manufacturing process, it is possible to uniformly separate the substrate 11 and the separating layer 12, and prevent unevenness in the display screen of the organic EL display.

According to the above described present embodiment, it is possible to provide the laser lift-off apparatus, the laser lift-off method and the organic EL display manufacturing method which can uniformly separate a separating layer from a substrate.

Third Embodiment

Figure 14:
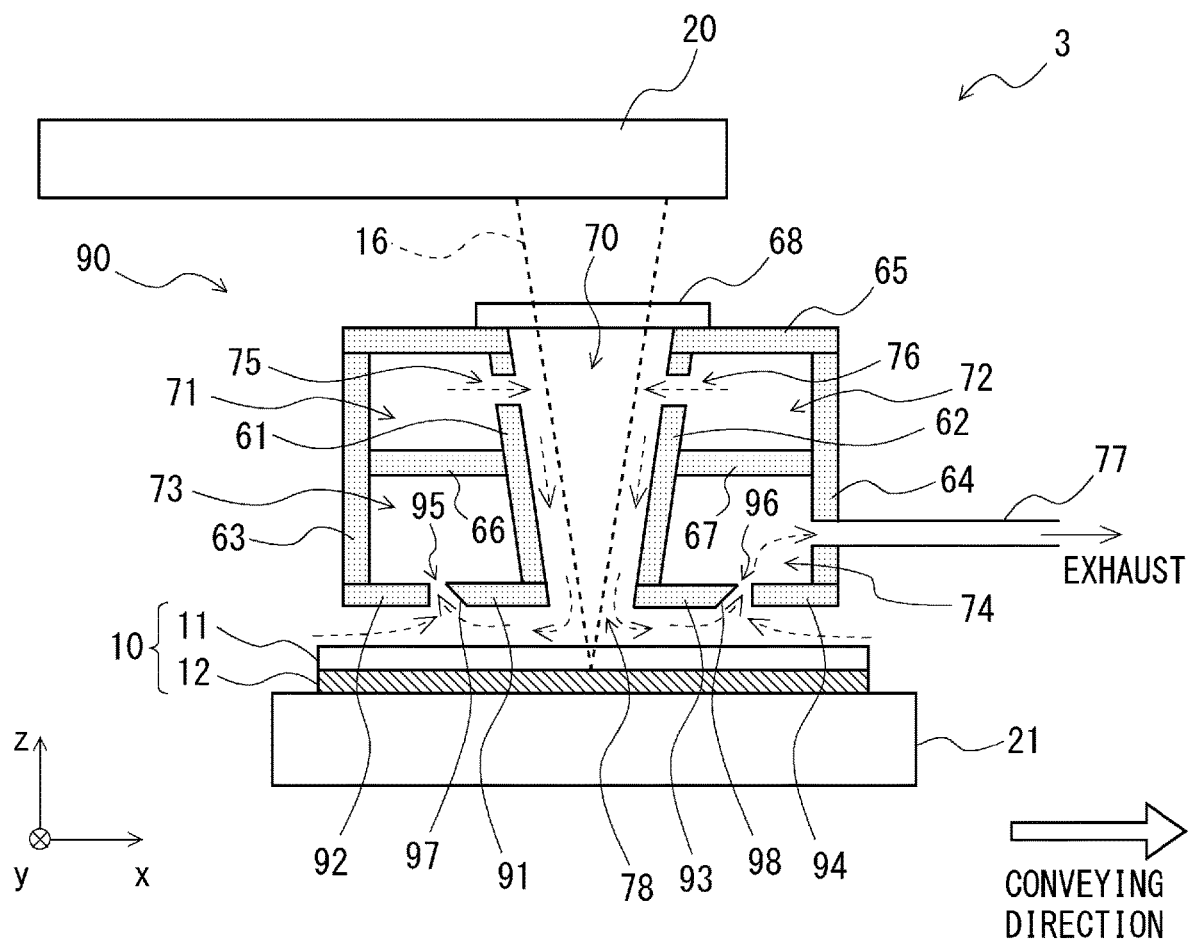
FIG. 14 is a cross-sectional view for explaining a laser lift-off apparatus according to the third embodiment.

Next, the third embodiment will be described. FIG. 14 is a cross-sectional view for explaining a laser lift-off apparatus according to the third embodiment. A laser lift-off apparatus 3 according to the present embodiment differs from a laser lift-off apparatus 2 described in the second embodiment in including bottom plate members 91 to 94 at a bottom portion of a dust collecting unit 90. The other components are the same as those of the laser lift-off apparatus 2 described in the second embodiment, and therefore the same components will be assigned the same reference numerals and overlapping description will be omitted.

Figure 15:
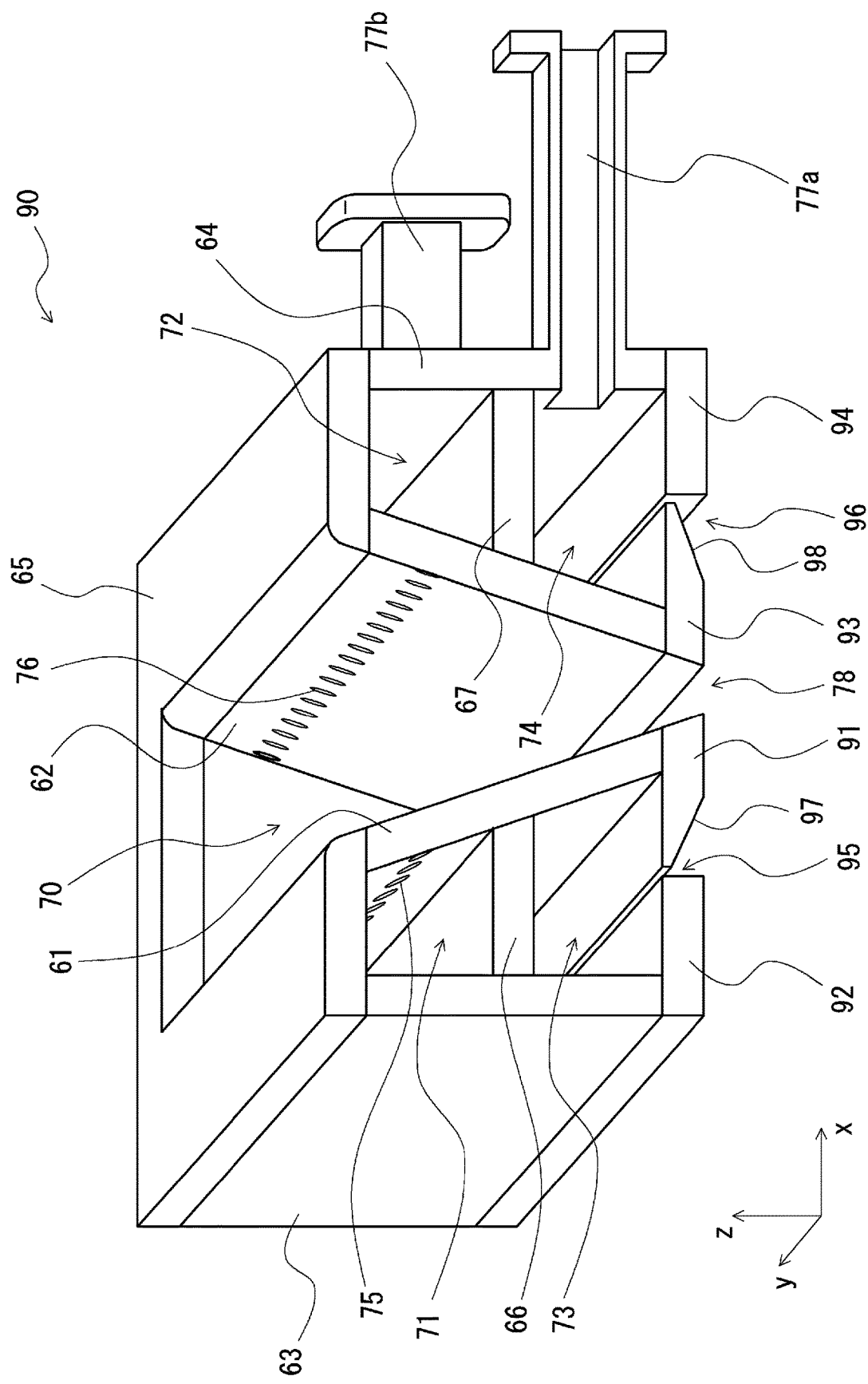
FIG. 15 is a perspective view for explaining a laser lift-off apparatus according to the third embodiment.

As illustrated in FIGS. 14 and 15, an intake port 95 is formed at a lower portion of an exhaust space 73 of the dust collecting unit 90. The intake port 95 can be formed by disposing the bottom plate member 91 and the bottom plate member 92 extending in a y axis direction facing each other. The bottom plate member 91 is attached to a lower portion of a sidewall 61, and the bottom plate member 92 is attached to a lower portion of a plate member 63. The intake port 95 is formed such that a flow path between the surface of the workpiece 10 and the exhaust space 73 narrows.

Similarly, an intake port 96 is formed at a lower portion of an exhaust space 74 of the dust collecting unit 90. The intake port 96 can be formed by disposing the bottom plate member 93 and the bottom plate member 94 extending in the y axis direction facing each other. The bottom plate member 93 is attached to a lower portion of a sidewall 62, and the bottom plate member 94 is attached to a lower portion of the plate member 64. The intake port 96 is formed such that a flow path between the surface of the workpiece 10 and the exhaust space 74 narrows.

Thus, by forming the intake ports 95 and 96, it is possible to narrow the flow paths between the surface of the workpiece 10 and the exhaust spaces 73 and 74. Thus, pressure loss occurs in the exhaust spaces 73 and 74. It is possible to make pressures inside the exhaust spaces uniform in the entire exhaust space. Consequently, it is possible to efficiently collect the gas inside the exhaust spaces 73 and 74 from the surface of the workpiece 10. In other words, it is possible to enhance attraction forces of the intake ports 95 and 96 and consequently increase a flow rate of the gas over the surface of the workpiece 10. Consequently, it is possible to reliably suck the dusts.

In this case, the cross-sectional shape of the intake port 95 of the bottom plate member 91 may be a shape having such an inclined surface 97 that an angle formed between the inclined surface 97 and an upper surface of the bottom plate member 91 is an acute angle. Furthermore, the cross-sectional shape of the intake port 96 of the bottom plate member 93 may be a shape having such an inclined surface 98 that an angle formed between the inclined surface 98 and an upper surface of the bottom plate member 93 is an acute angle. By forming the inclined surfaces 97 and 98 in this way, the gas readily flows from the side of an opening 78 toward the intake ports 95 and 96.

Figure 16:
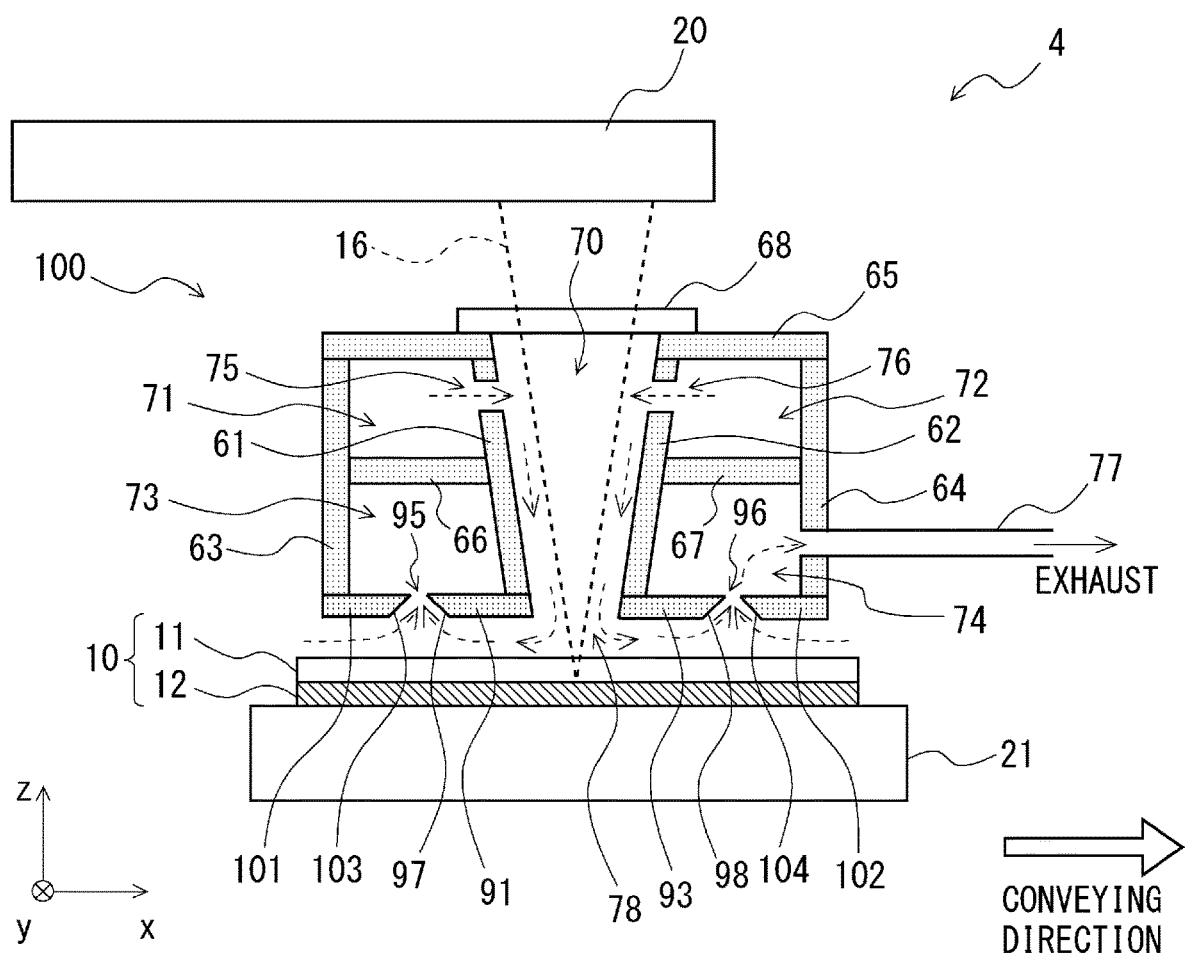
FIG. 16 is a cross-sectional view illustrating another configuration example of the laser lift-off apparatus according to the present embodiment.

FIG. 16 is a cross-sectional view illustrating another configuration example of the laser lift-off apparatus according to the present embodiment. In the present embodiment, similar to a laser lift-off apparatus 4 illustrated in FIG. 16, inclined surfaces 103 and 104 may be formed over bottom plate members 101 and 102 provided at a bottom portion of a dust collecting unit 100, respectively. That is, the cross-sectional shape of the intake port 95 of the bottom plate member 101 may be a shape having such the inclined surface 103 that an angle formed between the inclined surface 103 and an upper surface of the bottom plate member 101 is an acute angle. Furthermore, the cross-sectional shape of the intake port 96 of the bottom plate member 102 may be a shape having such the inclined surface 104 that an angle formed between the inclined surface 104 and an upper surface of the bottom plate member 102 is an acute angle. By forming the inclined surfaces 103 and 104 in this way, the gas readily flows from an outside of the dust collecting unit 100 toward the intake ports 95 and 96.

According to the above described present embodiment, too, it is possible to provide the laser lift-off apparatus, the laser lift-off method and the organic EL display manufacturing method which can uniformly separate the separating layer from the substrate.

Fourth Embodiment

Figure 17:
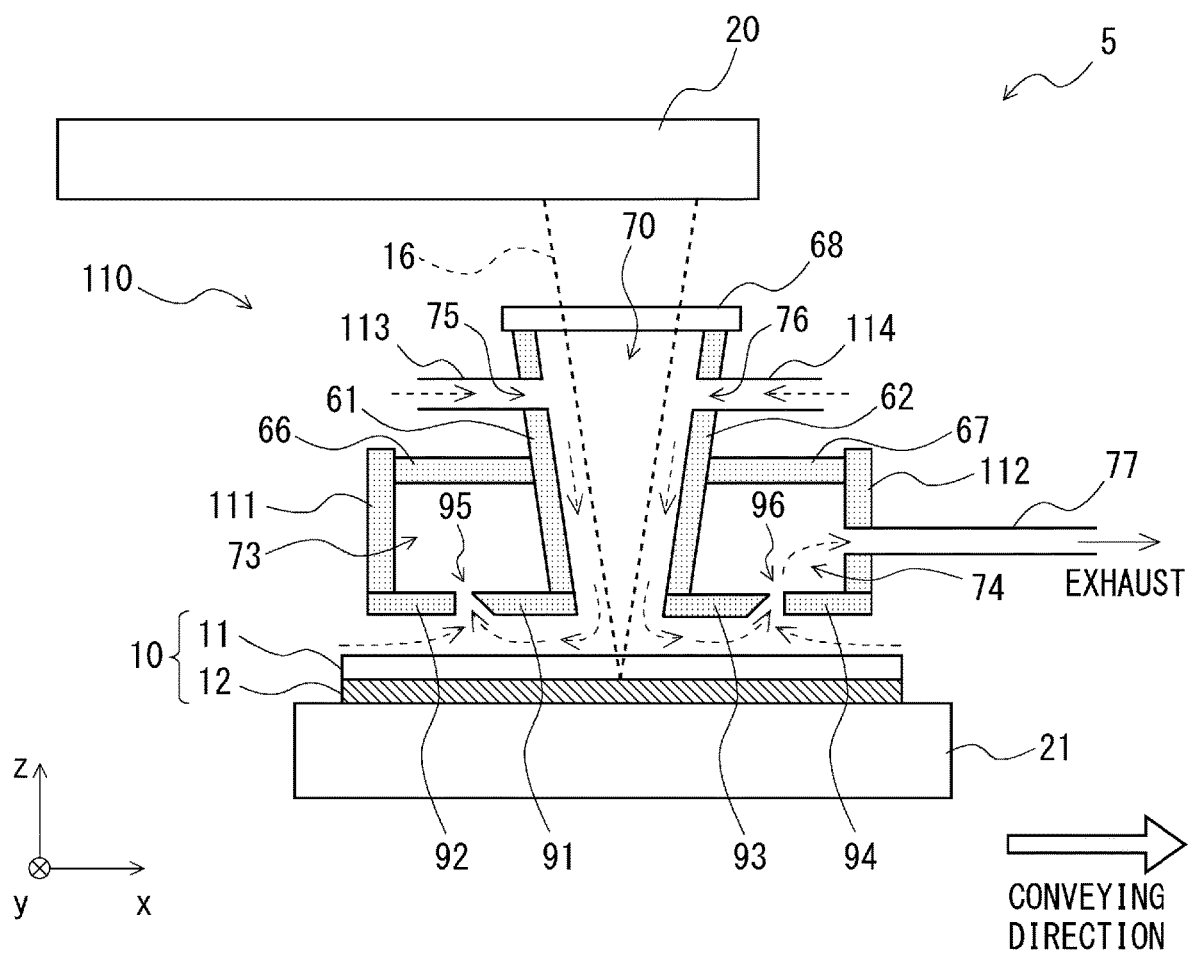
FIG. 17 is a cross-sectional view for explaining a laser lift-off apparatus according to the fourth embodiment.

Next, the fourth embodiment will be described. FIG. 17 is a cross-sectional view for explaining a laser lift-off apparatus 5 according to the fourth embodiment. The laser lift-off apparatus 5 according to the present embodiment differs from a laser lift-off apparatus 3 (see FIG. 14) described in the third embodiment in that a dust collecting unit 110 does not include feeding spaces 71 and 72. The other components are the same as those of the laser lift-off apparatus 3 described in the third embodiment, and therefore the same components will be assigned the same reference numerals and overlapping description will be omitted.

Figure 18:
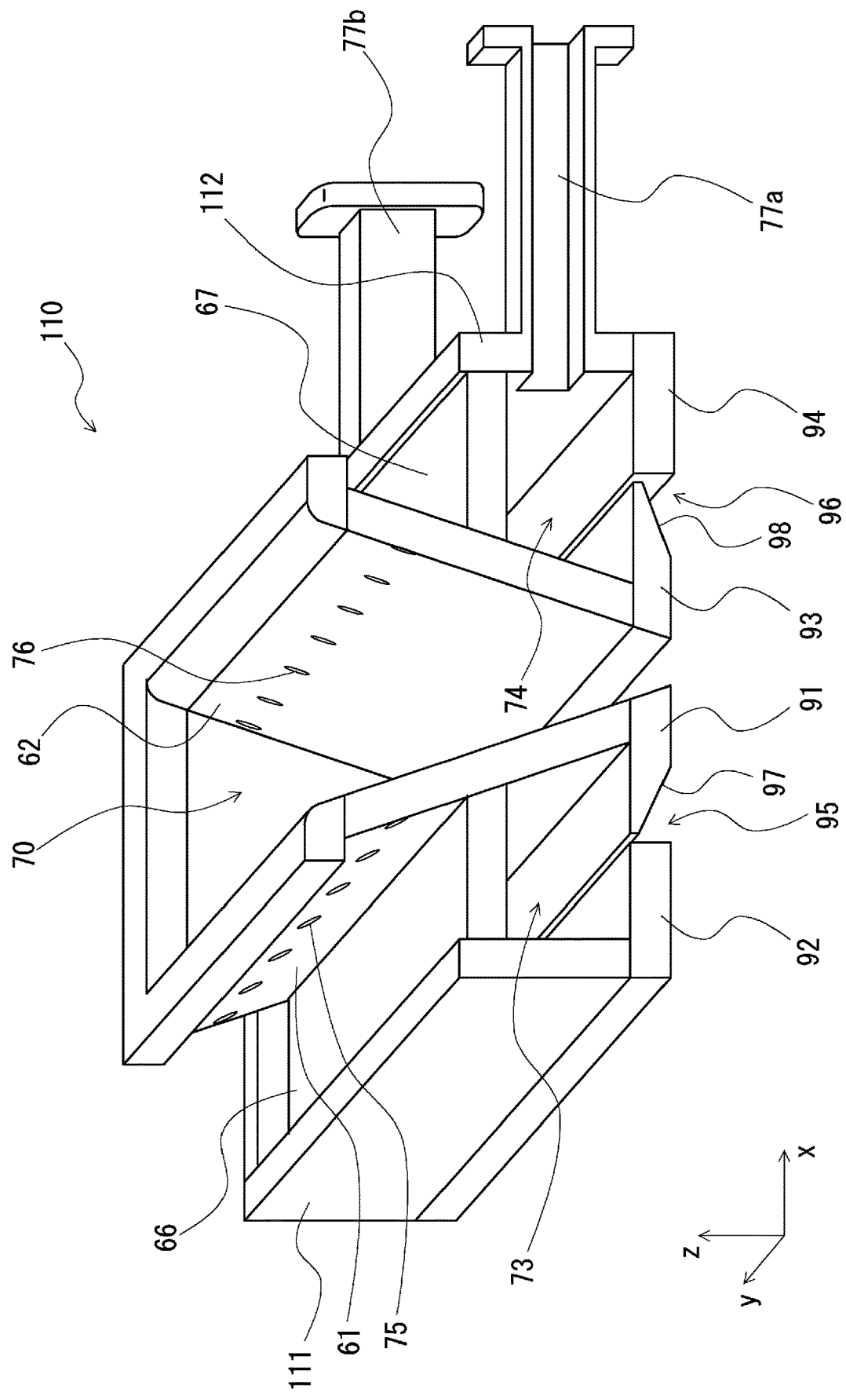
FIG. 18 is a perspective view for explaining a laser lift-off apparatus according to the fourth embodiment.

As illustrated in FIGS. 17 and 18, the dust collecting unit 110 of the laser lift-off apparatus 5 according to the present embodiment includes an optical path space 70 and exhaust spaces 73 and 74. The optical path space 70 and the exhaust spaces 73 and 74 are the same as those described in the second and third embodiments, and therefore will not be described.

In the present embodiment, feeding holes 75 and 76 of sidewalls 61 and 62 of the dust collecting unit 110 are connected with pipes 113 and 114, and a gas of a positive pressure is supplied from these pipes 113 and 114 to the optical path space 70 via the feeding holes 75 and 76. That is, the present embodiment employs a configuration where the lengths in a z axis direction of plate members 111 and 112 are shortened, and an upper plate 65 (see FIG. 14) is not provided compared to a laser lift-off apparatus 4 described in the third embodiment, and feeding spaces 71 and 72 are omitted. Furthermore, the upper plate 65 is not provided in the present embodiment, a lid 68 is provided at upper portions of the sidewalls 61 and 62.

Thus, in the laser lift-off apparatus 5 according to the present embodiment, the feeding holes 75 and 76 are connected with the pipes 113 and 114 to supply the gas of the positive pressure from these pipes 113 and 114 to the optical path space 70. Consequently, it is possible to omit the feeding spaces 71 and 72 (see FIG. 14) and consequently simplify an apparatus configuration.

In addition, the configuration of the laser lift-off apparatus 5 according to the present embodiment, i.e., a configuration where the feeding spaces 71 and 72 are omitted is applicable to a laser lift-off apparatus 2 described in the second embodiment, too. In other words, in the laser lift-off apparatus 5 according to the present embodiment illustrated in FIG. 17, bottom plate members 91 to 94 may be omitted. Furthermore, the configuration of the laser lift-off apparatus 5 according to the present embodiment may be applied to the laser lift-off apparatus 4 according to another configuration example of the third embodiment illustrated in FIG. 16.

<Fifth Embodiment> (Chamber Equipment of Sideflow)

Figure 19:
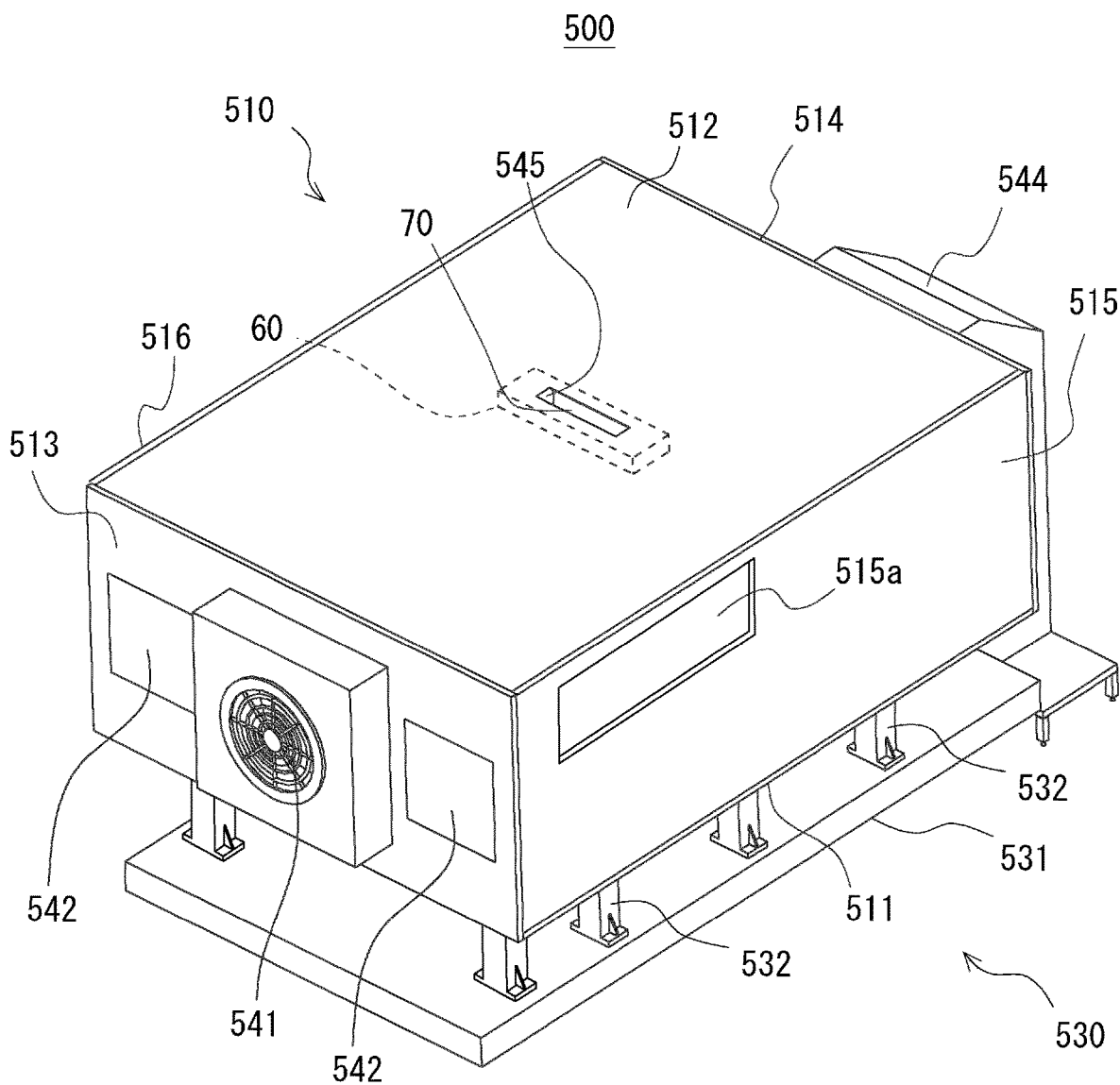
FIG. 19 is a perspective view for explaining a laser lift-off apparatus according to the fifth embodiment.
Figure 20:
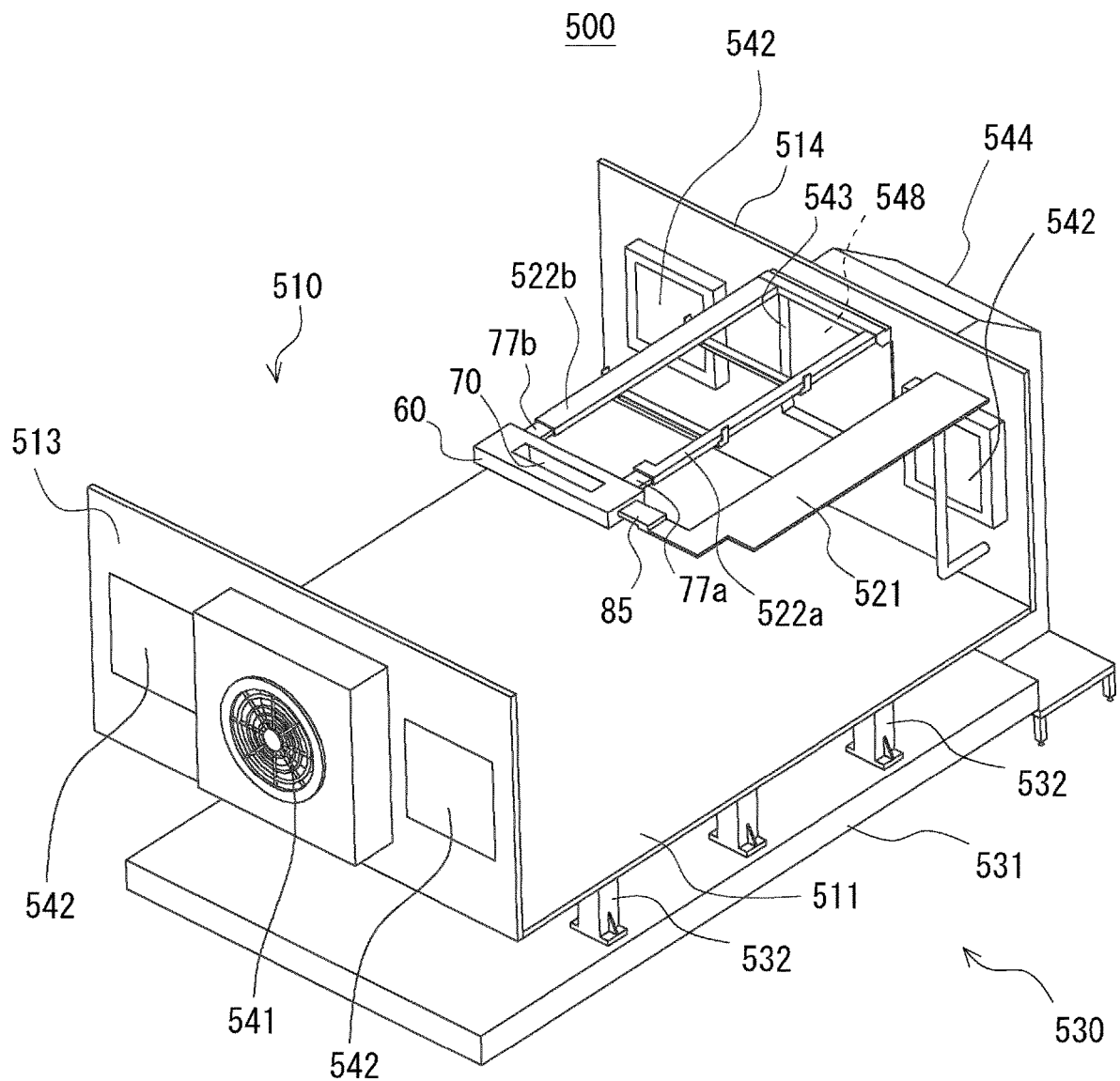
FIG. 20 is a perspective view for explaining a laser lift-off apparatus according to the fifth embodiment.
Figure 21:
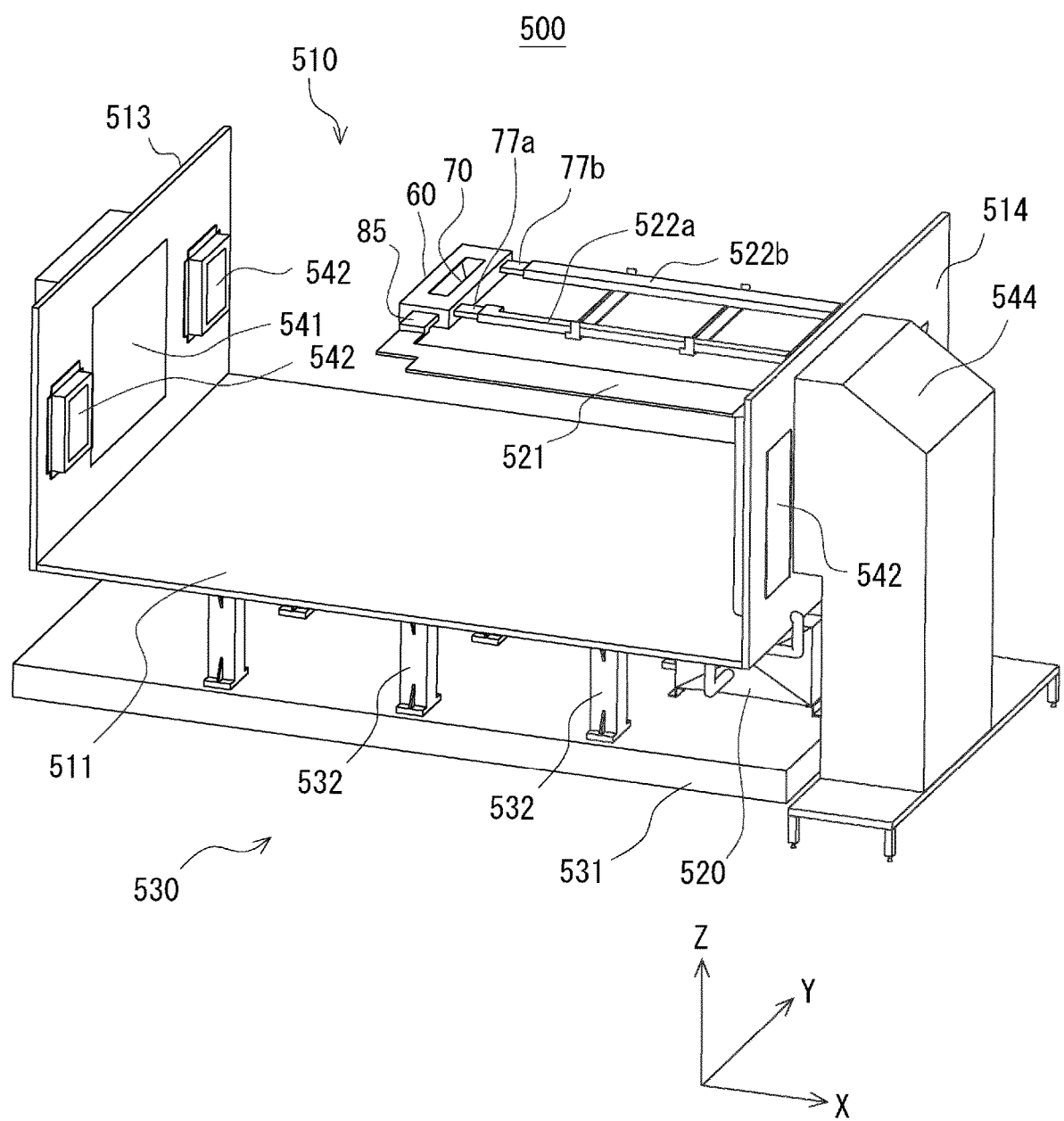
FIG. 21 is a perspective view for explaining a laser lift-off apparatus according to the fifth embodiment.
Figure 22:
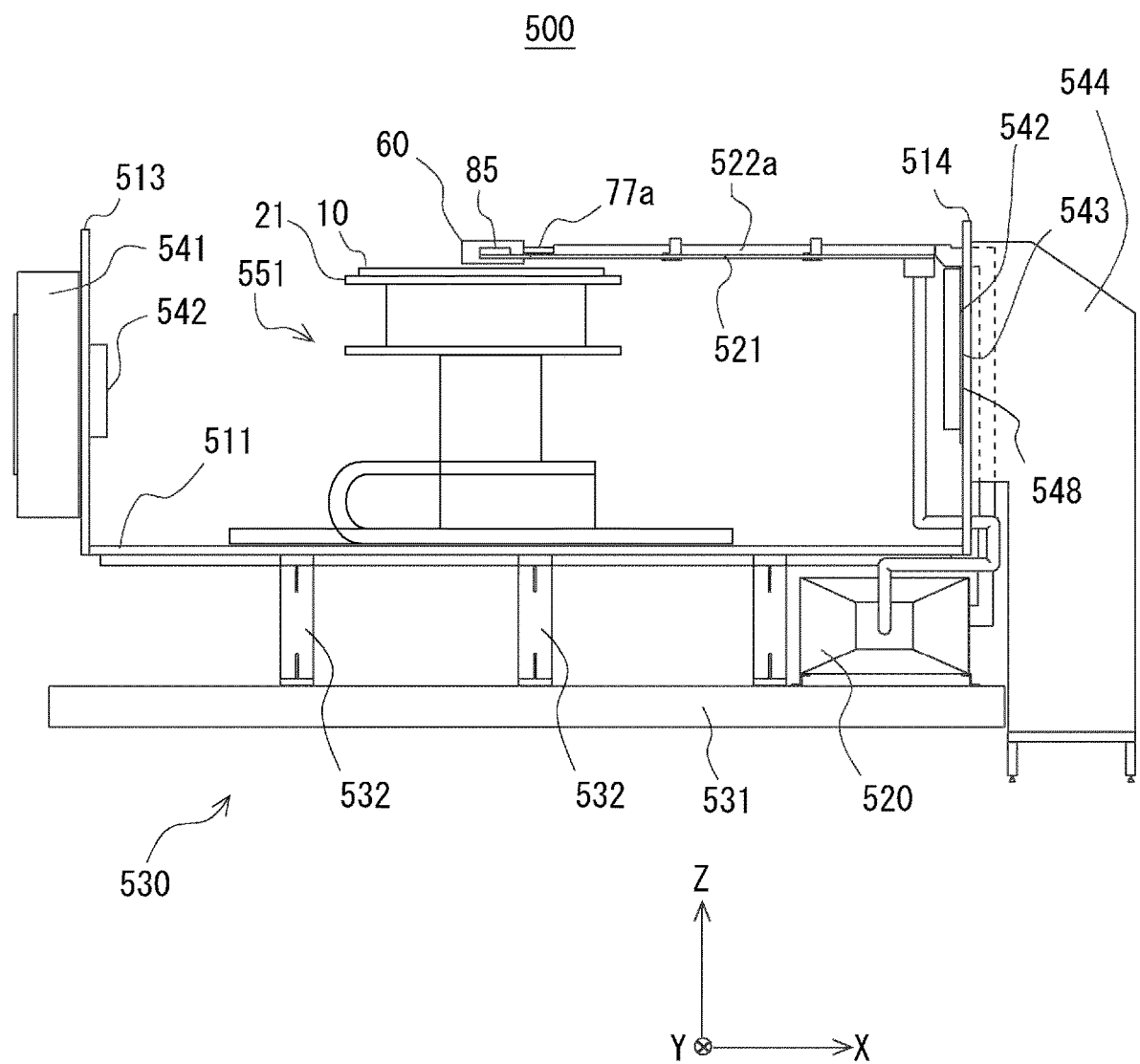
FIG. 22 is a side view for explaining the laser lift-off apparatus according to the fifth embodiment.

Next, the fifth embodiment will be described. First, a configuration of a laser lift-off apparatus according to the fifth embodiment will be described. FIGS. 19 to 21 are perspective views for explaining the laser lift-off apparatus according to the fifth embodiment. FIG. 22 is a side view for explaining the laser lift-off apparatus according to the fifth embodiment. FIGS. 19 to 22 omit constituent members as appropriate to explain an internal structure.

As illustrated in FIGS. 19 to 22, a laser lift-off apparatus 500 according to the present embodiment differs from the laser lift-off apparatus described in the first to fourth embodiments in including a chamber 510. One of dust collecting units 23, 60, 90, 100 and 110 described in the first to fourth embodiments is disposed inside the chamber 510. Furthermore, a workpiece 10 disposed over a stage 21 is also disposed inside the chamber 510.

The present embodiment will describe that the dust collecting unit 60 among the dust collecting units according to the first to fourth embodiments is disposed inside the chamber 510. In addition, another dust collecting unit may be used instead of the dust collecting unit 60. An XYZ orthogonal coordinate system applied to the dust collecting unit 60 is introduced to describe the laser lift-off apparatus 500. Hence, a conveying direction of the workpiece 10 is an X axis direction.

<Configuration of Chamber>

The chamber 510 has an outer shape of a rectangular parallelepiped shape, for example, and has a space at an inside surrounded by a chamber wall. The chamber 510 is supported by a support base 530 from below. The support base 530 includes a base 531 and a plurality of support columns 532. The base 531 is a member of a flat shape disposed flatly over a floor surface, and supports the weight of the chamber 510. A plurality of support columns 532 provided to extend upward from the base 531 support the chamber 510.

The chamber 510 is formed in, for example, a rectangular parallelepiped shape by bottom surface wall 511 and an upper surface wall 512, a front surface wall 513 and a rear surface wall 514, and side surface walls 515 and 516. The bottom surface wall 511 and the upper surface wall 512 face each other in a Z axis direction, i.e., upper and lower directions. The front surface wall 513 and the rear surface wall 514 face each other in an X axis direction, i.e., the conveying direction of the workpiece 10. The side surface walls 515 and 516 face each other in a Y axis direction. In addition, the shape of the chamber 510 is not limited to the rectangular parallelepiped shape.

The bottom surface wall 511 has a rectangular flat shape which has, for example, long sides along the X axis direction and has short sides along the Y axis direction when seen from above. The bottom surface wall 511 is disposed on a −Z axis direction side of the upper surface wall 512. The bottom surface wall 511 is supported by a plurality of support columns 532 with a plate surface kept horizontally.

The front surface wall 513 has a rectangular flat shape which has, for example, long sides along the Y axis direction and short sides along the Z axis direction when seen from the X axis direction. The front surface wall 513 is disposed on the −X axis direction side of the rear surface wall 514, and faces the rear surface wall 514. Hence, when the front surface wall 513 is one wall, the rear surface wall 514 is the other wall which faces the one wall. Furthermore, the front surface wall 513 is perpendicular to the conveying direction. The front surface wall 513 is provided with a feeding fan 541 and filters 542. Hence, the front surface wall 513 forms an FFU (Fan Filter Unit) in which the feeding fan 541 and the filters 542 are assembled.

The feeding fan 541 is disposed at, for example, a center portion in the Y axis direction of the front surface wall 513. The feeding fan 541 feeds a gas from an outside of the chamber 510 to an inside of the chamber 510. The gas is, for example, air. In addition, the gas (also referred to as a feed gas) fed from the outside to the inside of the chamber 510 is not limited to air, and may be an inert gas such as nitrogen. The gas taken in the chamber 510 will be described as air in the following description. The feeding fan 541 blows the air taken into the chamber 510 to a +X axis direction. For example, the one feeding fan 541 feeds air of a flow amount of 500 to 1500 L/min.

For example, one or a plurality of filters 542 are provided to the front surface wall 513. For example, the two filters 542 in total are provided one by one on both sides of the feeding fan 541 in the Y axis direction of the front surface wall 513 to sandwich the feeding fan 541. Hence, the feeding fan 541 is disposed between the filters 542 disposed apart in the Y axis direction.

The rear surface wall 514 has a rectangular flat shape which has, for example, long sides along the Y axis direction and short sides along the Z axis direction when seen from the X axis direction. The rear surface wall 514 is provided with an exhaust duct exhaust port 543 and filters 542.

The exhaust duct exhaust port 543 is disposed at, for example, a center portion in the Y axis direction of the rear surface wall 514. The exhaust duct exhaust port 543 exhausts air from the inside of the chamber 510 to the outside of the chamber 510. The exhaust duct exhaust port 543 is connected with an exhaust duct 544 from the outside of the chamber 510. The air taken in the chamber 510 by the feeding fan 541 is exhausted to the exhaust duct 544 through the exhaust duct exhaust port 543. Hence, the exhaust duct exhaust port 543 is disposed together with the feeding fan 541 to form an air flow along the +X axis direction inside the chamber 510. The exhaust duct exhaust port 543 may be provided with an exhaust fan 548.

For example, one or a plurality of filters 542 are provided to the rear surface wall 514. For example, the two filters 542 in total are provided one by one on both sides of the exhaust duct exhaust port 543 in the Y axis direction of the rear surface wall 514 to sandwich the exhaust duct exhaust port 543. Hence, the exhaust duct exhaust port 543 is disposed between the filters 542 disposed apart in the Y axis direction. In this regard, the disposition number and disposition places of the filters 542 may be changed as appropriate, and, for example, the number of filters 542 provided to the rear surface wall 514 may be changed according to the shape of the rear surface wall 514.

The side surface walls 515 and 516 have rectangular flat shapes which have, for example, long sides along the X axis direction and short sides along the Z axis direction when seen from the Y axis direction. The side surface wall 515 is disposed on a −Y axis direction side of the side surface wall 516. A workpiece loading/unloading port 515*a* through which the workpiece 10 can be loaded and unloaded is formed in the side surface wall 515. The workpiece loading/unloading port 515*a* is sealed during laser irradiation.

The upper surface wall 512 has the rectangular flat shape which has, for example, long sides along the X axis direction and short sides along the Y axis direction when seen from above. An opening 545 is formed in the upper surface wall 512. The opening 545 continues to an optical path space 70 of the dust collecting unit 60. When an optical system 20 is disposed over the upper surface wall 512, laser light 16 enters the inside of the dust collecting unit 60 through the opening 545 (see FIG. 11). Thus, the laser light 16 passes the optical path space 70 and irradiate the workpiece 10.

<Members Inside Chamber>

The stage 21 and the dust collecting unit 60 are disposed inside the chamber 510. The stage 21 is disposed over a scanning device 551 disposed over the bottom surface wall 511. The workpiece 10 is disposed over the stage 21. The workpiece 10 disposed over the stage 21 is disposed over the scanning device 551, and consequently is movable in the X axis direction, the Y axis direction and the Z axis direction.

Figures 23, 24:
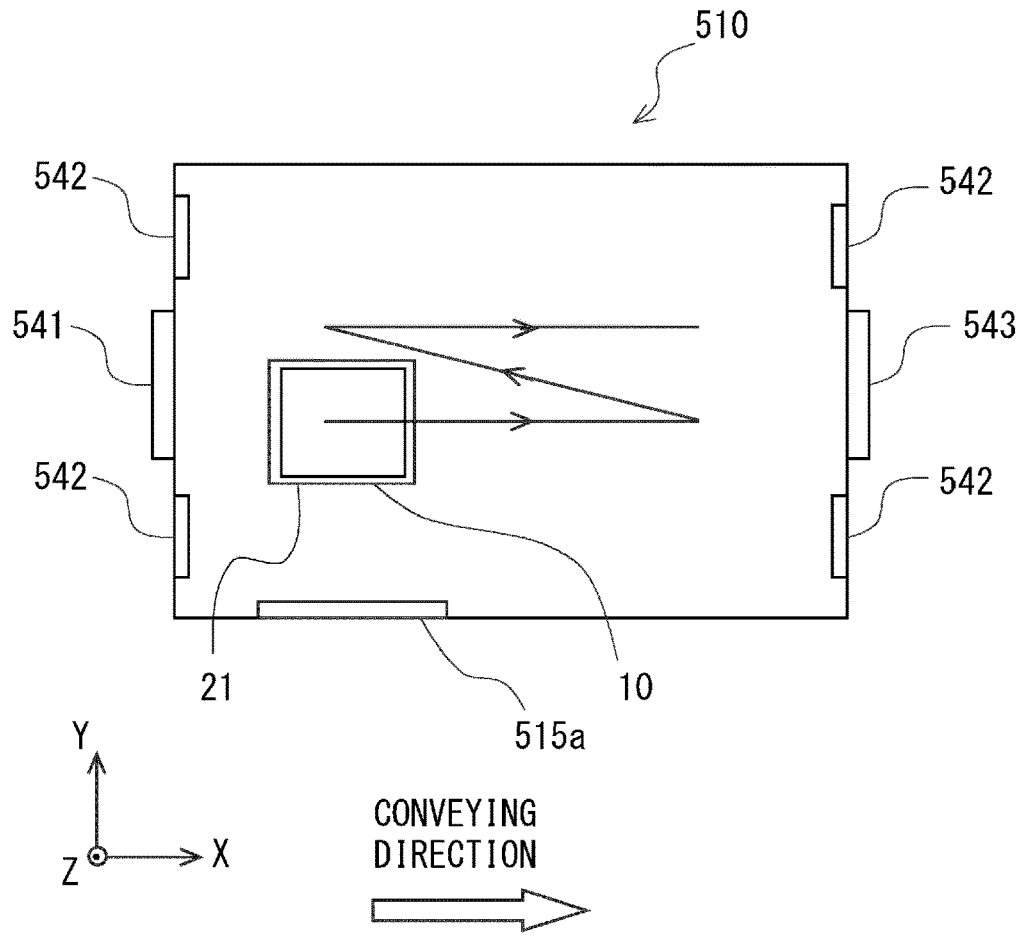
FIG. 23 is a view illustrating movement of the workpiece inside the chamber of the laser lift-off apparatus according to the fifth embodiment.
FIG. 24 is a view illustrating a relationship between whether or not there are the filters in the front surface wall and the rear surface wall, and arrival of air at a side of the front surface wall inside the chamber and an upper side of the stage in the laser lift-off apparatus according to the fifth embodiment.

FIG. 23 is a view illustrating movement of the workpiece 10 inside the chamber 510 of the laser lift-off apparatus 500 according to the fifth embodiment. As illustrated in FIG. 23, the workpiece 10 disposed over the stage 21 moves from, for example, the vicinity of the workpiece loading/unloading port 515*a* along the X axis which is the conveying direction. In this case, the workpiece 10 is irradiated with laser light. Irradiating the workpiece 10 with laser light while moving the workpiece 10 in the conveying direction is also referred to as scan. The workpiece 10 may be scanned once, then be shifted in the +Y axis direction, then be returned to a scan start position and be scanned again.

As illustrated in FIGS. 20 to 22, the dust collecting unit 60 is disposed below the upper surface wall 512, for example. The dust collecting unit 60 is disposed such that the optical path space 70 of the dust collecting unit 60 is disposed right below the opening 545 of the upper surface wall 512. The dust collecting unit 60 is provided with a feeding port 85. For example, the feeding port 85 is formed on the −Y axis direction side of the dust collecting unit 60. The feeding port 85 is connected with a feeding pipe 521. The feeding pipe 521 extends from the feeding port 85 to the −Y axis direction, is bent and extends to the +X axis direction. The feeding pipe 521 extends to a front of the rear surface wall 514 in the +X axis direction, and is bent downward at the front of the rear surface wall 514. Furthermore, the feeding pipe 521 protrudes to the outside of the chamber 510 at a lower portion of the rear surface wall 514. The feeding pipe 521 is connected to a dust collecting unit feeding/exhaust fan 520 disposed below the chamber 510 outside the chamber 510.

The dust collecting unit 60 is provided with exhaust ports 77*a* and 77*b*. For example, the two exhaust ports 77*a* and 77*b* are formed on the +X axis direction side of the dust collecting unit 60. The exhaust ports 77*a* and 77*b* are connected with exhaust pipes 522*a* and 522*b*. The exhaust pipes 522*a* and 522*b* extend from the exhaust ports 77*a* and 77*b* to the +X axis direction, join at the front of the rear surface wall 514, and protrude from the rear surface wall 514 to the outside of the chamber 510. The exhaust pipe 77 is connected to the dust collecting unit feeding/exhaust fan 520 outside the chamber 510.

The dust collecting unit feeding/exhaust fan 520 is disposed below the chamber 510. The dust collecting unit feeding/exhaust fan 520 is connected with the feeding pipe 521. The dust collecting unit feeding/exhaust fan 520 feeds the gas from feeding spaces 71 and 72 of the dust collecting unit 60 to the optical path space 70 via the feeding pipe 521. Furthermore, the dust collecting unit feeding/exhaust fan 520 is connected with the exhaust pipe 522. The dust collecting unit feeding/exhaust fan 520 exhausts exhaust spaces 73 and 74 of the dust collecting unit 60 via the exhaust pipe 522. Thus, the gas sucked by the dust collecting unit 60 is exhausted to the outside of the chamber 510. For example, the dust collecting unit feeding/exhaust fan 520 feeds and exhausts air of a flow amount of 500 L/min to 1500 L/min.

<Air Flow Inside Chamber>

Next, the air flow inside the chamber 510 will be described.

FIG. 24 is a view illustrating a relationship between whether or not there are the filters 542 in the front surface wall 513 and the rear surface wall, and arrival of air at a side of the front surface wall 513 inside the chamber 510 and an upper side of the stage 21 in the laser lift-off apparatus 500 according to the fifth embodiment.

Figure 25A:
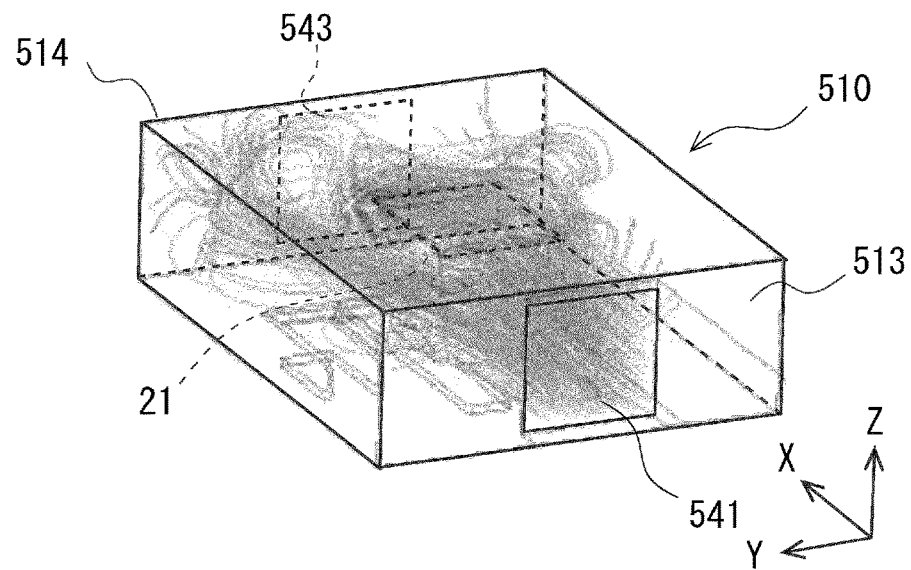
FIG. 25A is a perspective view illustrating an air flow inside the chamber in a case where the feeding fan is installed in the front surface wall of the chamber, and the exhaust duct exhaust port is installed in the rear surface wall in the laser lift-off apparatus according to the fifth embodiment.
Figure 25B:
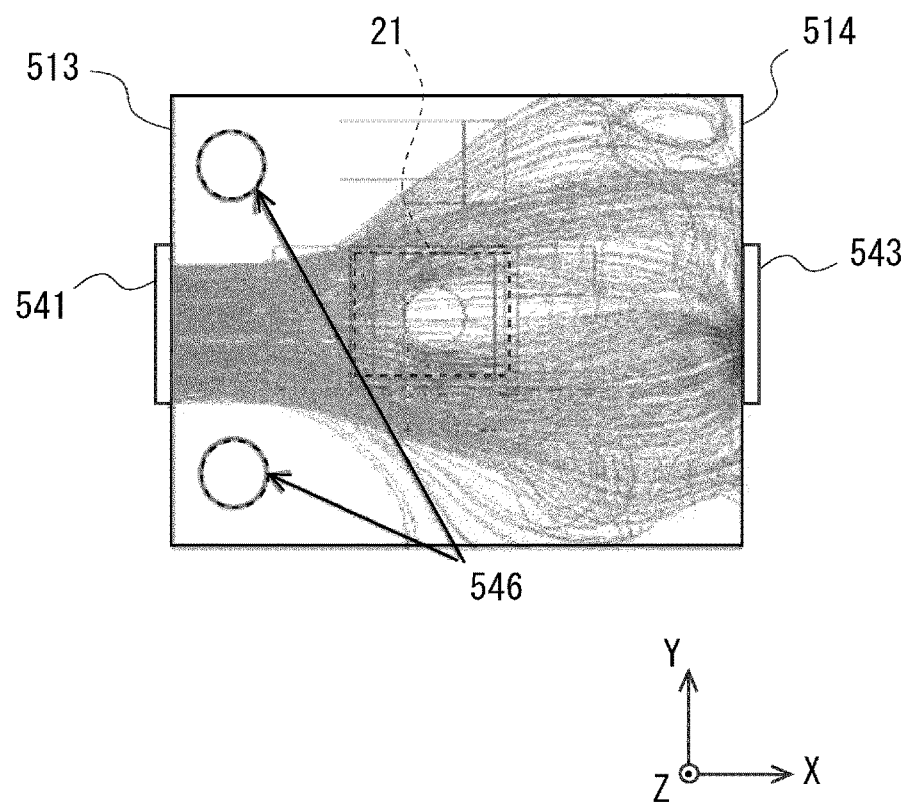
FIG. 25B is a top view illustrating an air flow inside the chamber in a case where the feeding fan is installed in the front surface wall of the chamber, and the exhaust duct exhaust port is installed in the rear surface wall in the laser lift-off apparatus according to the fifth embodiment.

FIGS. 25A and 25B are views illustrating an air flow inside the chamber 510 in a case where the feeding fan 541 is installed in the front surface wall 513 of the chamber 510, and the exhaust duct exhaust port 543 is installed in the rear surface wall 514 in the laser lift-off apparatus 500 according to the fifth embodiment. FIG. 25A illustrates a perspective view. FIG. 25B illustrates a top view.

A column A in FIG. 24 indicates a case of the chamber 510 illustrated in FIGS. 25A and 25B. When the feeding fan 541 is installed in the front surface wall 513 of the chamber 510 and the exhaust duct exhaust port 543 is installed in the rear surface wall 514 as illustrated in FIGS. 24, 25A and 25B, the air taken in the chamber 510 from the feeding fan 541 flows in the +X axis direction, and expands in the Y axis direction and the Z axis direction when coming close to the rear surface wall 514.

On the other hand, there is a portion at which the air does not arrive over the side of the front surface wall 513 inside the chamber 510. For example, the air does not arrive at end portions 546 on the +Y axis direction side and the −Y axis direction side over the side of the front surface wall 513. So-called fresh air in particular immediately after being taken in the chamber 510 does not arrive. When there is the portion at which the air does not arrive inside the chamber 510 in this away, particles deposit and form a drift, and therefore the inside of the chamber 510 cannot be kept clean. An arrival time taken by the fresh air to arrive at the stage 21 is 10 seconds.

Figure 26A:
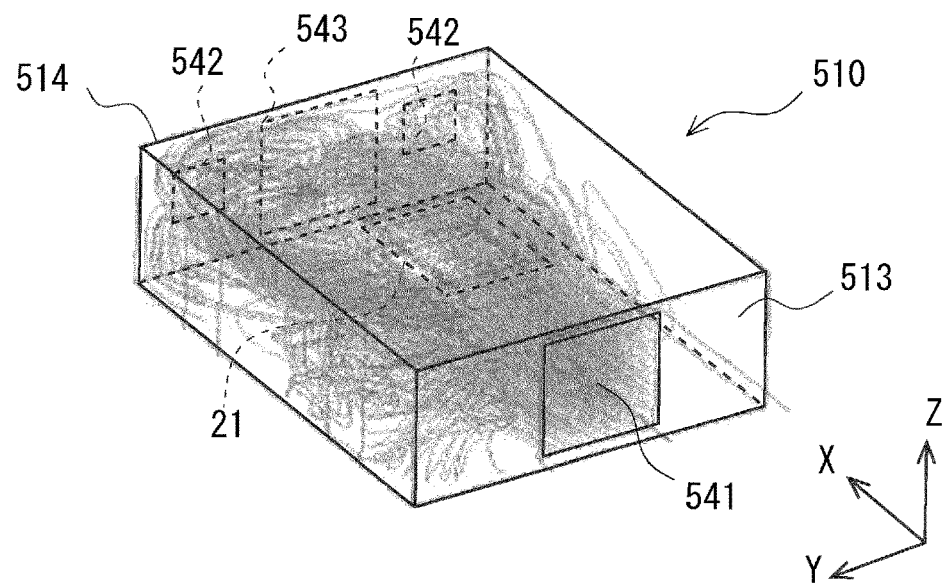
FIG. 26A is a perspective view illustrating an air flow inside the chamber in a case where the feeding fan is installed in the front surface wall of the chamber, and the exhaust duct exhaust port and the filters are installed in the rear surface wall in the laser lift-off apparatus according to the fifth embodiment.
Figure 26B:
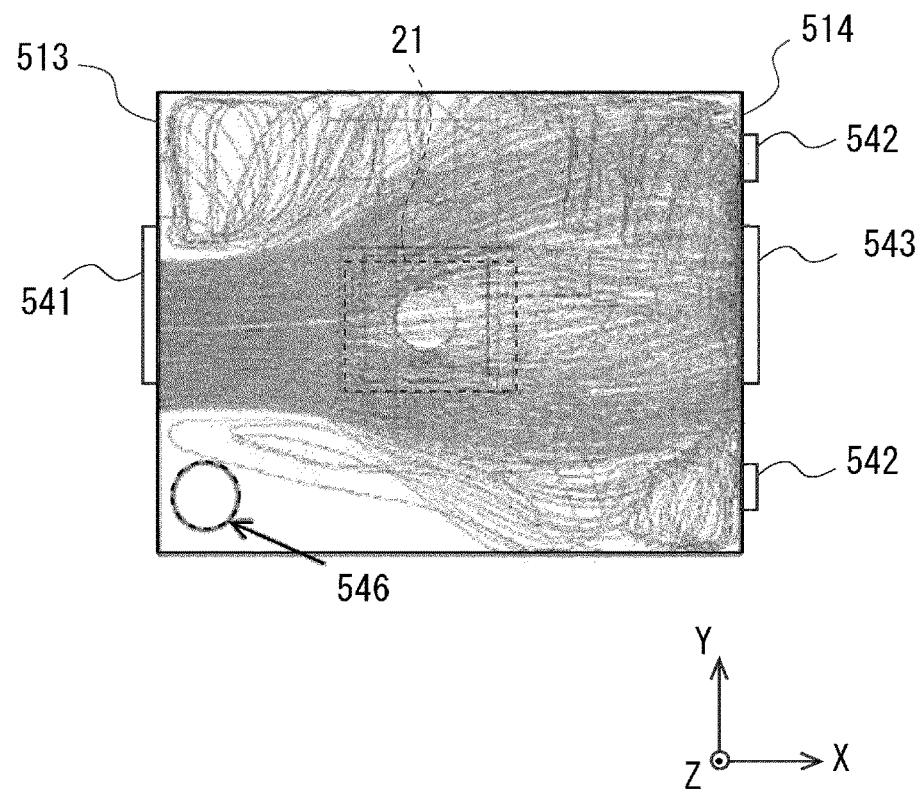
FIG. 26B is a top view illustrating an air flow inside the chamber in a case where the feeding fan is installed in the front surface wall of the chamber, and the exhaust duct exhaust port and the filters are installed in the rear surface wall in the laser lift-off apparatus according to the fifth embodiment.

FIGS. 26A and 26B are views illustrating an air flow inside the chamber 510 in a case where the feeding fan 541 is installed in the front surface wall 513 of the chamber 510, and the exhaust duct exhaust port 543 and the filters 542 are installed in the rear surface wall 514 in the laser lift-off apparatus 500 according to the fifth embodiment. FIG. 26A illustrates a perspective view. FIG. 26B illustrates a top view.

A column B in FIG. 24 indicates a case of the chamber 510 illustrated in FIGS. 25A and 25B. When the feeding fan 541 is installed in the front surface wall 513 of the chamber 510 and the exhaust duct exhaust port 543 and the filters 542 are installed in the rear surface wall 514 as illustrated in FIGS. 24, 26A and 26B, the air taken in the chamber 510 from the feeding fan 541 flows in the +X axis direction, and expands in the Y axis direction and the Z axis direction when coming close to the rear surface wall 514.

Furthermore, the air arrives on the side of the front surface wall 513 inside the chamber 510, too. For example, the air arrives at the end portions 546 on the +Y axis direction side and the −Y axis direction side on the side of the front surface wall 513 even though the air is not as much as air which arrives at the rear surface wall 514. Consequently, the inside of the chamber 510 can be kept clean. The arrival time taken by the fresh air to arrive at the stage 21 is 50 seconds.

Figure 27A:
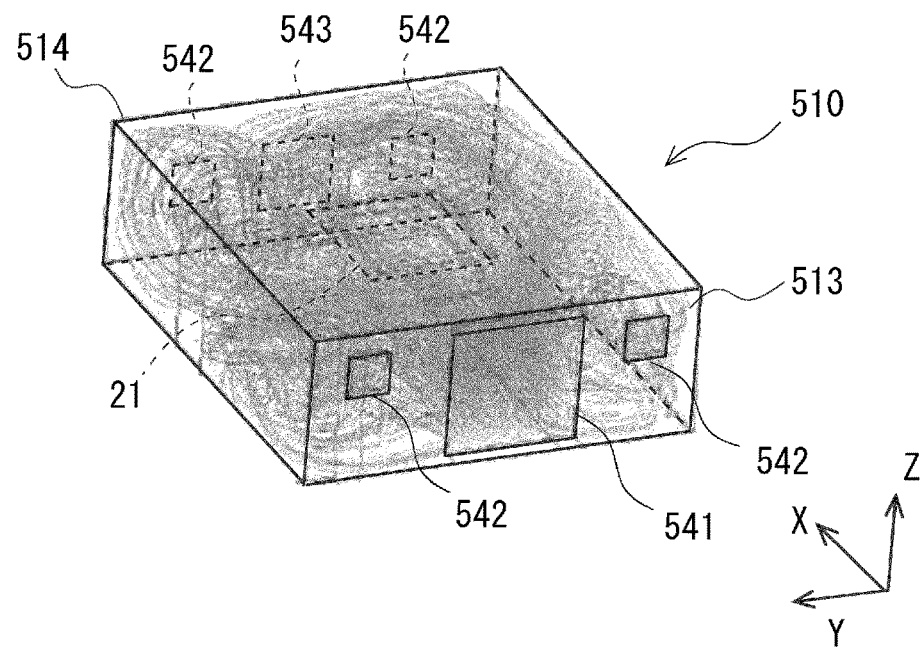
FIG. 27A is a perspective view illustrating an air flow inside the chamber in a case where the feeding fan and the filters are installed in the front surface wall of the chamber, and the exhaust duct exhaust port and the filters are installed in the rear surface wall in the laser lift-off apparatus according to the fifth embodiment.
Figure 27B:
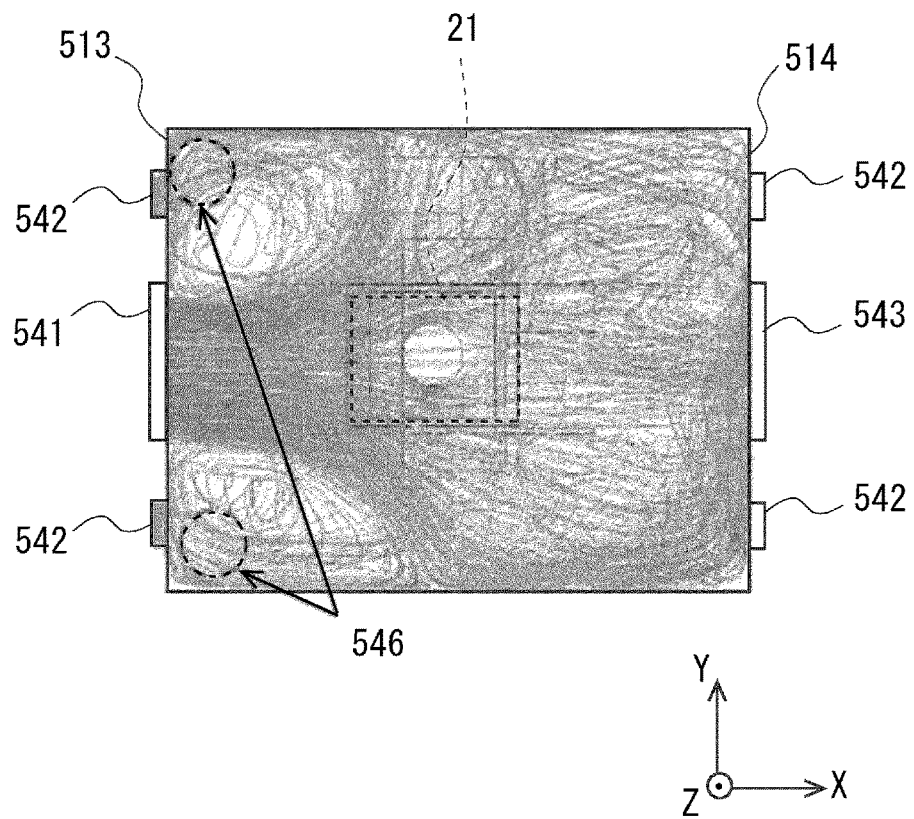
FIG. 27B is a top view illustrating an air flow inside the chamber in a case where the feeding fan and the filters are installed in the front surface wall of the chamber, and the exhaust duct exhaust port and the filters are installed in the rear surface wall in the laser lift-off apparatus according to the fifth embodiment.

FIGS. 27A and 27B are views illustrating an air flow inside the chamber 510 in a case where the feeding fan 541 and the filters 542 are installed in the front surface wall 513 of the chamber 510, and the exhaust duct exhaust port 543 and the filters 542 are installed in the rear surface wall 514 in the laser lift-off apparatus 500 according to the fifth embodiment. FIG. 27A illustrates a perspective view. FIG. 27B illustrates a top view.

A column C in FIG. 24 indicates a case of the chamber 510 illustrated in FIGS. 27A and 27B. When the feeding fan 541 and the filters 542 are installed in the front surface wall 513 of the chamber 510 and the exhaust duct exhaust port 543 and the filters 542 are installed in the rear surface wall 514 as illustrated in FIGS. 24, 27A and 27B, the air taken in the chamber 510 from the feeding fan 541 flows in the +X axis direction, and expands in the Y axis direction and the Z axis direction when coming close to the rear surface wall 514.

Furthermore, the air arrives on the side of the front surface wall 513 inside the chamber 510, too. For example, more air arrives at the end portions 546 on the +Y axis direction side and the −Y axis direction side on the side of the front surface wall 513 than that in FIGS. 26A and 26B. Consequently, the inside of the chamber 510 can be sufficiently kept clean. The arrival time taken by the fresh air to arrive at the stage 21 is 36 seconds. Hence, more fresh air than that in FIGS. 26A and 26B arrives at the stage 21.

Thus, according to the present embodiment, by forming a laminar flow in the space inside the chamber 510, it is possible to prevent dusts produced from the inside of the chamber 510 from arriving at an irradiation region of the laser light 16. Furthermore, the rear surface wall 514 is provided with the filters 542, so that it is possible to prevent formation of a drift over the side of the front surface wall 513 inside the chamber 510. Furthermore, the front surface wall 513 is also provided with the filters 542, so that it is possible to prevent formation of the drift over the side of the front surface wall 513 inside the chamber 510, and shorten the arrival time taken by the fresh air to arrive at the stage 21. Consequently, it is possible to blow away the dusts existing on the surface of the workpiece 10, and uniformly separate a separating layer from a substrate.

The filters 542 allow air to pass. The filters 542 may allow air to pass from the outside to the inside of the chamber 510, or may allow the air to pass from the inside to the outside of the chamber 510. When, for example, the vicinities of the filters 542 inside the chamber 510 are depressurized, the filters 542 allow the air to pass from the outside to the inside of the chamber 510. By contrast with this, when the pressure of air near the filters 542 inside the chamber 510 increases, the filters 542 allow the air to pass from the inside to the outside of the chamber 510. Thus, the filters 542 keep a balance between the pressure inside the chamber 510 and the pressure outside the chamber 510. In a case of an atmospheric pressure outside the chamber 510, the filters 542 keep the balance between the pressure inside the chamber 510 and the atmospheric pressure outside the chamber 510.

Figure 28:
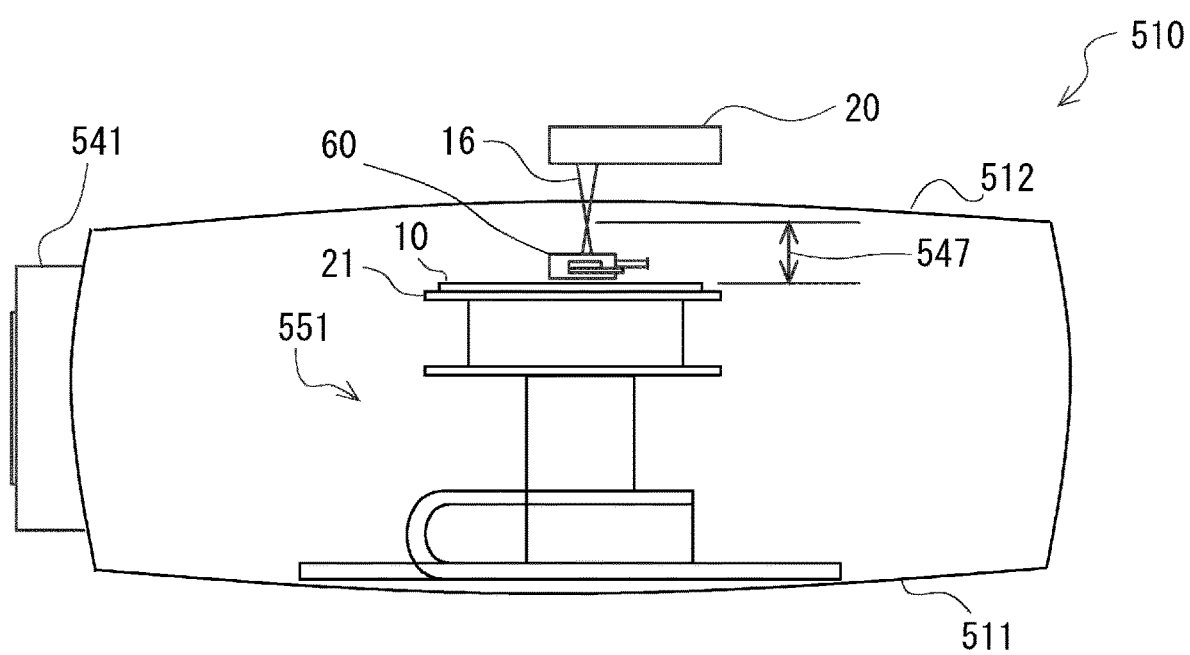
FIG. 28 is a cross-sectional view illustrating the chamber when the pressure inside the chamber is higher than an external pressure.

FIG. 28 is a cross-sectional view illustrating the chamber 510 when the pressure inside the chamber 510 is higher than an external pressure. When the pressure inside the chamber 510 is higher than the pressure outside the chamber 510 as illustrated in FIG. 28, the chamber wall of the chamber 510 swells outward. Then, for example, a center portion of the bottom surface wall 511 at which the bottom surface of the scanning device 551 is disposed is recessed downward. Consequently, when the workpiece 10 is irradiated with the laser light 16 via the dust collecting unit 60, the focus of the laser light 16 becomes a defocus 547. Therefore, the laser light 16 cannot be focused on the workpiece 10. By contrast with this, when the inside of the chamber 510 is depressurized, too, the focus of the laser light 16 becomes the defocus 547 due to deformation of the chamber wall.

By contrast with this, in the present embodiment, the chamber 510 is provided with the filters 542. The filters 542 allow air inside the chamber 510 to pass to the outside when the pressure inside the chamber 510 is high. The filters 542 allow air outside the chamber 510 to pass to the inside when the pressure inside the chamber 510 is low. Thus, the filter 542 can keep the balance with the pressure outside the chamber 510.

In the laser lift-off apparatus 500 according to the present embodiment, a feeding amount for feeding to the chamber 510 is 500 to 1500 L/min. This feeding amount is a larger flow amount than 50 cc/min to 5 L/min which is the flow amount of an excimer laser annealing apparatus (ELA) exemplified as a similar apparatus. In the present embodiment, the filters 542 are provided, so that it is possible to prevent an increase in the internal pressure even when air of a large flow amount is fed, and maintain capability of the laser lift-off apparatus 500.

<Feeding/Exhaust Amount of Dust Collecting Unit>

Figure 29:
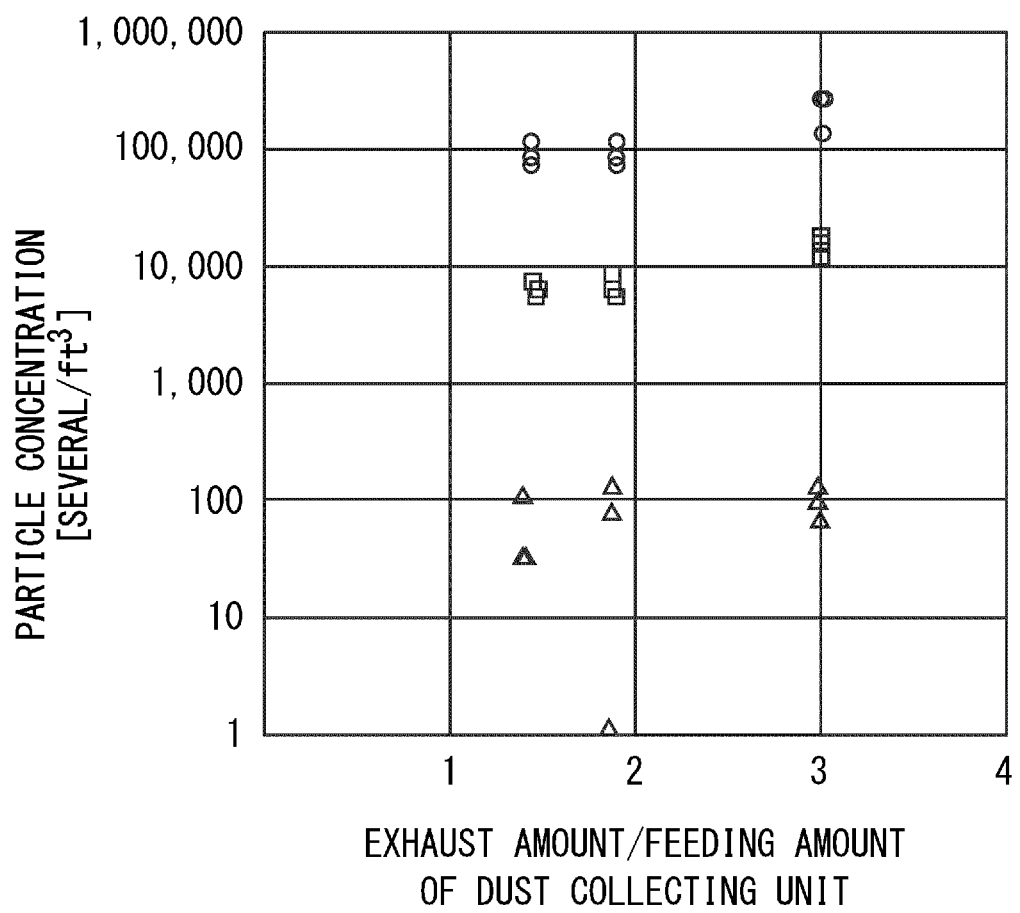
FIG. 29 is a graph illustrating a ratio of the exhaust amount with respect to the feeding amount, and a particle concentration in the exhaust pipe in the laser lift-off apparatus according to the fifth embodiment.

Next, the feeding amount to the dust collecting unit 60 and the exhaust amount from the dust collecting unit 60 will be described. FIG. 29 is a graph illustrating a ratio of the exhaust amount with respect to the feeding amount, and a particle concentration in the exhaust pipe 522 in the laser lift-off apparatus 500 according to the fifth embodiment. The particle concentration indicates a particle (referred to as a low particle below) concentration whose particle diameter is 0.3 to 1.0 μm (indicated by circles in the graph), a particle (referred to as a middle particle below) concentration whose particle diameter is 1.0 to 10 μm (indicated by squares in the graph), and a particle (referred to as a high particle below) concentration whose particle diameter is 10 μm or more (indicated by triangles in the graph).

The particle concentration is obtained by a particle counter by measuring each particle in the exhaust pipes 522a and 522b at fixed intervals during laser irradiation. The higher particle concentration indicates more particles to be taken in the exhaust pipes 522a and 522b, and indicates that the particle concentration remaining on the workpiece 10 is low.

When the exhaust amount/feeding amount ratio of the exhaust amount with respect to the feeding amount of the dust collecting unit 60 is 1.4 as illustrated in FIG. 29, the low particle concentration in exhaust pipes 722a and 722b indicates approximately 100,000/ft$^3$, the middle particle concentration indicates approximately 7,000/ft$^3$, and the high particle concentration indicates approximately 30 to 100/ft$^3$. When the exhaust amount/feeding amount ratio is 1.8, the low particle concentration in exhaust pipes 722a and 722b indicates approximately 100,000/ft$^3$, the middle particle concentration indicates approximately 7,000/ft$^3$, and the high particle concentration indicates approximately 100/ft$^3$. Thus, when the exhaust amount/feeding amount ratio is 1.4 to 1.8, the particle concentration in the exhaust pipes 722a and 722b hardly changes.

On the other hand, when the exhaust amount/feeding amount ratio of the dust collecting unit 60 is 3.0, the low particle concentration in the exhaust pipes 722a and 722b indicates approximately 300,000/ft$^3$, the middle particle concentration indicates approximately 20,000/ft$^3$, and the high particle concentration indicates approximately 100/ft$^3$. Thus, when the exhaust amount/feeding amount ratio is 3.0, the particle concentration in the exhaust pipes 722a and 722b increases. This means that, by making the exhaust amount/feeding amount ratio three times or more, the pressures in the exhaust spaces 73 and 74 can be further reduced, and the amount of dusts flowing in together with the gas increases.

Thus, by making the ratio of the exhaust amount of the gas exhausted from the exhaust spaces with respect to the feeding amount of the gas supplied to the optical path space three or more, it is possible to prevent the dusts from going out of the dust collecting unit 60 and uniformly separate the separating layer from the substrate. In addition, although not illustrated, when the exhaust amount/feeding amount ratio is higher than three, the number of particles is approximately the same as three or larger than three.

<Relationship Between Feeding Amount/Exhaust Amount of Dust Collecting Unit and Air Flow in Chamber, and Particles>

In the present embodiment, an air flow inside the chamber 510, and feeding and exhaust routes of the dust collecting unit 60 are different routes. In the present embodiment, the air flow inside the chamber 510 is controlled by the feeding fan 541 and the filter 542 (FFU), and the feeding amount and the exhaust amount of the dust collecting unit 60 are controlled by the dust collecting unit feeding/exhaust fan 520.

Figure 30:
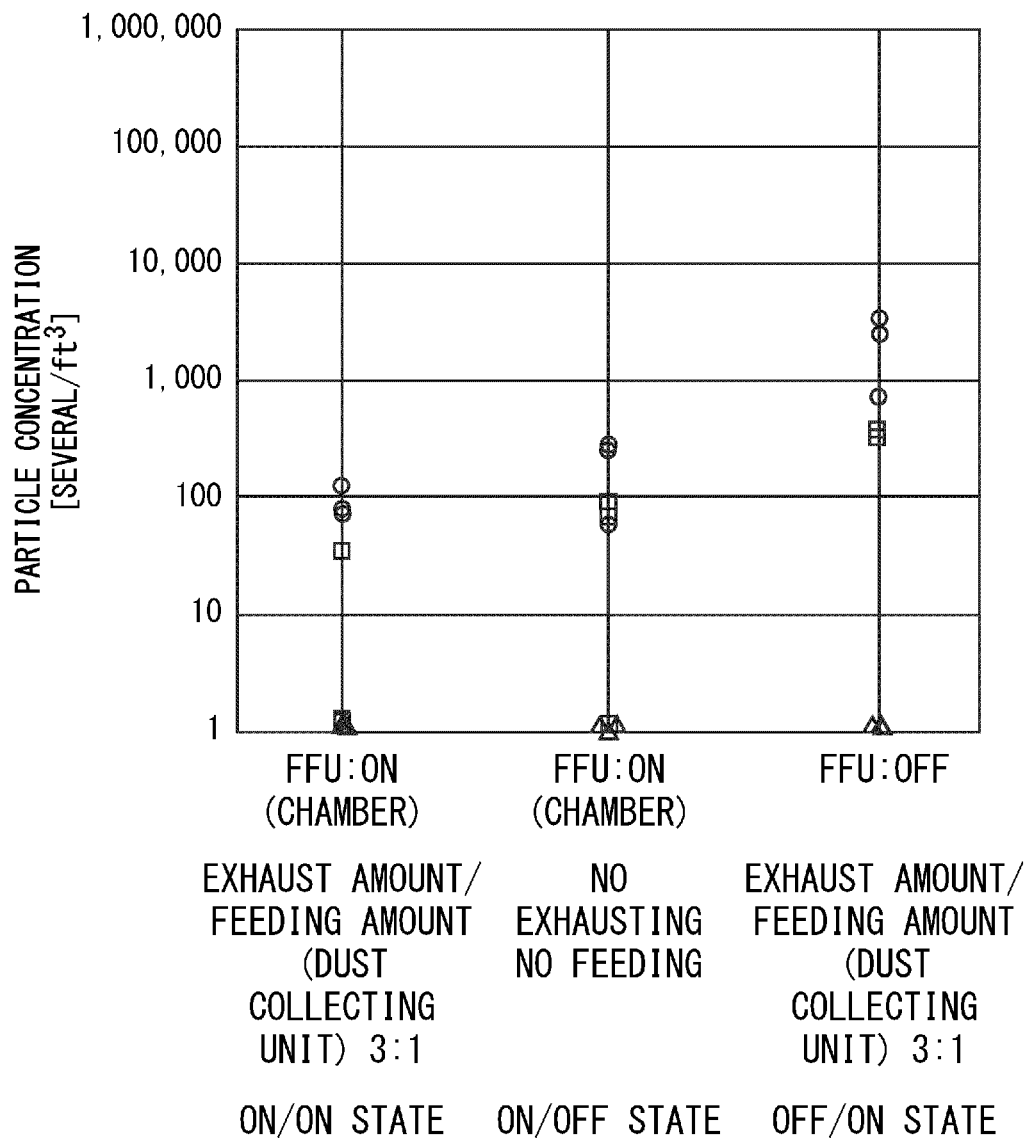
FIG. 30 is a graph illustrating a relationship between activation of the FFU according to the fifth embodiment and an exhaust amount/feeding amount ratio of the dust collecting unit, and a particle concentration.

FIG. 30 is a graph illustrating a relationship between activation of the FFU according to the fifth embodiment and an exhaust amount/feeding amount ratio of the dust collecting unit 60, and a particle concentration. The particle concentration is a value obtained by measuring the particle concentration near a duct collector by a particle counter.

As illustrated in FIG. 30, when the FFU of the chamber 510 is activated and the exhaust amount/feeding amount ratio of the dust collecting unit 60 is 3:1 (referred to as an ON/ON state below), a high particle concentration is a measurement limit or less, a middle particle concentration indicates approximately 40/ft$^3$, and a low particle concentration indicates approximately 100/ft$^3$. When the FFU of the chamber 510 is activated and the dust collecting unit 60 is not allowed to perform feeding or exhausting (referred to as an ON/OFF state below), the high particle concentration is the measurement limit or less, the middle particle concentration indicates approximately 70/ft$^3$, and the low particle concentration indicates approximately 300/ft$^3$. When the FFU of the chamber 510 is stopped and the exhaust amount/feeding amount ratio of the dust collecting unit 60 is 3:1 (referred to as an OFF/ON state below), the high particle concentration is the measurement limit or less, the middle particle concentration indicates approximately 400/ft$^3$, and the low particle concentration indicates approximately 2000/ft$^3$.

Thus, by making an ON/ON state, it is possible to suppress particles. By contrast with this, in a case of the OFF/ON state, the particle concentration becomes remarkably high. In addition, it is possible to suppress the particle concentration even in the ON/OFF state compared to the OFF/ON state. However, compared to the ON/ON state, the particle concentration becomes higher.

<Control of Chamber and Dust Collecting Unit>

Figure 31:
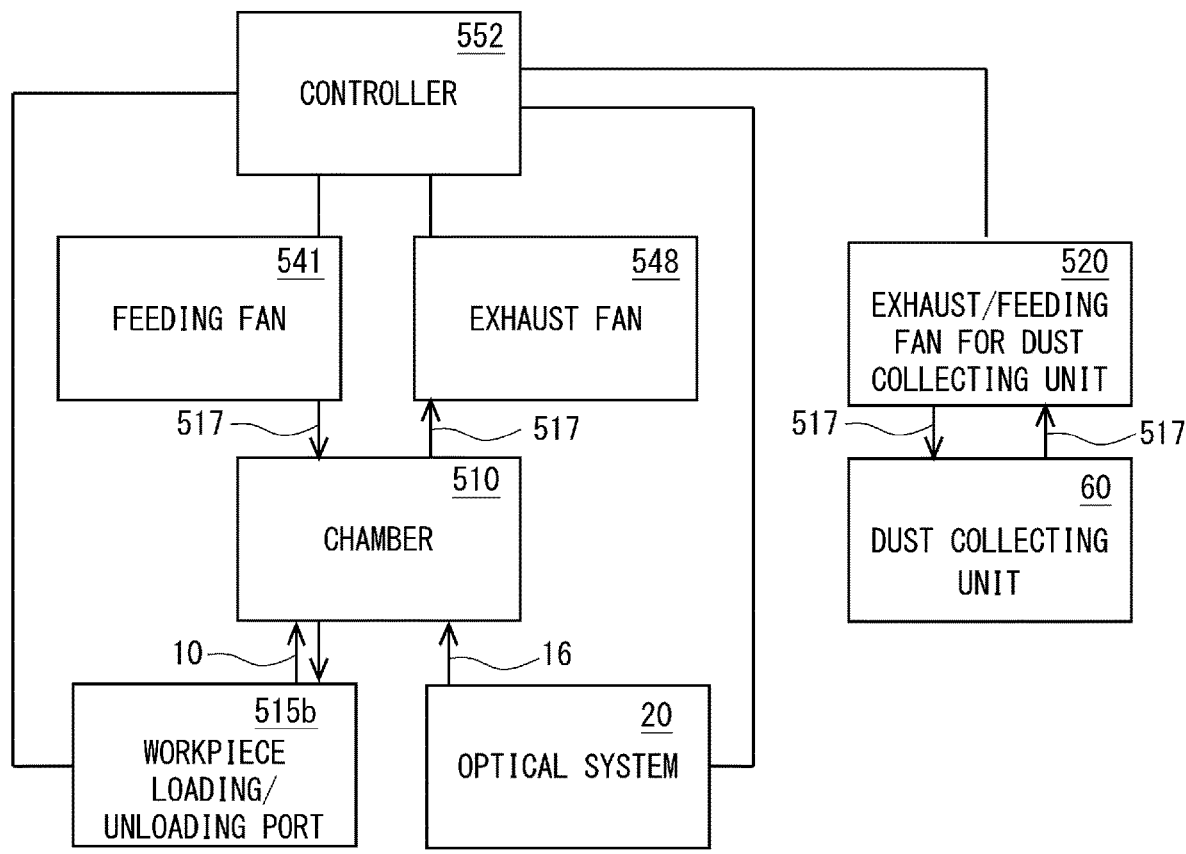
FIG. 31 is a block diagram illustrating a method for controlling the activation of the FFU according to the fifth embodiment, and feeding and exhausting of the dust collecting unit.

Next, control of activation of the FFU of the chamber 510 and feeding and exhausting of the dust collecting unit 60 will be described. FIG. 31 is a block diagram illustrating a method for controlling the activation of the FFU according to the fifth embodiment, and feeding and exhausting of the dust collecting unit 60.

As illustrated in FIG. 31, the laser lift-off apparatus 500 according to the present embodiment includes a controller 552 which controls the activation of the FFU and feeding and exhausting of the dust collecting unit 60. The controller 552 is connected with the feeding fan 541, the exhaust fan 548, a workpiece loading/unloading port 515b, the optical system 20 and the dust collecting unit feeding/exhaust fan 520 by information transmission means such as a signal line or a radio. In addition, the exhaust duct exhaust port 543 is provided with the exhaust fan 548.

The controller 552 controls activation and stop of the feeding fan 541 and a feeding amount of air 517. The controller 552 controls activation and stop of the exhaust fan 548 and the exhaust amount of the air 517. The controller 552 controls activation and stop of the dust collecting unit feeding/exhaust fan 520 and the feeding/exhaust amount of the air 517.

Furthermore, the controller 552 obtains information indicating that the workpiece 10 is loaded in and unloaded out of the workpiece loading/unloading port 515b. The controller 552 obtains information of laser irradiation from the optical system 20.

FIG. 32 is a view illustrating control of the controller 552 of the laser lift-off apparatus 500 according to the fifth embodiment. As illustrated in FIGS. 31 and 32, when obtaining the information indicating loading and unloading of the workpiece 10 from the workpiece loading/unloading port 515b, the controller 552 stops the dust collecting unit feeding/exhaust fan 520, and stops the feeding fan 541 of the chamber 510. Furthermore, the controller 552 decreases a rotational speed of the exhaust fan 548 of the chamber 510, and decreases the exhaust amount of the exhaust fan 548.

Furthermore, when obtaining the information of irradiation of the laser light 16 from the optical system 20, the controller 552 activates the dust collecting unit feeding/exhaust fan 520, and activates the feeding fan 541 and the exhaust fan 548 of the chamber 510.

Further, during, for example, idling other than loading and unloading of the workpiece and irradiation of the laser light 16, the controller 552 decreases the rotational speed of the dust collecting unit feeding/exhaust fan 520, decrease the rotational speeds of the feeding fan 541 and the exhaust fan 548 of the chamber 510 and decreases the feeding amount and the exhaust amount of the air 517.

Thus, the controller 552 controls the supply amount of a feed gas of the feeding fan 541 and the feeding amount and the exhaust amount of the dust collecting unit feeding/exhaust fan 520 based on loading and unloading of the workpiece 10 in and out of the chamber 10 and irradiation of the laser light 16.

Next, an operation of the laser lift-off apparatus 500 according to the fifth embodiment will be described.

As illustrated in FIG. 22, the workpiece 10 is disposed over the stage 21 disposed inside the chamber 510. For example, the workpiece 10 is inserted inside the chamber 510 through the workpiece loading/unloading port 515a formed in the side surface wall 515, and is disposed over the stage 21.

Next, the feeding fan 541 provided to the front surface wall 513 of the chamber 510 is activated. Thus, an air flow traveling toward a +X axis direction is formed in the chamber 510. Furthermore, the dust collecting unit feeding/exhaust fan 520 is activated. The feeding fan 541 and the dust collecting unit feeding/exhaust fan 520 are controlled by the controller 552.

Next, the workpiece over the stage 21 is scanned, and the workpiece 10 is irradiated with the laser light. Thus, the laser lift-off apparatus 500 separates the separating layer from the substrate of the workpiece 10.

Next, an effect of the present embodiment will be described.

According to the present embodiment, by forming the laminar flow in the space inside the side chamber 510, it is possible to prevent dusts produced from the inside of the chamber 510 from reaching an irradiation region of the laser light 16. Particularly, it is possible to remove from the vicinity of the workpiece 10 dusts produced from traveling rails of the stage 21 disposed inside the chamber 510, bearings assembled in the traveling rails, a cable, a cable bear (registered trademark) which supports the cable and a wiring pipe.

Furthermore, by providing the filters 542 to the chamber 510, it is possible to prevent formation of a drift on the side of the front surface wall 513 inside the chamber 510. Furthermore, it is possible to shorten an arrival time taken by fresh air to arrive at the stage 21. Consequently, it is possible to blow away the dusts existing on the surface of the workpiece 10 and uniformly separate the separating layer from the substrate. Furthermore, by providing the filters 542, it is possible to keep the balance with an external pressure of the chamber 510, and prevent the defocus of the laser light 16 due to deformation of the chamber 510.

By increasing the exhaust amount to the dust collecting unit 60 compared to the feeding amount, and making the pressures in the exhaust spaces 73 and 74 negative pressures, it is possible to prevent the dusts from going out of the dust collecting unit 60 even when the dusts float inside the dust collecting unit 60. Furthermore, by making the ratio of the exhaust amount with respect to the feeding amount three or more, it is possible to make this effect remarkable.

By disposing the workpiece 10 inside the chamber 510, the workpiece 10 is not exposed to outdoor air, so that it is possible to keep the surface of the workpiece 10 clean. The other effects are the same as those in the first to fourth embodiments, and therefore will not be described.

<Sixth Embodiment> (Chamber Equipment of Downflow)

Figure 33:
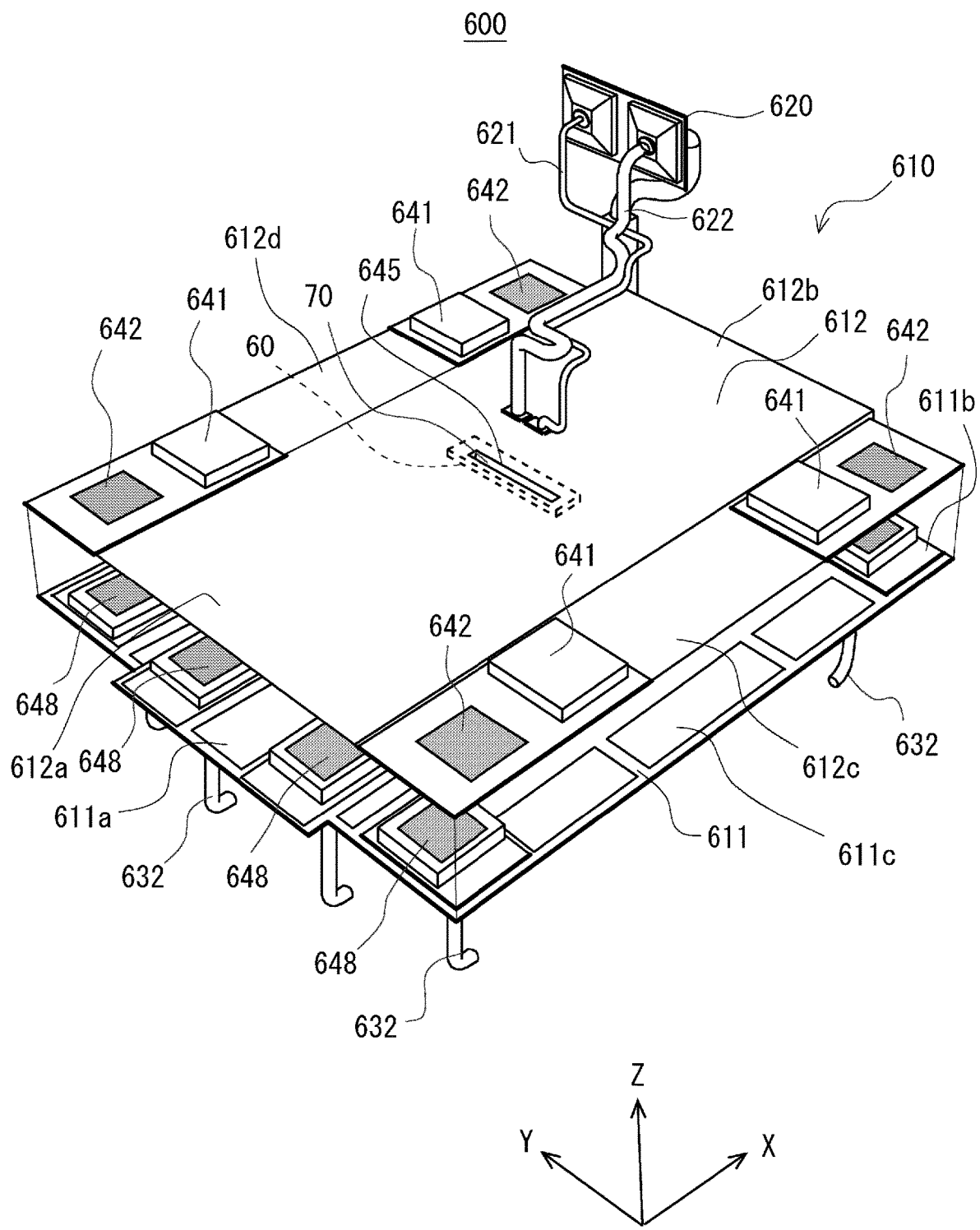
FIG. 33 is a perspective view for explaining the laser lift-off apparatus according to the sixth embodiment.

Next, the sixth embodiment will be described. First, a laser lift-off apparatus according to the sixth embodiment will be described. FIG. 33 is a perspective view for explaining the laser lift-off apparatus according to the sixth embodiment.

As illustrated in FIG. 33, a laser lift-off apparatus 600 according to the sixth embodiment differs from a chamber 510 of a laser lift-off apparatus 500 described in the fifth embodiment in positions at which a feeding fan 641, an exhaust fan 648 and filters 642 in a chamber 610 are provided. In the present embodiment, too, a dust collecting unit 60 is provided inside the chamber 610, and an XYZ orthogonal coordinate system applied to the dust collecting unit 60 is introduced. Therefore, a conveying direction of a workpiece 10 is an X axis direction.

<Configuration of Chamber>

The chamber 610 has, for example, an outer shape of a rectangular parallelepiped shape, and has a space at an inside surrounded by a chamber wall. The chamber 610 has, for example, the lengths in the X axis direction, a Y axis direction and a Z axis direction which are approximately 5.5 m, approximately 4.5 m and approximately 2 m. In addition, the chamber 510 according to the fifth embodiment is smaller than the chamber 610, for example. The chamber 610 is supported by a plurality of support columns 632 from below.

Figure 35:
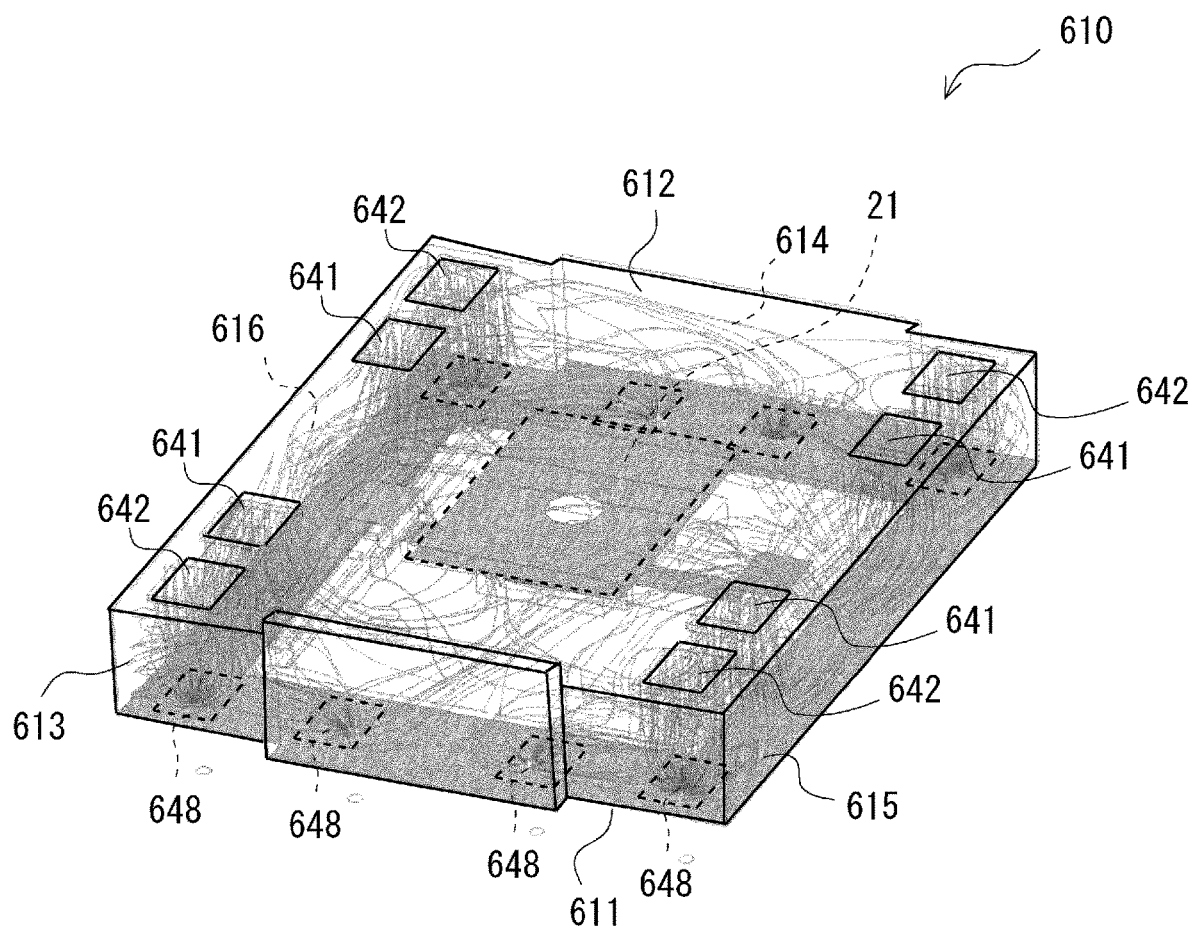
FIG. 35 is a view illustrating the air flow inside the chamber of the laser lift-off apparatus according to the sixth embodiment.

The chamber 610 is formed in, for example, a rectangular parallelepiped shape by a bottom surface wall 611 and an upper surface wall 612 and, in addition, a front surface wall 613 and a rear surface wall 614, and side surfaces 615 and 616 (see FIG. 35 for the front surface wall 613, the rear surface wall 614 and the side surface walls 615 and 616). In FIG. 33, the front surface wall 613 and the rear surface wall 614 and the side surface walls 615 and 616 are omitted. The bottom surface wall 611 and the upper surface wall 612 face each other in the Z axis direction, i.e., upper and lower directions. The front surface wall 613 and the rear surface wall 614 face each other in the X axis direction, i.e., the conveying direction of the workpiece 10, and the side surface walls 615 and 616 face each other in the Y axis direction. In addition, the shape of the chamber 610 is not limited to the rectangular parallelepiped shape.

The upper surface wall 612 has a rectangular flat shape which has, for example, long sides along the X axis direction and has short sides along the Y axis direction when seen from above. The upper surface wall 612 is disposed on a +Z axis direction side of the bottom surface wall 611, and faces the bottom surface wall 611. Hence, when the upper surface wall 612 is one wall, the bottom surface wall 611 is the other wall which faces the one wall. An upper surface wall 612 and a bottom surface wall 611 are parallel in the X axis direction and the Y axis direction.

The upper surface wall 612 is provided with a plurality of feeding fans 641 and a plurality of filters 642. Hence, the upper surface wall 612 forms an FFU in which the feeding fans 641 and the filters 642 are assembled.

Figure 34A:
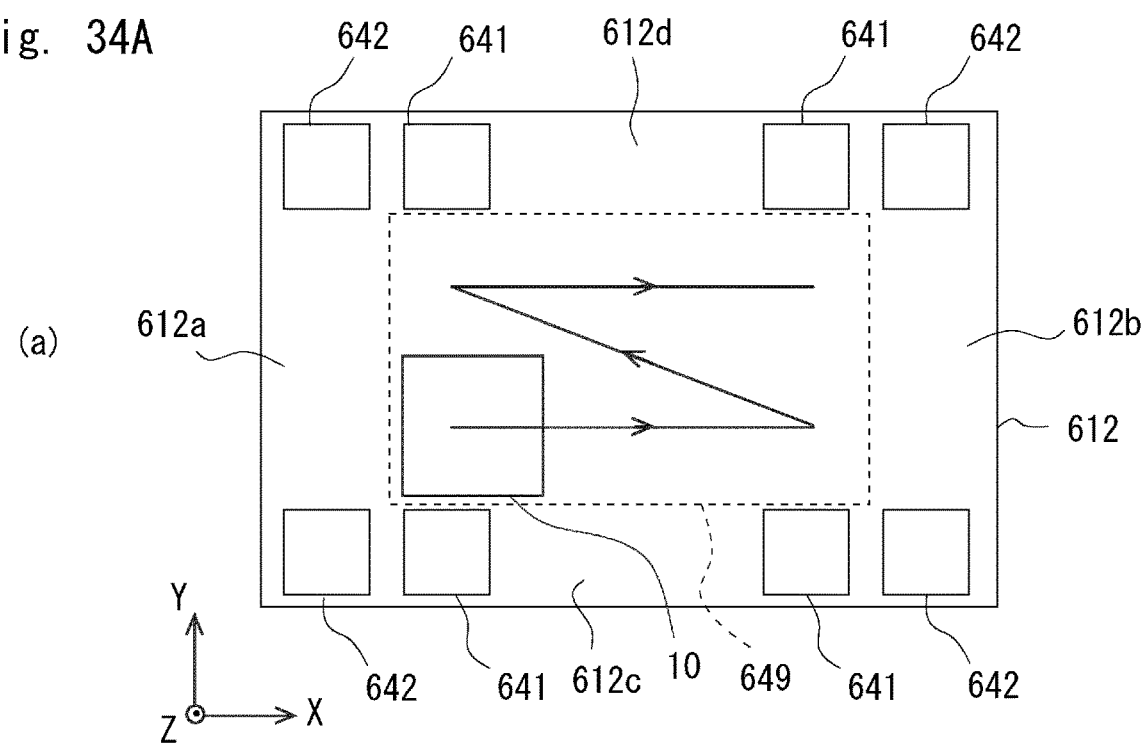
FIG. 34A is a view of the movement projected over the upper surface wall.
Figure 34B:
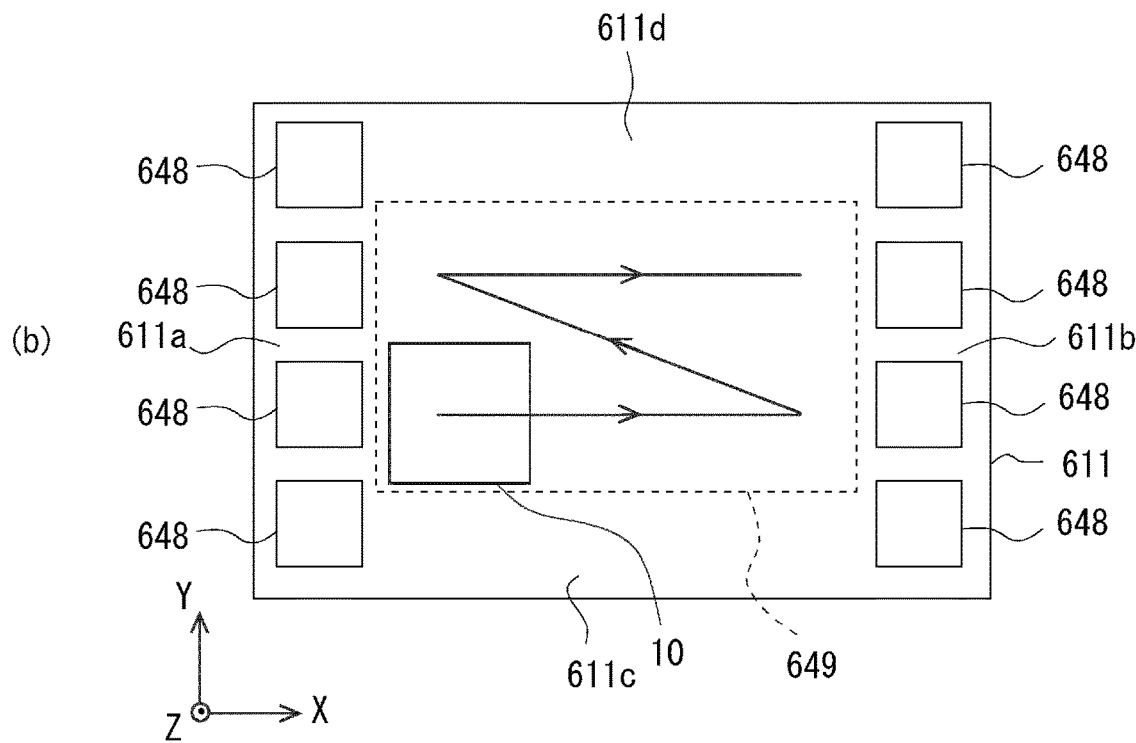
FIG. 34B is a view of the movement projected over the bottom surface wall.

Hereinafter, positions at which a plurality of feeding fans 641 and a plurality of filters 642 are disposed in the upper surface wall 612 will be described. FIGS. 34A and 34B are views illustrating movement of the workpiece 10 inside the chamber 610 of the laser lift-off apparatus 600 according to the sixth embodiment. FIG. 34A is a view of the movement projected over the upper surface wall 612. FIG. 34B is a view of the movement projected over the bottom surface wall 611.

As illustrated in FIG. 34A, when the upper surface wall 612 is seen through from above, a movable region 649 in which the workpiece 10 is movable when the workpiece 10 is conveyed overlaps a center portion of the upper surface wall 612. However, a periphery portion of the upper surface wall 612 does not overlap the movable region 649. For example, periphery portions 612a and 612b of both end portions in the X axis direction of the upper surface wall 612, and periphery portions 612c and 612d of both end portions in the Y axis direction do not overlap the movable region 649. Hence, the feeding fans 641 are disposed at the periphery portions 612c and 612d on both end sides in the Y axis direction of the upper surface wall 612. For example, the two feeding fans 641 are disposed to align along the X axis direction of the periphery portion 612c, and the two feeding fans 641 are disposed to align along the X axis direction of the periphery portion 612d.

The feeding fan 641 feeds a gas from an outside of the chamber 610 to an inside of the chamber 610. Similar to the fifth embodiment, a gas taken in the chamber 610 will be described as air in the following description. The feeding fans 641 blow the air taken in the chamber 610 to a −Z axis direction.

A plurality of filters 642 are formed in the upper surface wall 612, for example. For example, the filters 642 are provided at corner portions of the upper surface wall 612 to sandwich a plurality of feeding fans 641 on the periphery portion 612c. Furthermore, the filters 642 are provided at corner portions of the upper surface wall 612 to sandwich a plurality of feeding fans 641 on the periphery portion 612d. Hence, the feeding fans 641 are disposed between the filters 642 disposed apart in the X axis direction on the periphery portions 612c and 612d.

As illustrated in FIG. 33, an opening 645 is formed in the upper surface wall 612. The opening 645 continues to an optical path space 70 of the dust collecting unit 60. The opening 645 extends in the Y axis direction. When the optical system 20 is disposed over the upper surface wall 612, laser light 16 enters inside the dust collecting unit 60 through the opening 645 (see FIG. 11). Consequently, the laser light 16 passes through the optical path space 70 and irradiates the workpiece 10.

As illustrated in FIG. 33, the bottom surface wall 611 has a rectangular flat shape which has, for example, long sides along the X axis direction and has short sides along the Y axis direction when seen from above. The bottom surface wall 611 is disposed on a −Z axis direction side of the upper surface wall 612, and faces the upper surface wall 612. A plurality of exhaust fans 648 are provided to the bottom surface wall 611.

As illustrated in FIGS. 33 and 34B, when the bottom surface wall 611 is seen through from above, the movable region 649 overlaps a center portion of the bottom surface wall 611. However, periphery portions of the bottom surface wall 611 do not overlap the movable region 649. For example, periphery portions 611a and 611b of both end portions in the X axis direction of the bottom surface wall 611, and periphery portions 611c and 611d of both end portions in the Y axis direction do not overlap the movable region 649. Hence, a plurality of exhaust fans 648 are disposed at the periphery portions 611a and 611b on both end sides in the X axis direction of the bottom surface wall 611. For example, the four exhaust fans 648 are disposed to align along the Y axis direction of the periphery portion 611a, and the four exhaust fans 648 are disposed to align along the Y axis direction of the periphery portion 611b. The exhaust fans 648 exhaust air from the inside of the chamber 610 to the outside of the chamber 610 in the −Z axis direction.

<Air Flow Inside Chamber>

Next, the air flow inside the chamber 610 will be described.

FIG. 35 is a view illustrating the air flow inside the chamber 610 of the laser lift-off apparatus 600 according to the sixth embodiment. As illustrated in FIG. 35, downflows traveling from the upper surface wall 612 to the bottom surface wall 611 are formed inside the chamber 610. Particularly, the downflows are formed at both end portions in the Y axis direction inside the chamber 610. Particles such as dusts basically deposit on the bottom surface wall 611. Consequently, by forming the downflows, it is possible to prevent the particles deposited over the bottom surface wall 611 from being stirred up over the stage 21.

By providing the feeding fans 641 in the entire surface of the upper surface wall 612 of the chamber 610 and providing the exhaust fans 648 in the entire surface of the bottom surface wall 611, it may be possible to form complete downflows inside the chamber 610. However, the stage 21 and members such as a scanning device are disposed inside the chamber 610, and therefore the complete downflows cannot be formed inside the chamber 610. Hence, in the present embodiment, even when members which prevent the downflows are disposed inside the chamber 610, the feeding fans 641, the filters 642 and the exhaust fans 648 are disposed at such positions that an influence of dusts can be prevented. The arrangement illustrated in FIG. 35 makes it possible to form the downflows inside the chamber 610, and prevent the dusts from reaching the irradiation region of the laser light 16.

Figure 36A:
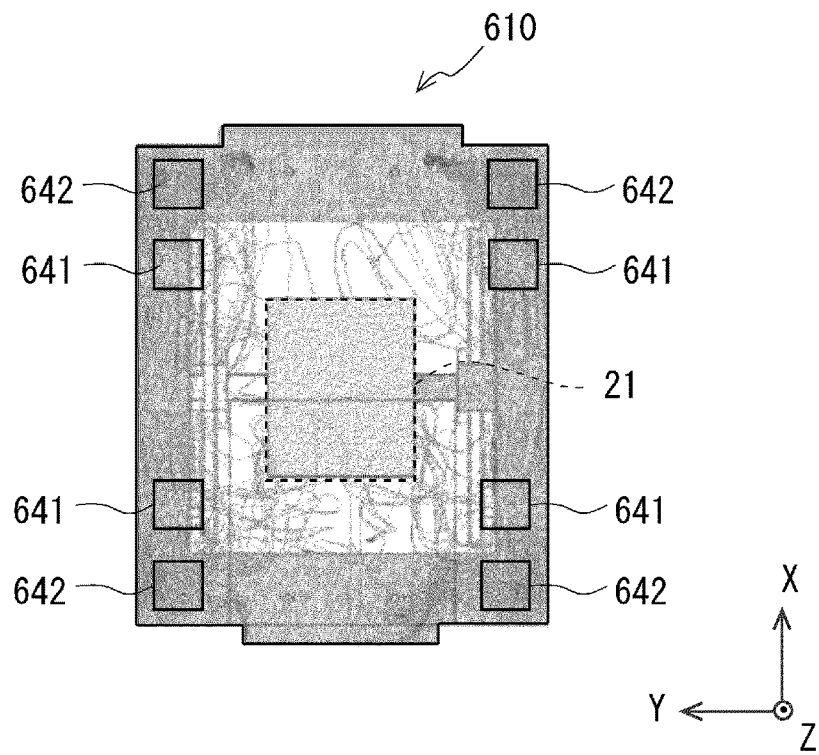
FIG. 36A is a view illustrating the air flow in the chamber of the laser lift-off apparatus according to the sixth embodiment.
Figure 36B:
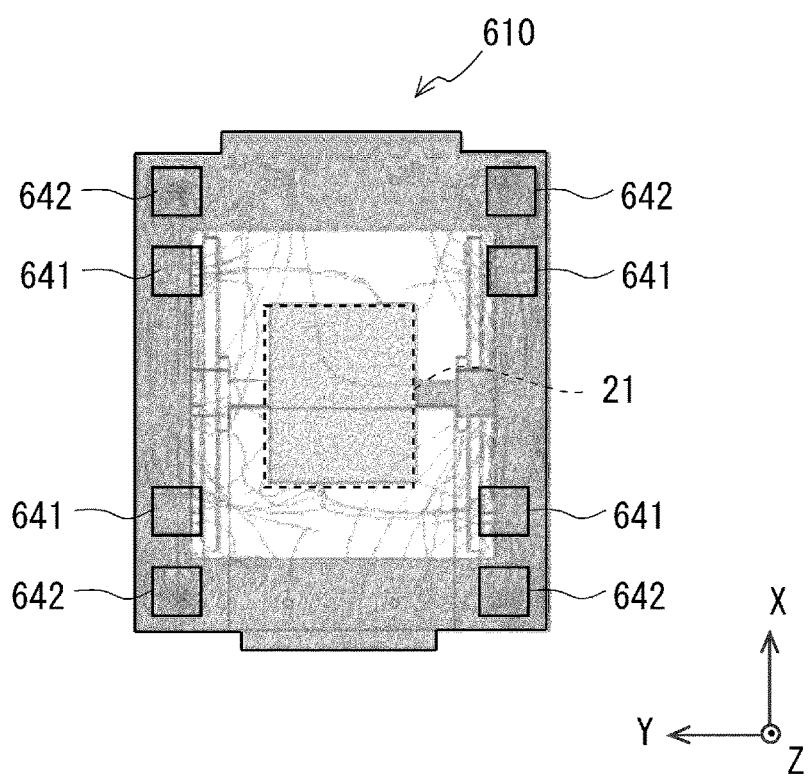
FIG. 36B is a view illustrating the air flow in the chamber of the laser lift-off apparatus according to the sixth embodiment.

FIGS. 36A and 36B are views illustrating the air flow in the chamber 610 of the laser lift-off apparatus 600 according to the sixth embodiment. FIG. 36A illustrates that the feeding amount is made larger than the exhaust amount. FIG. 36B illustrates that the feeding amount is made smaller than the exhaust amount.

As illustrated in FIGS. 36A and 36B, by forming the downflows inside the chamber 610, it is possible to make air arrive at the entire region inside the chamber 610. As illustrated in FIG. 36A in particular, by making the feeding amount larger than the exhaust amount and making the pressure inside the chamber 610 a positive pressure, it is possible to make the air reach uniformly inside the chamber 610 compared to a case where the feeding amount is made smaller than the exhaust amount and the pressure inside the chamber 610 is a negative pressure.

According to the present embodiment, by forming the downflows in the space inside the chamber 610, it is possible to prevent the dusts produced from the inside of the chamber 610 from reaching the irradiation region of the laser light 16.

Furthermore, the downflows make the air uniformly reach the inside of the chamber 610. Consequently, it is possible to prevent formation of a drift inside the chamber 610. The other operations and effects are the same as those in the first to third embodiment, and therefore description thereof will be omitted.

The invention invented by the inventors has been described above based on the embodiments above. However, the present invention is not limited to the above embodiments, and can be naturally changed variously without departing from the gist of the invention.

This application claims priority to Japanese Patent Application No. 2016-153341 filed on Aug. 4, 2016 and Japanese Patent Application No. 2016-246571 filed on Dec. 20, 2016, the entire contents of which are incorporated by reference herein.

REFERENCE SIGNS LIST 1, 2, 3, 4, 5 LASER LIFT-OFF APPARATUS
10 WORKPIECE
11 SUBSTRATE
12 SEPARATING LAYER
16 LASER LIGHT
20 OPTICAL SYSTEM
21 STAGE
22 INJECTION UNIT
23 DUST COLLECTING UNIT
31 MAIN BODY PORTION
32 NOZZLE
33 FEEDING PIPE
41 SIDEWALL
42 UPPER PLATE
44, 45 PLATE MEMBER
48 LID
51 UPPER OPENING
52 OPENING
60 DUST COLLECTING UNIT
61, 62 SIDEWALL
63, 64 PLATE MEMBER
65 UPPER PLATE
66, 67 PARTITIONING PLATE
68 LID
70 OPTICAL PATH SPACE
71, 72 FEEDING SPACE
73, 74 EXHAUST SPACE
75, 76 FEEDING HOLE
77, 77a, 77b EXHAUST PORT
78 OPENING
81, 82 SIDEWALL
83, 84 PLATE MEMBER
85 FEEDING PORT
90 DUST COLLECTING UNIT
91, 92, 93, 94 BOTTOM PLATE MEMBER
95 INTAKE PORT
100 DUST COLLECTING UNIT
101, 102 BOTTOM PLATE MEMBER
110 DUST COLLECTING UNIT
111, 112 PLATE MEMBER
113, 114 PIPE
500 LASER LIFT-OFF APPARATUS
510 CHAMBER
511 BOTTOM SURFACE WALL
512 UPPER SURFACE WALL
513 FRONT SURFACE WALL
514 REAR SURFACE WALL
515 SIDE SURFACE WALL
515a WORKPIECE LOADING/UNLOADING PORT
516 SIDE SURFACE WALL
517 AIR
520 DUST COLLECTING UNIT FEEDING/EXHAUST FAN
521 FEEDING PIPE
522, 522a, 522b EXHAUST PIPE
530 SUPPORT BASE
531 BASE
532 SUPPORT COLUMN
541 FEEDING FAN
542 FILTER
543 EXHAUST DUCT EXHAUST PORT
544 EXHAUST DUCT
545 OPENING
546 END PORTION
547 DEFOCUS
548 EXHAUST FAN
551 SCANNING DEVICE
552 CONTROLLER
600 LASER LIFT-OFF APPARATUS
610 CHAMBER
611 BOTTOM SURFACE WALL
611c, 611d PERIPHERY PORTION
612 UPPER SURFACE WALL
612a, 612b PERIPHERY PORTION
613 FRONT SURFACE WALL
614 REAR SURFACE WALL
615 SIDE SURFACE WALL
616 SIDE SURFACE WALL
648 EXHAUST FAN
649 MOVABLE REGION

The invention claimed is:

1. A laser lift-off apparatus configured to irradiate a workpiece including a substrate and a separating layer formed over the substrate with laser light, and thereby separate the separating layer from the substrate, the laser lift-off apparatus comprising:
an injection unit configured to blow a gas onto the workpiece; and
a dust collecting unit including an opening at a position corresponding to an irradiation position of the laser light, the dust collecting unit being configured to suck and collect dust through the opening and to exhaust the dust through an exhaust opening in the dust collecting unit,
wherein the injection unit is disposed on a downstream side in a conveying direction of the workplace with respect to the dust collecting unit, and is configured to blow the gas in a direction opposite to the conveying direction of the workpiece, the gas exits the dust collecting unit through the exhaust opening in a direction that is the conveying direction of the workpiece, the opening is formed by using a first plate member and a second plate member, the first plate member being disposed on an upstream side in the conveying direction of the opening, and the second plate member being disposed on the downstream side in the conveying direction of the opening, the first and second plate members are disposed such that a gap between the second plate member and the workpiece is wider than a gap between the first plate member and the workpiece, a cross-sectional shape of an edge of the first plate member is a shape having such an inclined surface that an acute angle is formed between the inclined surface and a lower surface of the first plate member, and a cross-sectional shape of an edge of the second plate member is a shape having such an inclined surface that an acute angle is formed between the inclined surface and an upper surface of the second plate member.

2. The laser lift-off apparatus according to claim 1, wherein
the injection unit blows the gas onto the workpiece and blows away the dust present on a surface of the workpiece, and
the dust collecting unit sucks and collects the blown dust through the opening.

3. The laser lift-off apparatus according to claim 1, wherein the injection unit forms over a surface of the workpiece a laminar flow in the direction opposite to the conveying direction of the workpiece.

4. The laser lift-off apparatus according to claim 3, wherein a nozzle of the injection unit is disposed in a plane parallel to the surface of the workpiece and extends in a first direction that is to the conveying direction of the workpiece, and
the opening of the dust collecting unit is disposed to extend in the first direction.

5. The laser lift-off apparatus according to claim 4, wherein the first plate member is extending in the first direction, and the second plate member is extending in the first direction.

6. The laser lift-off apparatus according to claim 4, wherein a length in the first direction of the opening is longer than a length in the first direction of the nozzle.

7. A laser lift-off apparatus configured to irradiate a workpiece including a substrate and a separating layer formed over the substrate with laser light and separates the separating layer from the substrate, the laser lift-off apparatus comprising a dust collecting unit including
an optical path space including an opening at a position corresponding to an irradiation position of the laser light, and configured so that the laser light passes therethrough; and
an exhaust space disposed outside the optical path space, wherein
the optical path space is formed by using a sidewall and a lid, the sidewall being disposed around the opening and the lid being disposed to cover an upper part of the sidewall and being transparent to the laser light,
a feeding hole is formed in the sidewall and is configured to supply a gas to the optical path space, and
the gas supplied from the feeding hole to the optical path space flows through the optical path space toward the workpiece along an interior surface of the sidewall, then passes between a lower end of the sidewall and the workpiece, and flows to the exhaust space, wherein
the opening is disposed in a plane parallel to a surface of the workpiece and extends in a first direction that is orthogonal to a conveying direction of the workpiece,
the sidewall includes a first plate member disposed on an upstream side in the conveying direction of the workpiece, and a second plate member disposed on a downstream side in the conveying direction of the workpiece, and wherein
the exhaust space includes a first exhaust space disposed on the upstream side in the conveying direction of the optical path space, and a second exhaust space disposed on the downstream side in the conveying direction of the optical path space,
the gas supplied from a feeding hole formed in the first plate member to the optical path space flows toward the workpiece along a surface of the first plate member, then passes between a lower end of the first plate member and the workpiece, and flows to the first exhaust space, and
the gas supplied from a feeding hole formed in the second plate member to the optical path space flows toward the workpiece along a surface of the second plate member, then passes between a lower end of the second plate member and the workpiece, and flows to the second exhaust space.

8. The laser lift-off apparatus according to claim 7, wherein
the first exhaust space is a space sandwiched by the first plate member, and a third plate member disposed on the upstream side in the conveying direction of the first plate member,
the gas passes between a lower end of the third plate member and the workpiece from an outside of the dust collecting unit and further flows in the first exhaust space,
the second exhaust space is a space sandwiched by the second plate member, and a fourth plate member disposed on the downstream side in the conveying direction of the second plate member, and
the gas passes between a lower end of the fourth plate member and the workpiece from an outside of the dust collecting unit and further flows in the second exhaust space.

9. The laser lift-off apparatus according to claim 7, wherein
a first intake port is formed at a lower portion of the first exhaust space, the first intake port being disposed such that a flow path between the surface of the workpiece and the first exhaust space narrows, and
a second intake port is formed at a lower portion of the second exhaust space, the second intake port being disposed such that a flow path between the surface of the workpiece and the second exhaust space narrows.

10. The laser lift-off apparatus according to claim 9, wherein
a first bottom plate member extending in the first direction is disposed on the downstream side in the conveying direction of the first intake port, and a second bottom plate member extending in the first direction is disposed on the upstream side in the conveying direction of the first intake port,
a cross-sectional shape of the first intake port of the first bottom plate is a shape having such an inclined surface that an angle formed between the inclined surface and an upper surface of the first bottom plate member is an acute angle, a third bottom plate member extending in the first direction is disposed on the upstream side in the conveying direction of the second intake port, and a fourth bottom plate member extending in the first direction is disposed on the downstream side in the conveying direction of the second intake port, and a cross-sectional shape of the second intake port of the third bottom plate is a shape having such an inclined surface that an angle formed between the inclined surface and an upper surface of the third bottom plate member is an acute angle.

11. The laser lift-off apparatus according to claim 10, wherein a cross-sectional shape of the first intake port of the second bottom plate is a shape having such an inclined surface that an angle formed between the inclined surface and an upper surface of the second bottom plate member is an acute angle, and a cross-sectional shape of the second intake port of the fourth bottom plate is a shape having such an inclined surface that an angle formed between the inclined surface and an upper surface of the fourth bottom plate member is an acute angle.

12. The laser lift-off apparatus according to claim 7, wherein the dust collecting unit further includes a feeding space disposed outside the optical path space, and configured to supply the gas to the optical path space via the feeding hole.

13. The laser lift-off apparatus according to claim 12, wherein the feeding space includes a first feeding space disposed on the upstream side in the conveying direction of the optical path space and at an upper portion of the first exhaust space, and a second feeding space disposed on the downstream side in the conveying direction of the optical path space and at an upper portion of the second exhaust space.

14. The laser lift-off apparatus according to claim 7, wherein a pipe is connected to the feeding hole, and the gas is supplied to the optical path space via the pipe and the feeding hole.

* * * * *